United States Patent
Sato et al.

(10) Patent No.: US 6,794,108 B1
(45) Date of Patent: Sep. 21, 2004

(54) POSITIVE PHOTORESIST COMPOSITION FOR FAR ULTRAVIOLET EXPOSURE

(75) Inventors: Kenichiro Sato, Shizuoka (JP); Yutaka Adegawa, Shizuoka (JP); Toshiaki Aoai, Shizuoka (JP); Kunihiko Kodama, Shizuoka (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 0 days.

(21) Appl. No.: 09/541,597

(22) Filed: Apr. 3, 2000

(30) Foreign Application Priority Data

| Apr. 1, 1999 | (JP) | 11-095373 |
| May 25, 1999 | (JP) | 11-145223 |
| Sep. 8, 1999 | (JP) | 11-254512 |

(51) Int. Cl.$^7$ .............................. G03F 7/004
(52) U.S. Cl. ............. 430/270.1; 430/905; 430/910
(58) Field of Search .................. 430/270.1, 905, 430/910

(56) References Cited

U.S. PATENT DOCUMENTS

| 5,556,734 A | * | 9/1996 | Yamachika et al. | 430/270.1 |
| 5,824,451 A | * | 10/1998 | Aoai et al. | 430/270.1 |
| 6,017,677 A | * | 1/2000 | Maemoto et al. | 430/270.1 |
| 6,093,517 A | * | 7/2000 | Ito et al. | 430/270.1 |
| 6,136,499 A | * | 10/2000 | Goodall et al. | 430/270.1 |
| 6,165,678 A | * | 12/2000 | Allen et al. | 430/270.1 |

FOREIGN PATENT DOCUMENTS

| JP | 10-254139 | 9/1998 | G03F/7/039 |

* cited by examiner

*Primary Examiner*—Rosemary Ashton
(74) *Attorney, Agent, or Firm*—Sughrue Mion, PLLC

(57) ABSTRACT

The present invention provides a positive photoresist composition for far ultraviolet exposure, which comprises a polymer having at least one of a repeating unit represented by formula (Ia) and a repeating unit represented by formula (Ib), and a repeating unit represented by formula (II), and having a group capable of decomposing by the action of an acid:

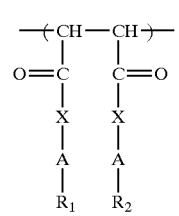

(Ia)

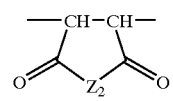

(Ib)

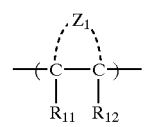

(II)

wherein $R_1$ and $R_2$ each represents hydrogen atom, a cyano group, a hydroxyl group, —COOH, —COOR$_5$, —CO—NH—R$_6$, —CO—NH—SO$_2$—R$_6$, an alkyl group, an alkoxy group, a cyclic hydrocarbon group or a —Y group, X represents —O—, —S—, —NH—, —NHSO$_2$— or —NHSO$_2$NH—, A represents a single bond or a divalent linking group, $Z_2$ represents —O— or —N(R$_3$)—, $R_{11}$ and $R_{12}$ each represents a hydrogen atom, a cyano group, a halogen atom or an alkyl group, $Z_1$ represents an atomic group necessary for forming an alicyclic structure which contains two bonded carbon atoms (C—C), and Y, $R_3$, $R_5$ and $R_6$ are as defined in the specification.

14 Claims, No Drawings

US 6,794,108 B1

POSITIVE PHOTORESIST COMPOSITION FOR FAR ULTRAVIOLET EXPOSURE

FIELD OF THE INVENTION

The present invention relates to a positive photoresist composition for far ultraviolet exposure, which is used in the ultramicro-lithography process and other photofabrication processes, such as production of ultra-LSI and high-capacitance micro-chip. More specifically, the present invention relates to a positive photoresist composition for far ultraviolet exposure, which can form a highly precise pattern using light in the far ultraviolet region including an excimer laser ray, particularly, in the region of 250 nm or less.

BACKGROUND OF THE INVENTION

In recent years, the integration degree of integrated circuits is more and more elevated and in the production of a semiconductor substrate such as ultra-LSI, working to provide an ultrafine pattern consisting of lines having a width of half micron or less is required. To meet this requirement, the wavelength used in the exposure apparatus for photolithography increasingly becomes shorter and at the present time, studies are being made on the use of an excimer laser ray (e.g., XeCl, KrF, ArF) having a short wavelength among far ultraviolet rays.

In the formation of a pattern for lithography using this wavelength region, a chemical amplification-system resist is used.

The chemical amplification-system resist in general can be roughly classified into three groups, that is, commonly called 2-component system, 2.5-component system and 3-component system. The 2-component system uses a combination of a compound capable of generating an acid by the photochemical decomposition (hereinafter referred to as a "photo-acid generator") and a binder resin. This binder resin is a resin having within the molecule a group capable of decomposing by the action of an acid and thereby increasing solubility of the resin in an alkali developer (also called acid-decomposable group) The 2.5-component system contains a low molecular compound having an acid-decomposable group in addition to the 2-component system. The 3-component system contains a photo-acid generator, an alkali-soluble resin and the above-described low molecular compound.

The chemical amplification-system resist is suitable as a photoresist used under irradiation of an ultraviolet ray or a far ultraviolet ray but still in need of coping with the characteristics required for individual uses.

As a photoresist composition for use with an ArF light source, a resin in which an alicyclic hydrocarbon site is introduced so as to impart dry etching resistance has been proposed. However, the alicyclic hydrocarbon site introduced disadvantageously renders the system to be extremely hydrophobic, and as a result, the resist can not be developed with an aqueous tetramethylammonium hydroxide (hereinafter referred to as "TMAH") solution heretofore widely used as a developer for resists or there may arise a phenomenon such that the resist falls off from the substrate during the development.

With an attempt to overcome this hydrophobitization of the resist, an organic solvent such as isopropyl alcohol is mixed in the developer. This gains a certain result but still suffers from problems such as swelling of the resist film or the cumbersome process. From the standpoint of improving the resist, a large number of techniques have been proposed, for example, hydrophobitization ascribable to various alicyclic hydrocarbon sites is compensated for by introducing a hydrophilic group.

JP-A-10-10739 (the term "JP-A" as used herein means an "unexamined published Japanese patent application") discloses an energy-sensitive resist material containing a polymer obtained by polymerizing a monomer having an alicyclic structure such as norbornene ring in the main chain, a maleic acid anhydride and a monomer having a carboxyl group. JP-A-10-111569 discloses a radiation-sensitive resin composition containing a resin having an alicyclic skeleton in the main chain and a radiation-sensitive acid-generating agent. JP-A-11-202491 discloses a radiation-sensitive resin composition containing a polymer having a norbornene derivative and an androstane-17-carboxylic acid ester compound.

The resin having an acid-decomposable group, which is used in the photoresist for far ultraviolet exposure, generally contains an aliphatic cyclic hydrocarbon group within the molecule at the same-time. Therefore, the resin becomes hydrophobic and there arise problems attributable to it. For overcoming the problems, various techniques have been aggressively investigated as described above, however, these techniques are still insufficient in many points (particularly in the developability) and in need of improvements.

On the other hand, JP-A-8-248561 discloses a photoreactive composition comprising a photo-acid generator and an acid-increasing agent capable of generating a new acid by the acid generated from the acid-generating agent. In *SPIE.*, vol. 3049, pp. 76–82, a chemical amplification-system resist for 193-nm lithography containing an acid-generating agent, a partially protected alicyclic polymer and an acid-increasing agent is disclosed.

However, this technique using a light source of emitting a far ultraviolet ray of short wavelength, for example, an ArF excimer laser (193 nm), as the exposure light source is still in need of improvements in view of the developability. To speak specifically, development defect may arise or scum (development residue) may be generated. Furthermore, the line width fluctuates every each pattern formation and improvement are necessary also in the line width reproducibility.

The defocus latitude depended on line pitch is also in need of improvements. More specifically, a device has a portion where lines are crowded, a pattern where the space is broad as compared with lines, and isolated lines. Therefore, it is important to resolve various lines with high reproducibility. However, reproduction of various lines cannot be easily attained because of optical factors and the resist is not yet succeeded in undertaking the part of solving this problem at present. In particular, the above-described resist system containing an alicyclic group conspicuously varies in the reproducibility between the isolated pattern and the crowded pattern, and improvements are being demanded.

In addition, the storage stability of the resist solution is also in need of improvements. For example, when a chemical amplification-system photoresist is stored in the liquid state, due to the poor compatibility between the resin and the photo-acid generator, particles may be generated in the solution or the resist performance may be deteriorated (deterioration in the storage stability of the resist solution).

JP-A-10-254139 discloses a resin composition containing a solvent comprising a mixture of a resin having an acid-decomposable group and an alicyclic skeleton, a radiation-sensitive acid-generating agent and at least one selected from the group consisting of linear ketone, cyclic ketone, propylene glycol monoalkyl ether acetate and alkyl 2-hydroxypropionate. This system also has the above-described problem of poor storage stability and studies are being made by the similar approach.

SUMMARY OF THE INVENTION

Accordingly, an object of the present invention is to attain technical improvements in the capability inherent in the microphotofabrication using a far ultraviolet ray, particularly an ArF excimer laser ray.

More specifically, a first object of the present invention is to provide a positive photoresist composition free from the generation of development defect and scum at the development, and a positive photoresist composition for far ultraviolet exposure, having excellent line width reproducibility.

A second object of the present invention is to provide a positive photoresist composition excellent in the sensitivity, resolution, dry etching resistance and adhesion to the substrate, and free from the generation of development defect and scum at the development and a positive photoresist composition for far ultraviolet exposure, having excellent defocus latitude depended on line pitch.

A third object of the present invention is to provide a positive photoresist composition having excellent aging storage stability and free of the generation of development defect at the development.

As a result of extensive investigations on the constituent materials of a photoresist in the positive chemical amplification system, the present inventors have found that the above-described objects of the present invention can be attained by using a specific acid-decomposable resin and a specific additive. The present invention has been accomplished based on this finding.

Namely, the above-described objects can be attained by the following constructions.

(1) A positive photoresist composition for far ultraviolet exposure as a first aspect of the present invention to achieve the first object, comprising (A) a compound capable of generating an acid by the irradiation of an actinic ray or radiation, (B) a polymer having at least either a repeating unit represented by the following formula (Ia) or a repeating unit represented by the following formula (Ib) and a repeating unit represented by the following formula (II) and having a group capable of decomposing by the action of an acid, and (C) a compound capable of decomposing by the action of an acid to generate a sulfonic acid:

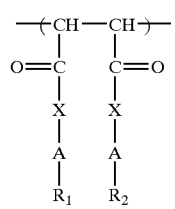
(Ia)

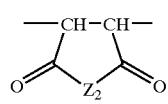
(Ib)

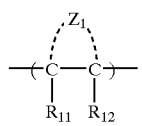
(II)

wherein in formula (Ia), $R_1$ and $R_2$ each independently —COOH, —COOR$_5$, —CO—NH—R$_6$, —CO—NH—SO$_2$—R$_6$ (wherein R$_5$ represents an alkyl group which may have a substituent, a cyclic hydrocarbon group which may have a substituent or a —Y group shown below, and R$_6$ represents an alkyl group which may have a substituent or a cyclic hydrocarbon group which may have a substituent), an alkyl group which may be substituted, an alkoxy group which may be substituted, a cyclic hydrocarbon group which may be substituted or a —Y group shown below, X represents oxygen atom, sulfur atom, —NH—, —NHSO$_2$— or —NHSO$_2$NH—, and A represents a single bond or a divalent linking group:

—Y group:

—Y group:

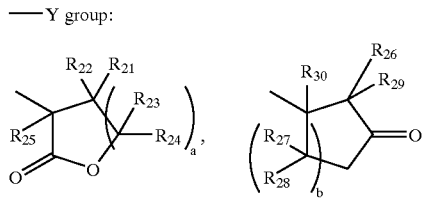

(wherein $R_{21}$ to $R_{30}$ each independently represents hydrogen atom or an alkyl group which may have a substituent, and a and b each represents 1 or 2);

in formula (Ib), $Z_2$ represents —O— or —N(R$_3$)— (wherein R$_3$ represents hydrogen atom, a hydroxyl group or —OSO$_2$—R$_4$ (wherein R$_4$ represents an alkyl group, a haloalkyl group, a cycloalkyl group or a camphor residue)); and in formula (II), $R_{11}$ and $R_{12}$ each independently represents hydrogen atom, a cyano group, a halogen atom or an alkyl group which may have a substituent, and $Z_1$ represents an atomic group necessary for forming an alicyclic structure which contains two bonded carbon atoms (C—C) and may have a substituent;

(2) the positive photoresist composition for far ultraviolet exposure as described in (1) above, wherein $Z_1$ in formula (II) represents an atomic group necessary for forming a bridged alicyclic structure which contains two bonded carbon atoms (C—C) and may have a substituent;

(3) the positive photoresist composition for far ultraviolet exposure as described in (1) above, wherein formula (II) is the following formula (II-A) or (II-B):

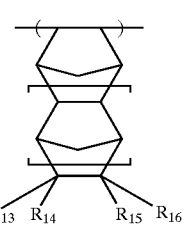
(II-A)

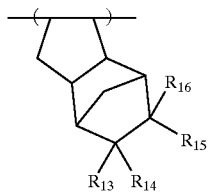

(II-B)

wherein $R_{13}$ to $R_{16}$ each independently represents hydrogen atom, a halogen atom, a cyano group, —COOH, —COOR$_5$ (wherein R$_5$ is the same as defined above), a group capable of decomposing by the action of an acid, —C(=O)—X—A—R$_{17}$ (wherein X and A are the same as defined above, and R$_{17}$ represents —COOH, —COOR$_5$, —CN, a hydroxyl group, an alkoxy group which may have a substituent, —CO—NH—R$_6$, —CO—NH—SO$_2$—R$_6$ (wherein R$_5$ and R$_6$ are the same as defined above) or a —Y group shown above), an alkyl group which may have a substituent or a cyclic hydrocarbon group which may have a substituent, at least two of $R_{13}$ to $R_{16}$ may be combined to form a ring, and n represents 0 or 1;

(4) a positive photoresist composition for far ultraviolet exposure as a second aspect to achieve the second object, comprising (A) a compound capable of generating an acid by the irradiation of an actinic ray or radiation, (B) a polymer having at least either a repeating unit represented by the following formula (Ia) or a repeating unit represented by the following formula (Ib) and a repeating unit represented by formula (II) and having a group capable of decomposing by the action of an acid, and (D) a fluorine-type and/or silicon-type surface active agent;

(5) the positive photoresist composition for far ultraviolet exposure as described in (4) above, wherein $Z_1$ in formula (II) represents an atomic group necessary for forming a bridged alicyclic structure which contains two bonded carbon atoms (C—C) and may have a substituent;

(6) the positive photoresist composition for far ultraviolet exposure as described in (4) above, wherein formula (II) is formula (II-A) or (II-B);

(7) the positive photoresist composition for far ultraviolet exposure as described in any one of (4) to (6) above, which contains a nitrogen-containing basic compound; and (8) the positive photoresist composition for far ultraviolet exposure as described in (7) above, wherein the nitrogen containing basic compound is at least one compound selected from the group consisting of 1,5-diazabicyclo[4.3.0]-5-none, 1,8-diazabicyclo[5.4.0]-7-undecene, 1,4-diazabicyclo[2.2.2]octane, 4-dimethylaminopyridine, hexamethylenetetramine, 4,4-dimethylimidazoline, pyrroles, pyrazoles, imidazoles, pyridazines, pyrimidines, tertiary morpholines and hindered amines having a hindered piperidine skeleton.

Furthermore, as a result of extensive investigations on the constituent materials of a photoresist in the positive chemical amplification system, the present inventors have found that the objects of the present invention can be attained by using a specific acid-decomposable resin and a specific mixed solvent. The present invention has been accomplished based on this finding.

Namely, the above-described objects can be attained by the following constructions as a third aspect to achieve the third object.

(9) a positive photoresist composition for far ultraviolet exposure, comprising (A) a compound capable of generating an acid by the irradiation of an actinic ray or radiation, (B) a polymer having at least either a repeating unit represented by the following formula (Ia) or a repeating unit represented by the following formula (Ib) and a repeating unit represented by formula (II) and having a group capable of decomposing by the action of an acid, and (E) a mixed solvent containing at least one selected from the group consisting of butyl acetate and propylene glycol monoalkyl ether carboxylate and at least one selected from the group consisting of ethyl lactate and propylene glycol monoalkyl ether;

(10) the positive photoresist composition for far ultraviolet exposure as described in (9) above, wherein $Z_1$ in formula (II) represents an atomic group necessary for forming a bridged alicyclic structure which contains two bonded carbon atoms (C—C) and may have a substituent;

(11) the positive photoresist composition for far ultraviolet exposure as described in (9) above, wherein formula (II) is formula (II-A) or (II-B);

(12) the positive photoresist composition for far ultraviolet exposure as described in any one of (9) to (11) above, which contains a nitrogen-containing basic compound;

(13) the positive photoresist composition for far ultraviolet exposure as described in (12) above, wherein the nitrogen containing basic compound is at least one compound selected from the group consisting of 1,5-diazabicyclo[4.3.0]-5-none, 1,8-diazabicyclo[5.4.0]-7-undecene, 1,4-diazabicyclo[2.2.2]octane, 4-dimethylaminopyridine, hexamethylenetetramine, 4,4-dimethylimidazoline, pyrroles, pyrazoles, imidazoles, pyridazines, pyrimidines, tertiary morpholines and hindered amines having a hindered piperidine skeleton; and

(14) the positive photoresist composition as described in any one of (9) to (13) above, wherein the mixed solvent (E) additionally contains at least one solvent selected from the group consisting of γ-butyrolactone, ethylene carbonate and propylene carbonate.

DETAILED DESCRIPTION OF THE INVENTION

The compounds for use in the present invention are described in detail below.

(A) Compound Capable of Generating Acid by Irradiation of Actinic Ray or Radiation (Photo-acid Generator)

The photo-acid generator for use in the present invention is a compound which generates an acid by the irradiation of an actinic ray or radiation.

Examples of the compound capable of generating an acid by the irradiation of an actinic ray or radiation for use in the present invention include the compounds which can generate an acid by a known ray (for example, ultraviolet ray and far ultraviolet ray of from 200 to 400 nm, preferably g-line, h-line, i-line and KrF excimer laser ray), an ArF excimer laser ray, an electron beam, an X ray, a molecular beam or an ion beam, used in a photocationic polymerization initiator, a photoradical polymerization initiator, a photo-decoloring agent such as dyes, a photo-discoloring agent or a microresist. These compounds may be appropriately selected and used either individually or in combination.

Other examples of the compound capable of generating an acid by the irradiation of an actinic ray or radiation for use in the present invention include onium salts such as diazonium salts described in S. I. Schlesinger, *Photogr. Sci. Eng.*, 18, 387 (1974), T. S. Bal et al., *Polymer*, 21, 423 (1980), etc., ammonium salts described in U.S. Pat. Nos. 4,069,055, 4,069,056 and Re 27,992, JP-A-3-140140, etc., phosphonium salts described in D. C. Necker et al., *Macromolecules*, 17, 2468 (1984), C. S. Wen et al., *Teh, Proc. Conf. Rad. Curing ASIA*, p. 478, Tokyo, October, (1988), U.S. Pat. Nos. 4,069,055 and 4,069,056, etc., iodoniutm salts described in J. V. Crivello et al., *Macromolecules*, 10 (6) 1307 (1977), *Chem. & Eng. News*, November, 28, p. 31 (1988), European Patent 104,143, U.S. Pat. Nos. 339,049 and 410,201, JP-A-2-150848, JP-A-2-296514, etc., sulfonium salts described in J. V. Crivello et al., *Polymer J.*, 17, 73 (1985), J. V. Crivello et al., *J. Org. Chem.*, 43, 3055 (1978), W. R. Watt et al., *J. Polymer Sci.*, Polymer Chem. Ed., 22, 1789 (1984), J. V. Crivello et al., *Polymer Bull.*, 14, 279 (1985), J. V. Crivello et al., Macromolecules, 14 (5), 1141 (1981), J. V. Crivello et al., *J. Polymer Sci.*, Polymer Chem. Ed., 17, 2877 (1979), European Patents 370,693, 161,811, 410,201, 339,049, 233, 567, 297,443 and 297,442, U.S. Pat. Nos. 3,902,114, 4,933, 377, 4,760,013, 4,734,444 and 2,833,827, German Patent 2,904,626, 3,604,580 and 3,604,581, JP-A-7-28237, JP-A-8-27102, etc., selenonium salts described in J. V. Crivello et al., *Macromolecules*, 10 (6), 1307 (1977), J. V. Crivello et al., *J. Polymer Sci.*, Polymer Chem. Ed., 17, 1047 (1979), etc., and arsonium salts described in C. S. Wen et al., *Teh. Proc. Conf. Rad, Curing ASIA*, p. 478, Tokyo, October, (1988), etc.; organic halogenides described in U.S. Patent No. 3,905,815, JP-B-46-4605 (the term "JP-B" as used herein means an "examined Japanese patent publication"), JP-A-48-36281, JP-A-55-32070, JP-A-60-239736, JP-A-61-169835, JP-A-61-169837, JP-A-62-58241, JP-A-62-212401, JP-A-63-70243, JP-A-63-298339, etc.; organic metals/organic halogenides described in K. Meier et al., *J. Rad. Curing*, 13 (4), 26 (1986), T. P. Gill et al., *Inorg. Chem.*, 19, 3007 (1980), D. Astruc, *Acc. Chem. Res.*, 19 (12), 377 (1896), JP-A-2-161445, etc.; photo-acid generators having an o-nitrobenzyl type protective group described in S. Hayase et al., *J. Polymer Sci.*, 25, 753 (1987), E. Reichmanis et al., *J. Polymer Sci.*, Polymer Chem. Ed., 23, 1 (1985), Q. Q. Zhu et al., *J. Photochem.*, 36, 85, 39, 317 (1987), B. Amit et al., *Tetrahedron Lett.*, (24) 2205 (1973), D. H. R. Barton et al., *J. Chem. Soc*, 3571 (1965), P. M. Collins et al., *J. Chem. Soc.*, Perkin I, 1695 (1975), M. Rudinstein et al., *Tetrahedron Lett.*, (17), 1445 (1975), J. W. Walker et al., *J. Am. Chem. Soc.*, 110, 7170 (1988), S. C. Busman et al., *J. Imaging Technol.*, 11 (4), 191 (1985), H. M. Houlihan et al., *Macromolecules*, 21, 2001 (1988), P. M. Collins et al., *J. Chem. Commun.*, 532 (1972), S. Hayase et al., *Macromolecules*, 18, 1799 (1985), E. Reichmanis et al., *J. Electrochem. Soc., Solid State Sci. Technol.*, 130 (6), F. M. Houlihan et al., *Macromolecules*, 21, 2001 (1988), European Patents 0,290,750, 046,083, 156,535, 271,851, and 0,388, 343, U.S. Pat. Nos. 3,901,710 and 4,181,531, JP-A-60-198538, JP-A-53-133022, etc.; compounds which are photochemically decomposed to generate sulfonic acid, represented by iminosulfonate, described in M. TUNOOKA et al., *Polymer Preprints Japan*, 35 (8), G. Berner et al., *J. Rad. Curing*, 13 (4), W. J. Mijs et al., *Coating Technol.*, 55 (697), 45 (1983), Akzo, H. Adachi et al., *Polymer Preprints. Japan*, 37 (3), European Patents 0,199,672, 84,515, 044,115, 618,564 and 0,101,122, U.S. Pat. Nos. 4,371,605 and 4,431, 774, JP-A-64-18143, JP-A-2-245756, JP-A-3-140109, etc.; and diazoketosulfone and diazosulfone compounds described in JP-A-3-103854, JP-A-3-103856 and JP-A-4-210960, etc.

In addition, compounds in which the above-described group or compound capable of generating an acid by light is introduced in the main chain or a side chain may also be used and examples thereof include compounds described in M. E. Woodhouse et al., *J. Am. Chem. Soc.*, 104, 5586 (1982), S. P. Pappas et al., *J. Imaging Sci.*, 30 (5), 218 (1986), S. Kondo et al., *Makromol. Chem., Rapid Commun.*, 9, 625 (1988), Y. Yamada et al., *Makromol. Chem.*, 152, 153, 163 (1972), J. V. Crivello et al., *J. Polymer Sci.*, Polymer Chem. Ed., 17, 3845 (1979), U.S. Pat. No. 3,849,137, German Patent 3,914,407, JP-A-63-26653, JP-A-55-164824, JP-A-62-69263, JP-A-63-146038, JP-A-63-163452, JP-A-62-153853, JP-A-63-146029, etc.

Furthermore, compounds capable of generating an acid by light described in V. N. R. Pillai, *Synthesis*, (1), 1 (1980), A. Abad et al., *Tetrahedron Lett*, (47) 4555 (1971), D. H. R. Barton et al., *J. Chem. Soc.*, (C), 329 (1970), U.S. Pat. No. 3,779,778, European Patent 126,712, etc. may also be used.

Among these compounds capable of decomposing by the irradiation of an actinic ray or radiation and thereby generating an acid, particularly effective compounds are described below.

(1) Oxazole Derivative Represented by Formula (PAG1) and S-Triazine Derivative Represented by Formula (PAG2), Each Substituted by Trihalomethyl Group:

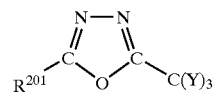

(PAG1)

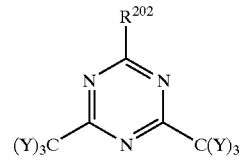

(PAG2)

wherein $R^{201}$ represents a substituted or unsubstituted aryl group or a substituted or unsubstituted alkenyl group, $R^{202}$ represents a substituted or unsubstituted aryl group, a substituted or unsubstituted alkenyl group, a substituted or unsubstituted alkyl group or —C(Y)$_3$, and Y represents chlorine atom or bromine atom.

Specific examples thereof include the following compounds, however, the present invention is by no means limited thereto.

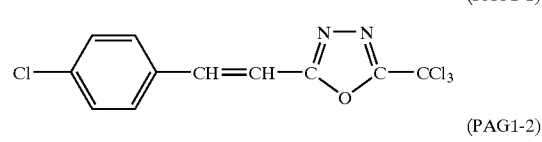

(PAG1-1)

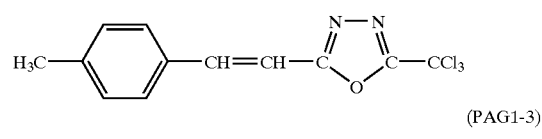

(PAG1-2)

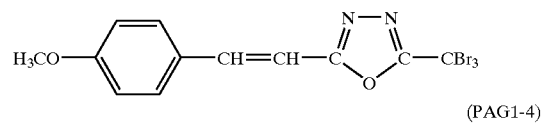

(PAG1-3)

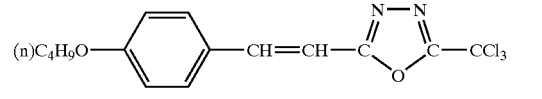

(PAG1-4)

(PAG1-5)
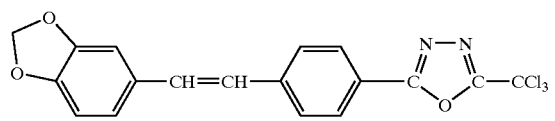
(PAG1-6)
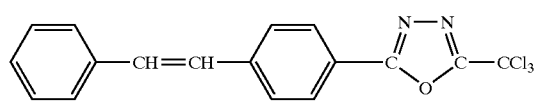
(PAG1-7)
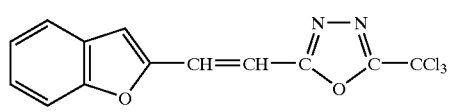
(PAG1-8)
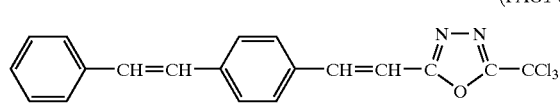
(PAG2-1)
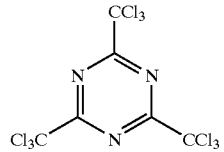
(PAG2-2)
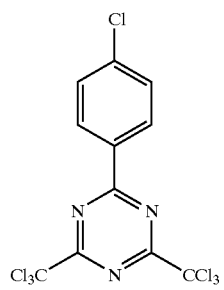
(PAG2-3)
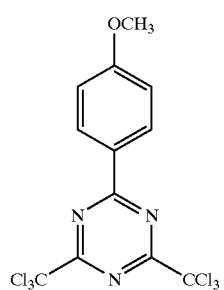
(PAG2-4)
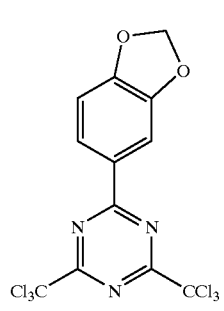
(PAG2-5)
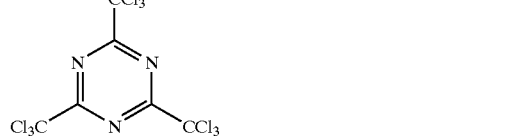
(PAG2-6)
(PAG2-7)
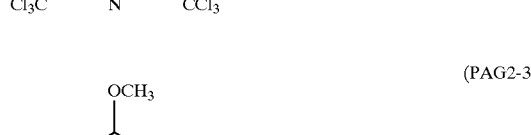
(PAG2-8)
(PAG2-9)
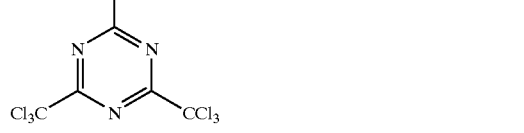

(PAG2-10)

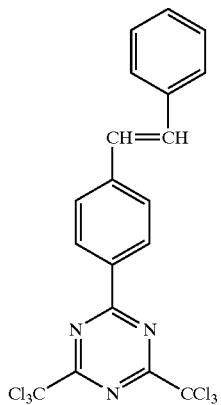

(2) Iodonium Salt Represented by Formula (PAG3) and Sulfonium Salt Represented by Formula (PAG4):

(PAG3)

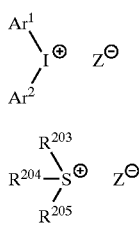

(PAG4)

$$R^{204}-\overset{R^{203}}{\underset{R^{205}}{S^{\oplus}}} \quad Z^{\ominus}$$

wherein $Ar^1$ and $Ar^2$ each independently represents a substituted or unsubstituted aryl group (wherein the substituent is preferably an alkyl group, a haloalkyl group, a cycloalkyl group, an aryl group, an alkoxy group, a nitro group, a carboxyl group, an alkoxycarbonyl group, a hydroxy group, a mercapto group or a halogen atom, $R^{203}$, $R^{204}$ and R205 each independently are a substituted or unsubstituted alkyl group or a substituted or unsubstituted aryl group, and preferably an aryl group having from 6 to 14 carbon atoms, an alkyl group having from 1 to 8 carbon atoms or a substituted derivative thereof (wherein the substituent for the aryl group is preferably an alkoxy group having from 1 to 8 carbon atoms, an alkyl group having from 1 to 8 carbon atoms, a nitro group, a carboxyl group, a hydroxy group or a halogen atom, and the substituent for the alkyl group is preferably an alkoxy group having from 1 to 8 carbon atoms, a carboxyl group or an alkoxycarbonyl group), and Z⁻ represents a counter anion (for example, $BF_4^-$, $AsF_6^-$, $PF_6^-$, $SbF_6^-$, $SiF_6^{2-}$, $ClO_4^-$, perfluoroalkane sulfonic acid anion such as $CF_3SO_3^-$, pentafluorobenzene sulfonic acid anion, condensed polynuclear aromatic sulfonic acid anion such as naphthalene-1-sulfonate anion, anthraquinone sulfonic acid anion and sulfonic acid group-containing dye, but the anion is not limited thereto).

Two of $R^{203}$, $R^{204}$ and $R^{205}$, or $Ar^1$ and $Ar^2$ may be bonded through a single bond or a substituent.

Specific examples thereof include the following compounds, however, the present invention is by no means limited thereto.

(PAG3-1)

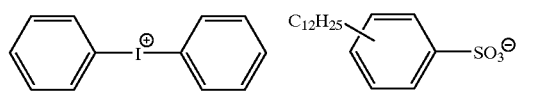

(PAG3-2)

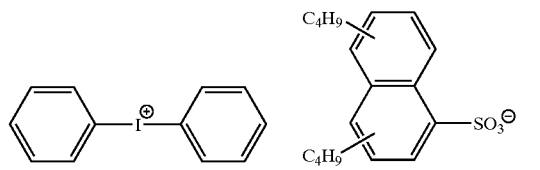

(PAG3-3)

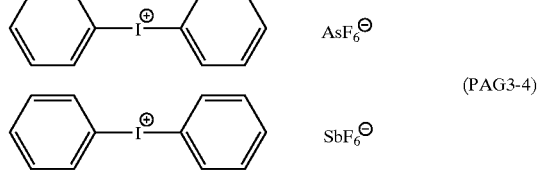

(PAG3-4)

(PAG3-5)

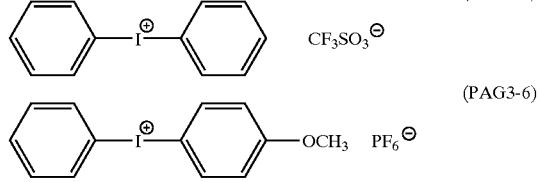

(PAG3-6)

(PAG3-7)

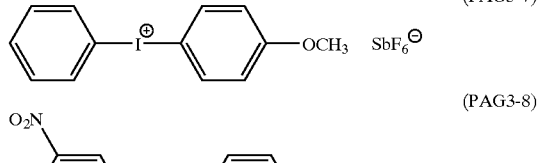

(PAG3-8)

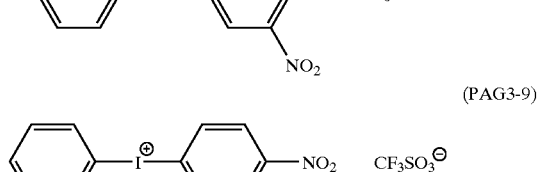

(PAG3-9)

(PAG3-10)

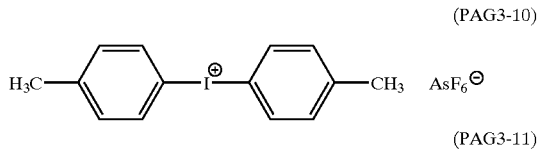

(PAG3-11)

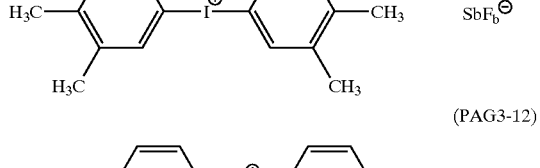

(PAG3-12)

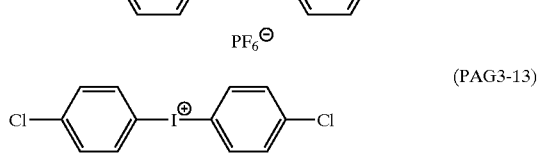

(PAG3-13)

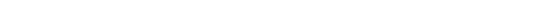

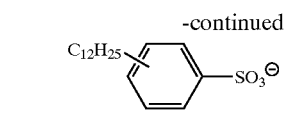 (PAG3-14)
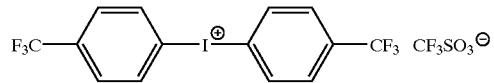 (PAG3-15)
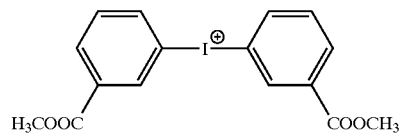 (PAG3-16)
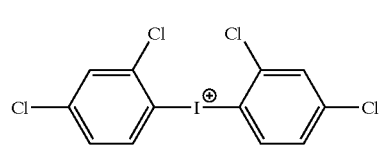 (PAG3-17)
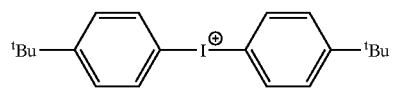 (PAG3-18)
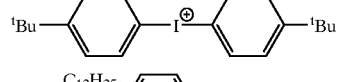 
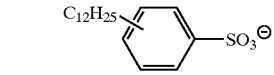 (PAG3-19)
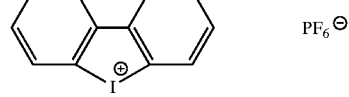 (PAG3-20)
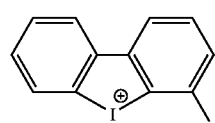 (PAG3-21)
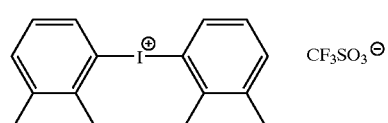 (PAG3-22)
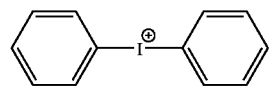
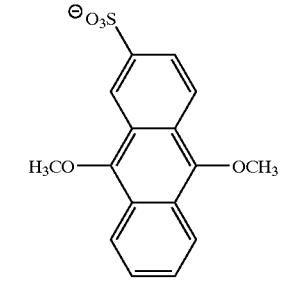
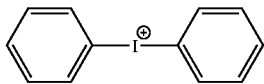 (PAG3-23)
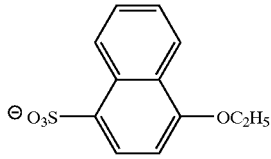
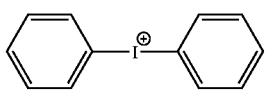 (PAG3-24)
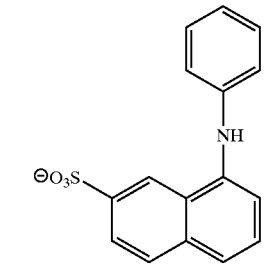
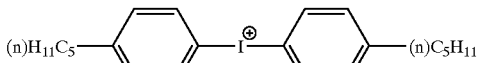 (PAG3-25)
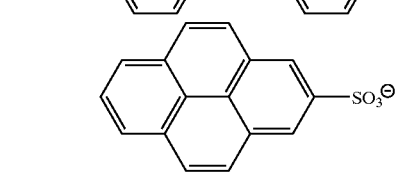
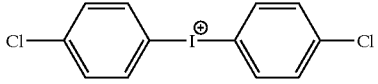 (PAG3-26)
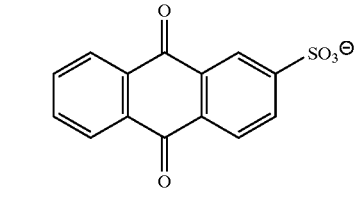
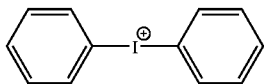 (PAG3-27)
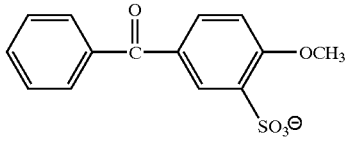
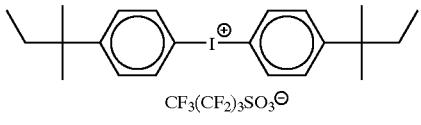 (PAG3-28)
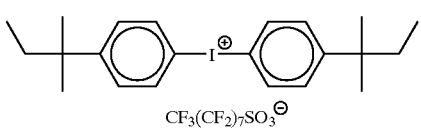 (PAG3-29)

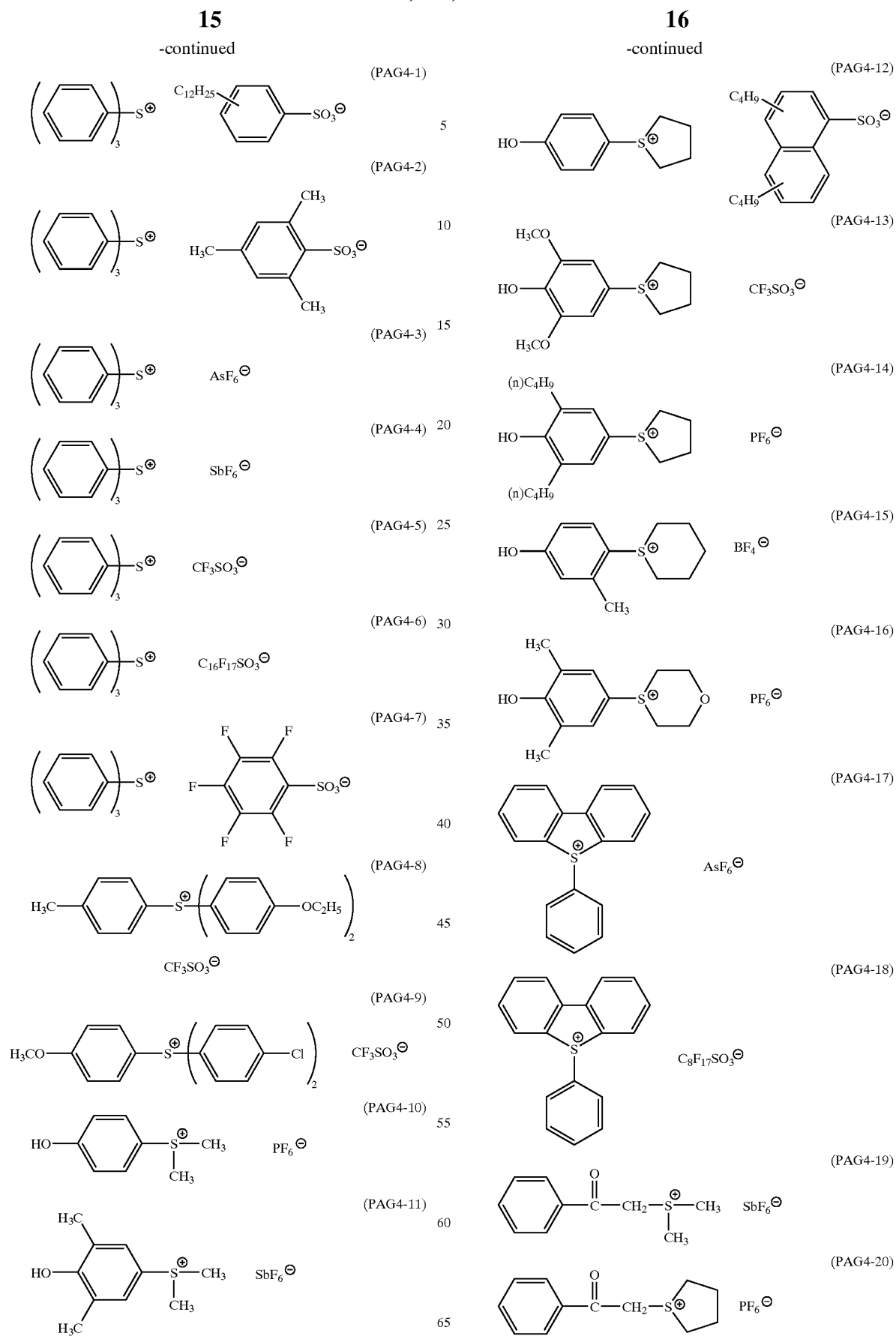

(PAG4-21)
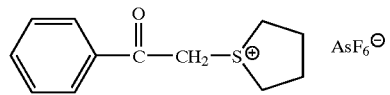
(PAG4-22)
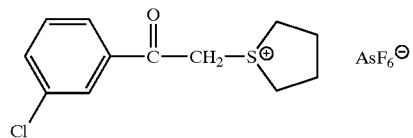
(PAG4-23)
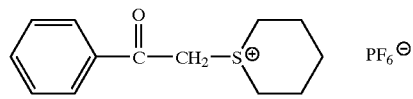
(PAG4-24)
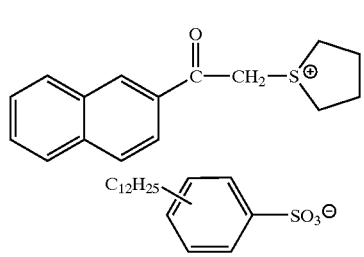
(PAG4-25)
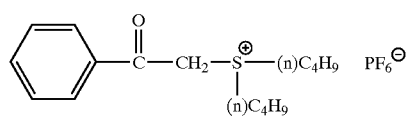
(PAG4-26)
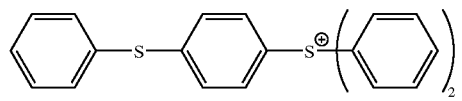
(PAG4-27)
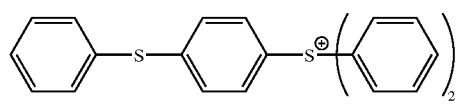
(PAG4-28)
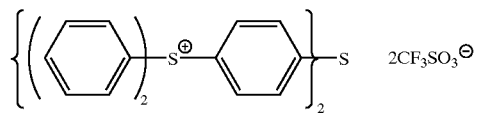
(PAG4-29)
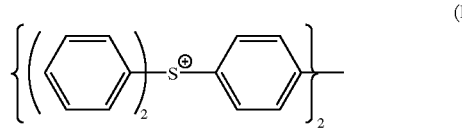
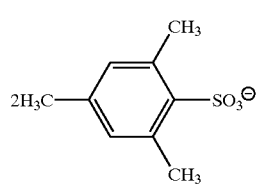
(PAG4-30)
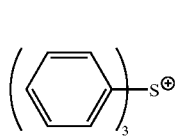 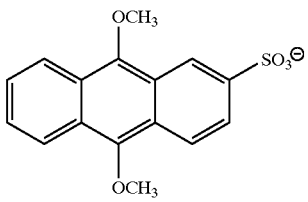
(PAG4-31)
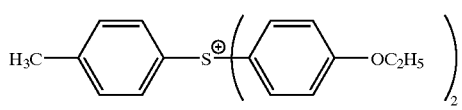
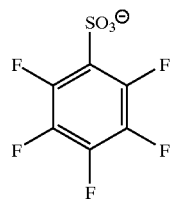
(PAG4-32)
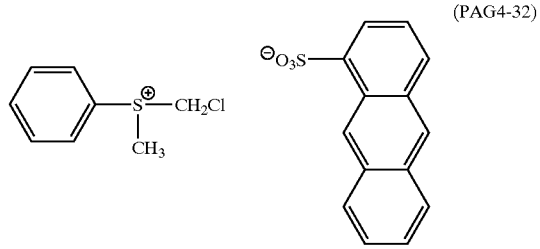
(PAG4-33)
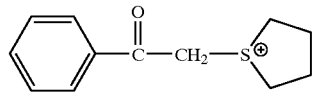 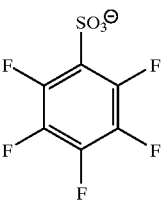
(PAG4-34)
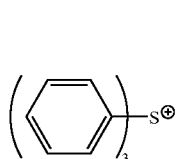 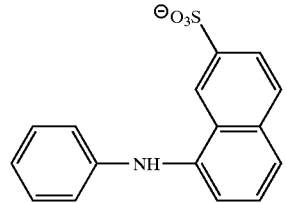
(PAG4-35)
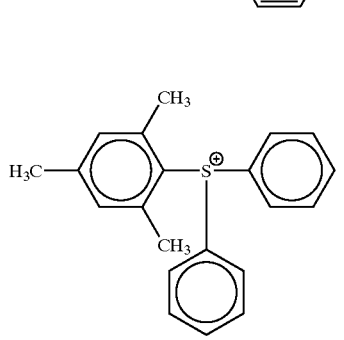

-continued (PAG4-36)

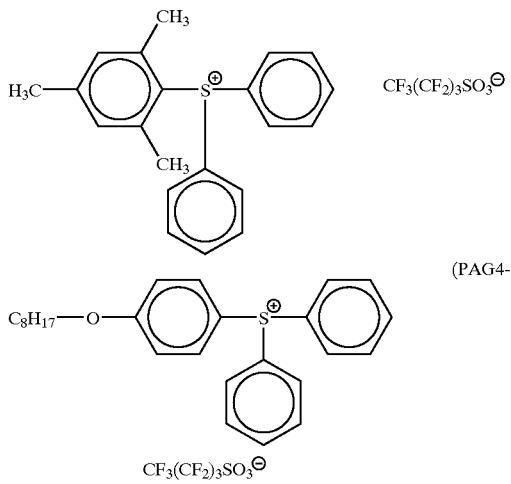

(PAG4-37)

The above-mentioned onium salts represented by formulae (PAG3) and (PAG4) are known and may be synthesized by a method described, for example, in J. W. Knapczyl et al., *J. Am. Chem. Soc.*, 91, 145 (1969), A. L. Maycok et al., *J. Org. Chem.*, 35, 2532 (1970), E. Goethas et al., *Bull. Soc. Chem. Belg.*, 73, 546 (1964), H. M. Leicester, *J. Am. Chem. Soc.*, 51, 3587 (1929), J. V. Crivello et al., *J. Polym. Chem. Ed.*, 18, 2677 (1980), U.S. Pat. Nos. 2,807,648 and 4,247,473, JP-A-53-101331, etc.

(3) Disulfonic Acid Derivative Represented by Formula (PAG5) and Iminosulfonate Derivative Represented by Formula (PAG6):

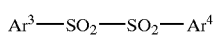

(PAG5)

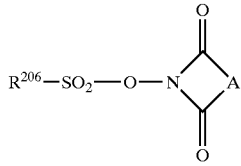

(PAG6)

wherein $Ar^3$ and $Ar^4$ each independently represents a substituted or unsubstituted aryl group, $R^{206}$ represents a substituted or unsubstituted alkyl group or a substituted or unsubstituted aryl group, A represents a substituted or unsubstituted alkylene group, a substituted or unsubstituted alkenylene group or a substituted or unsubstituted arylene group.

Specific examples thereof include the following compounds, however, the present invention is by no means limited thereto.

(PAG5-1)

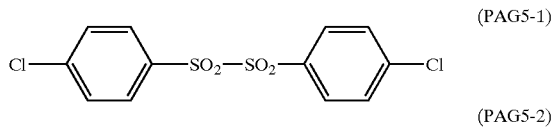

(PAG5-2)

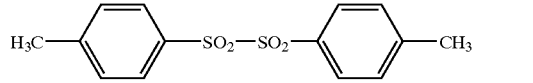

-continued (PAG5-3)

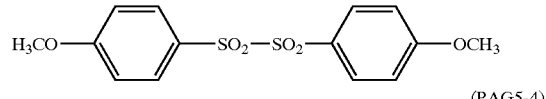

(PAG5-4)

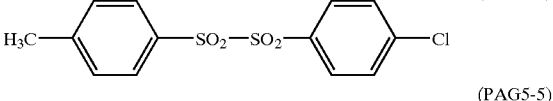

(PAG5-5)

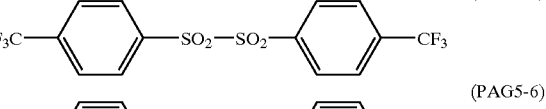

(PAG5-6)

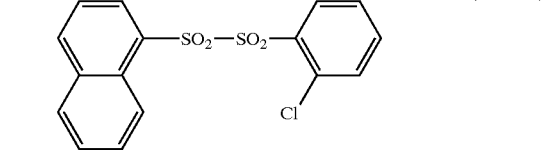

(PAG5-7)

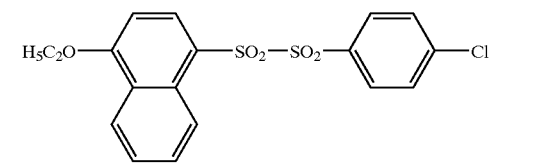

(PAG5-8)

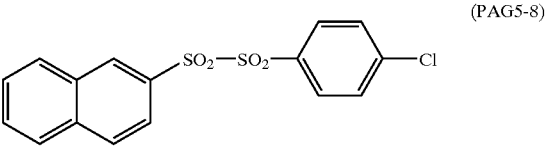

(PAG5-9)

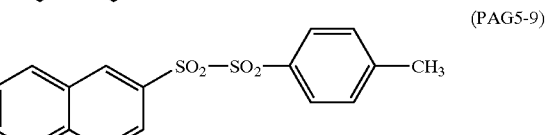

(PAG5-10)

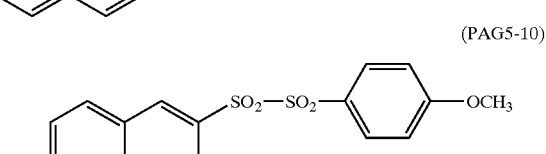

(PAG5-11)

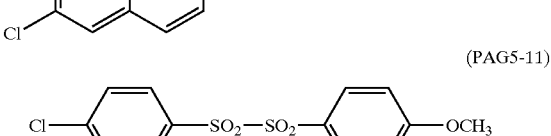

(PAG5-12)

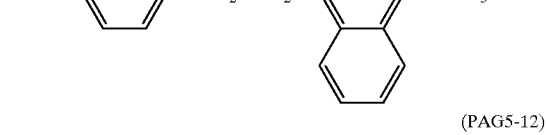

(PAG5-13)

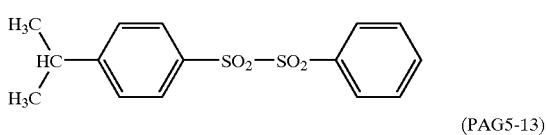

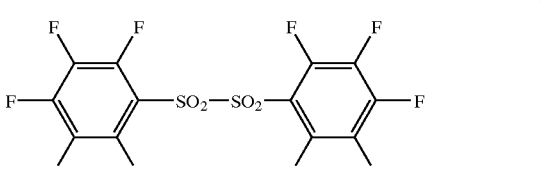

-continued
(PAG5-14)
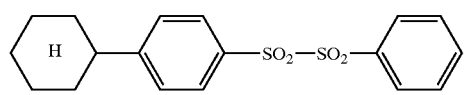
(PAG5-15)
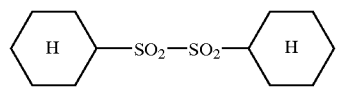
(PAG6-1)
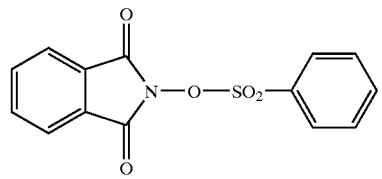
(PAG6-2)
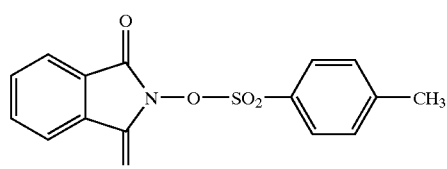
(PAG6-3)
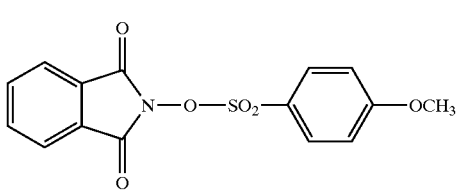
(PAG6-4)
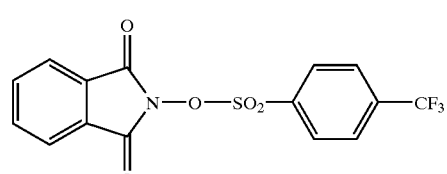
(PAG6-5)
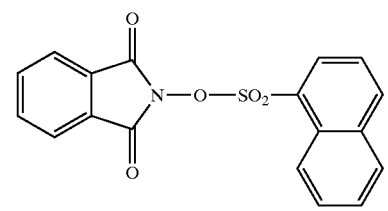
(PAG6-6)
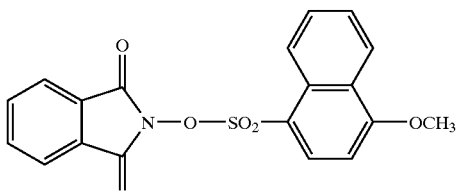
(PAG6-7)
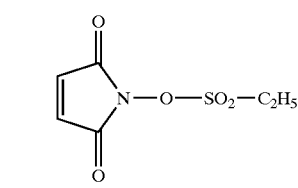
-continued
(PAG6-8)
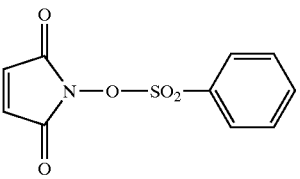
(PAG6-9)
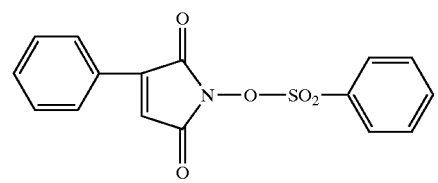
(PAG6-10)
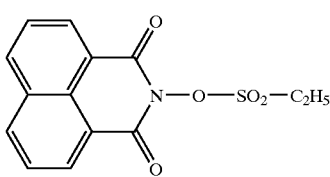
(PAG6-11)
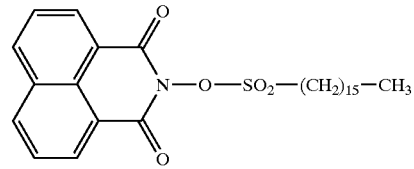
(PAG6-12)
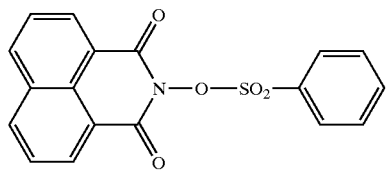
(PAG6-13)
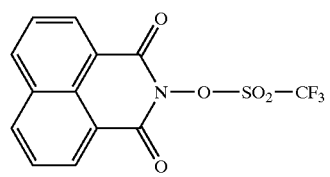
(PAG6-14)
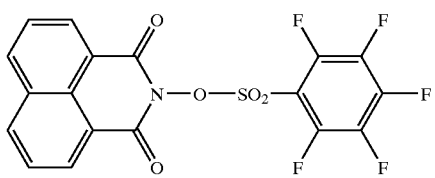
(PAG6-15)
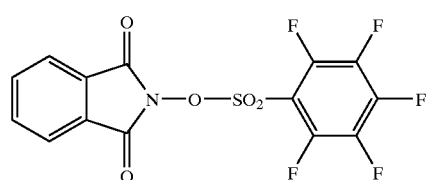
(PAG6-16)
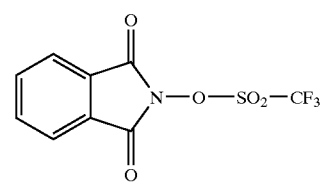

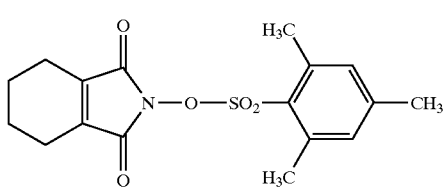
(PAG6-17)

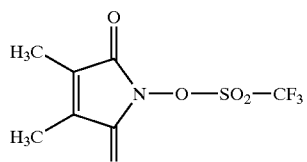
(PAG6-18)

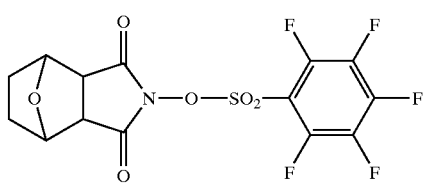
(PAG6-19)

The added amount of the compound capable of decomposing by the irradiation of an actinic ray or radiation and thereby generating an acid is usually from 0.001 to 40 wt %, preferably from 0.01 to 20 wt %, more preferably from 0.1 to 5 wt %, based on the entire weight of the resist composition (excluding the coating solvent). If the added amount of the compound capable of decomposing by the irradiation of an actinic ray or radiation and thereby generating an acid is less than 0.001 wt %, the sensitivity decreases, whereas if the added amount exceeds 40 wt %, the in light absorption by the resist excessively increases and the profile changes for the worse or the process (particularly bake) margin is disadvantageously reduced.

The polymer (B) having (1) at least of a repeating unit represented by the following formula (Ia) and a repeating unit represented by the following formula (Ib), (2) a repeating unit represented by formula (II), and (3) a group capable of decomposing by the action of an acid (hereinafter referred to as the "resin according to the present invention") is described below.

In formula (Ia), $R_1$ and $R_2$ each independently represents hydrogen atom, a cyano group, a hydroxyl group, —COOH, —COOR$_5$, —CO—NH—R$_6$, —CO—NH—SO$_2$—R$_6$ (wherein $R_5$ represents an alkyl group which may have a substituent, a cyclic hydrocarbon group which may have a substituent or a —Y group shown above, and $R_6$ represents an alkyl group which may have a substituent, or a cyclic hydrocarbon group which may have a substituent), an alkyl group which may be substituted, an alkoxy group which may be substituted, an alkoxy group which may be substituted, a cyclic hydrocarbon group which may be substituted or a —Y group shown above.

In the —Y group, $R_{21}$ to $R_{30}$ each independently represents hydrogen atom or an alkyl group which may have a substituent, and a and b each represents 1 or 2.

X represents oxygen atom, sulfur atom, —NH—, —NHSO$_2$— or —NHSO$_2$NH—.

A represents a single bond or a divalent linking group.

In formula (Ib), $Z_2$ represents —O— or —N(R$_3$)— (wherein $R_3$ represents hydrogen atom, a hydroxyl group or —OSO$_2$—R$_4$ (wherein $R_4$ represents an alkyl group, a haloalkyl group, a cycloalkyl group or a camphor residue)).

The alkyl group as $R_1$, $R_2$, $R_4$, $R_5$, $R_6$ and $R_{21}$ to $R_{30}$ is preferably a linear or branched alkyl group having from 1 to 10 carbon atoms, more preferably a linear or branched alkyl group having from 1 to 6 carbon atoms, still more preferably a methyl group, an ethyl group, a propyl group, an isopropyl group, an n-butyl group, an isobutyl group, a sec-butyl group or a t-butyl group.

Examples of the cyclic hydrocarbon group as $R_1$, $R_2$, $R_5$ and $R_6$ include a cyclopropyl group, a cyclopentyl group, a cyclohexyl group, an adamantyl group, a 2-methyl-2-adamantyl group, a norbornyl group, a boronyl group, an isoboronyl group, a tricyclodecanyl group, a dicyclopentenyl group, a nobornane epoxy group, a menthyl group, an isomenthyl group, a neomenthyl group and a tetracyclodecanyl group.

Examples of the alkoxy group as $R_1$ and $R_2$ include an alkoxy group having from 1 to 4 carbon atoms such as methoxy group, ethoxy group, propoxy group and butoxy group.

Examples of the haloalkyl group as $R_4$ include a trifluoromethyl group, a nanofluorobutyl group, a pentadecafluorooctyl group and a trichloromethyl group. Examples of the cycloalkyl group as $R_4$ include a cyclopentyl group, a cyclohexyl group and a cyclooctyl group.

Examples of the substituent which the above-described alkyl group, cyclic hydrocarbon group or alkoxy group may further have include a hydroxyl group, a halogen atom, a carboxyl group, an alkoxy group, an acyl group, a cyano group and an acyloxy group. Examples of the halogen atom include chlorine atom, bromine atom, fluorine atom and iodine atom. Examples of the alkoxy group include an alkoxy group having from 1 to 4 carbon atoms, such as methoxy group, ethoxy group, propoxy group and butoxy group, examples of the acyl group include a formyl group and an acetyl group, and examples of the acyloxy group include an acetoxy group.

Examples of the divalent linking group represented by A in formulae (Ia) and (Ib) include an alkylene group, a substituted alkylene group, an ether group, a thioether group, a carbonyl group, an ester group, an amide group, a sulfonamide group, a urethane group and a urea group, and the divalent linking group may be selected from these groups and used individually or in combination of two or more thereof.

Examples of the alkylene group and substituted alkylene group as A include the groups represented by the following formula:

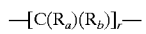

wherein $R_a$ and $R_b$, which may be the same or different, each represents hydrogen atom, an alkyl group, a substituted alkyl group, a halogen atom, a hydroxyl group or an alkoxy group, the alkyl group is preferably a lower alkyl group such as methyl group, ethyl group, propyl group, isopropyl group and butyl group, more preferably a methyl group, an ethyl group, a propyl group or an isopropyl group, the substituent of the substituted alkyl group is selected from a hydroxyl group, a halogen atom and an alkoxy group, the alkoxy group include an alkoxy group having from 1 to 4 carbon atoms, such as methoxy group, ethoxy group, propoxy group and butoxy group, the halogen atom includes chlorine atom, bromine atom, fluorine atom and iodine atom; and r represents an integer of from 1 to 10.

Specific examples of the repeating unit represented by formula (Ia) include the following compounds [I-1] to [I-65], however, the present invention is by no means limited thereto.

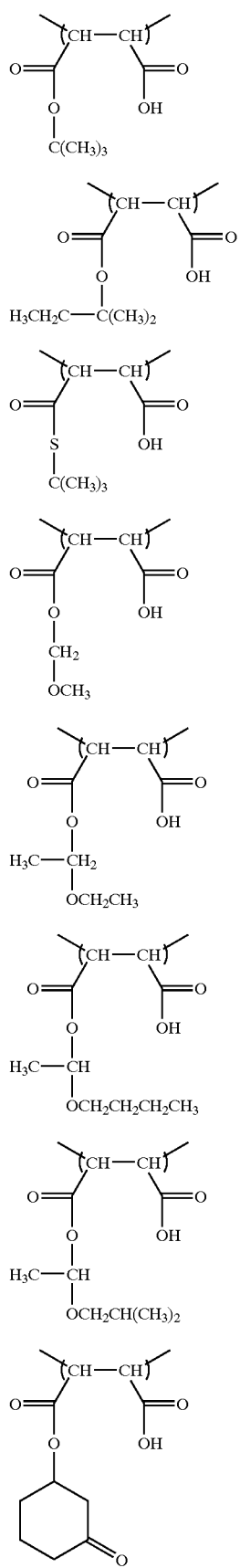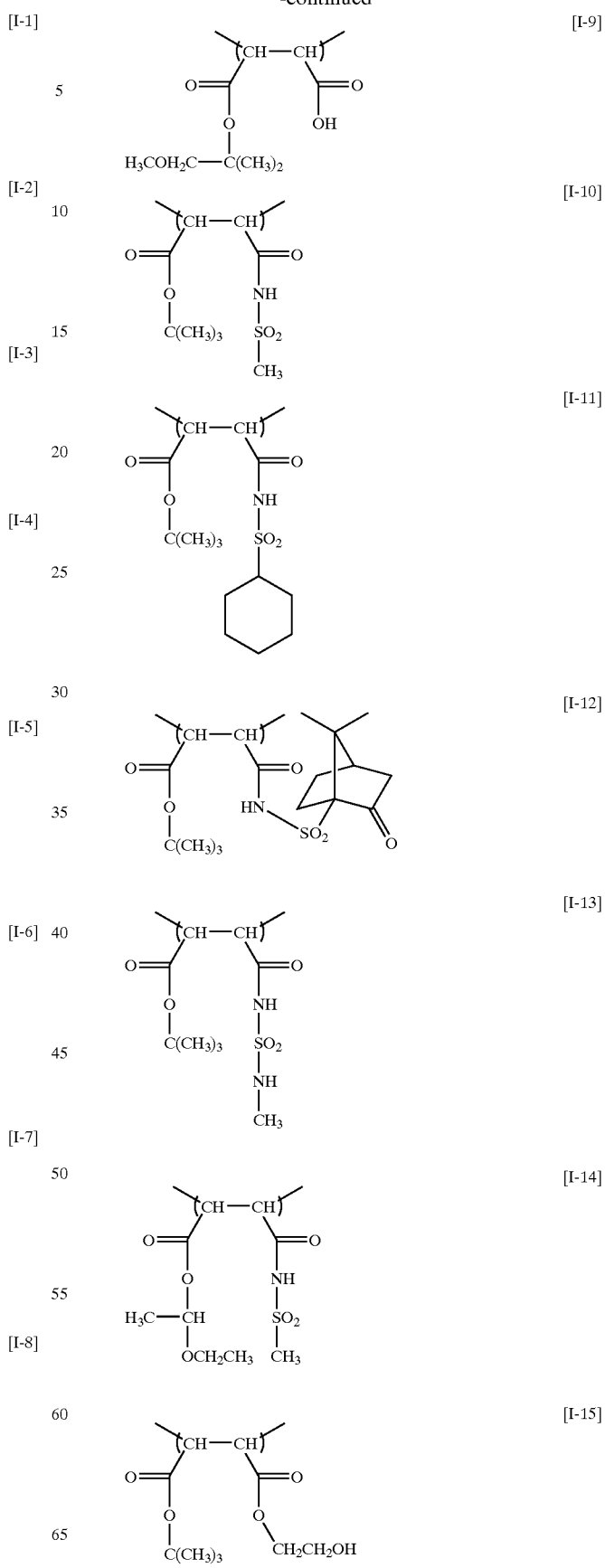

-continued
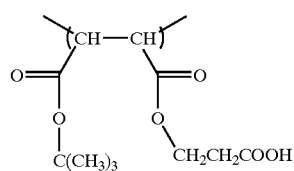
[I-16]
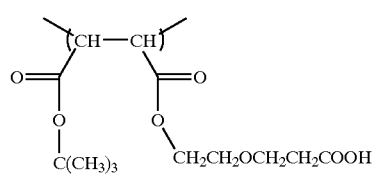
[I-17]
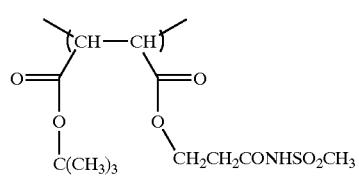
[I-18]
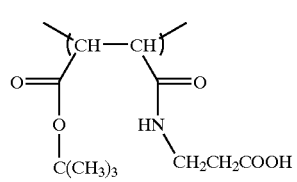
[I-19]
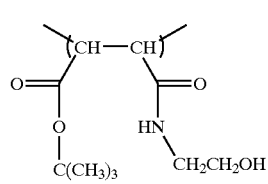
[I-20]
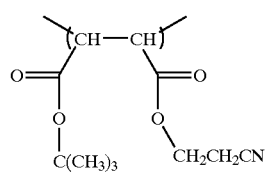
[I-21]
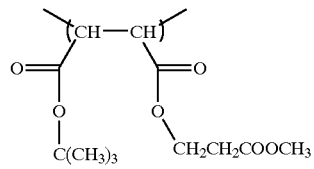
[I-22]
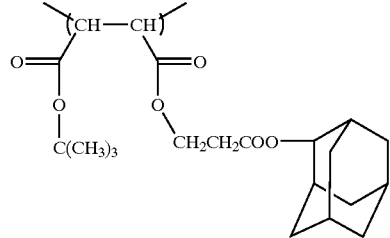
[I-23]
-continued
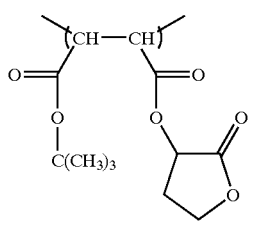
[I-24]
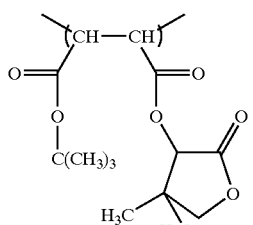
[I-25]
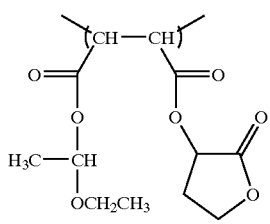
[I-26]
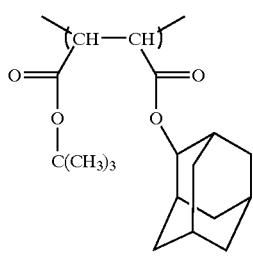
[I-27]
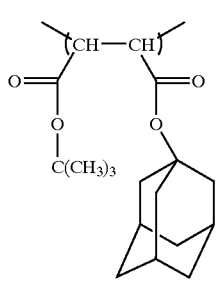
[I-28]
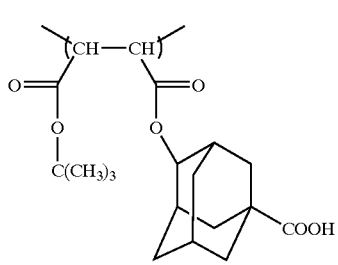
[I-29]

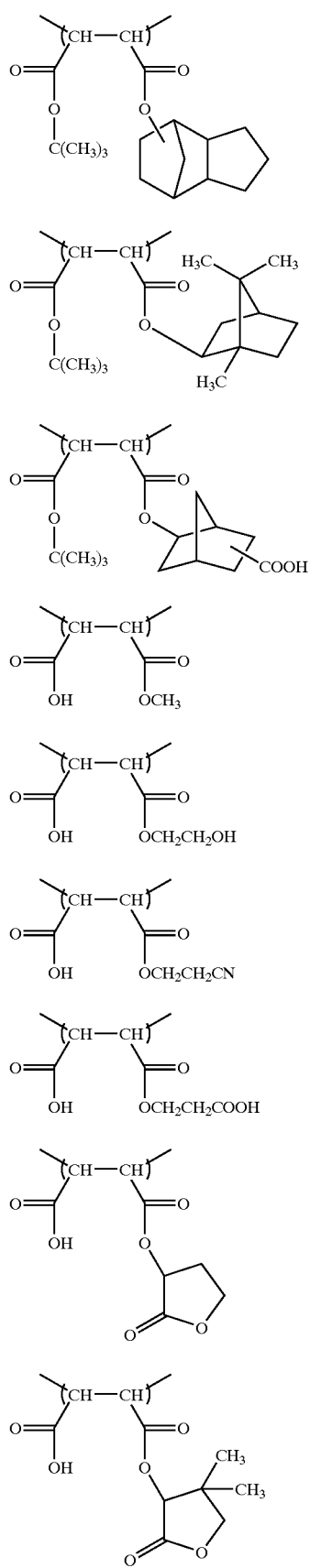
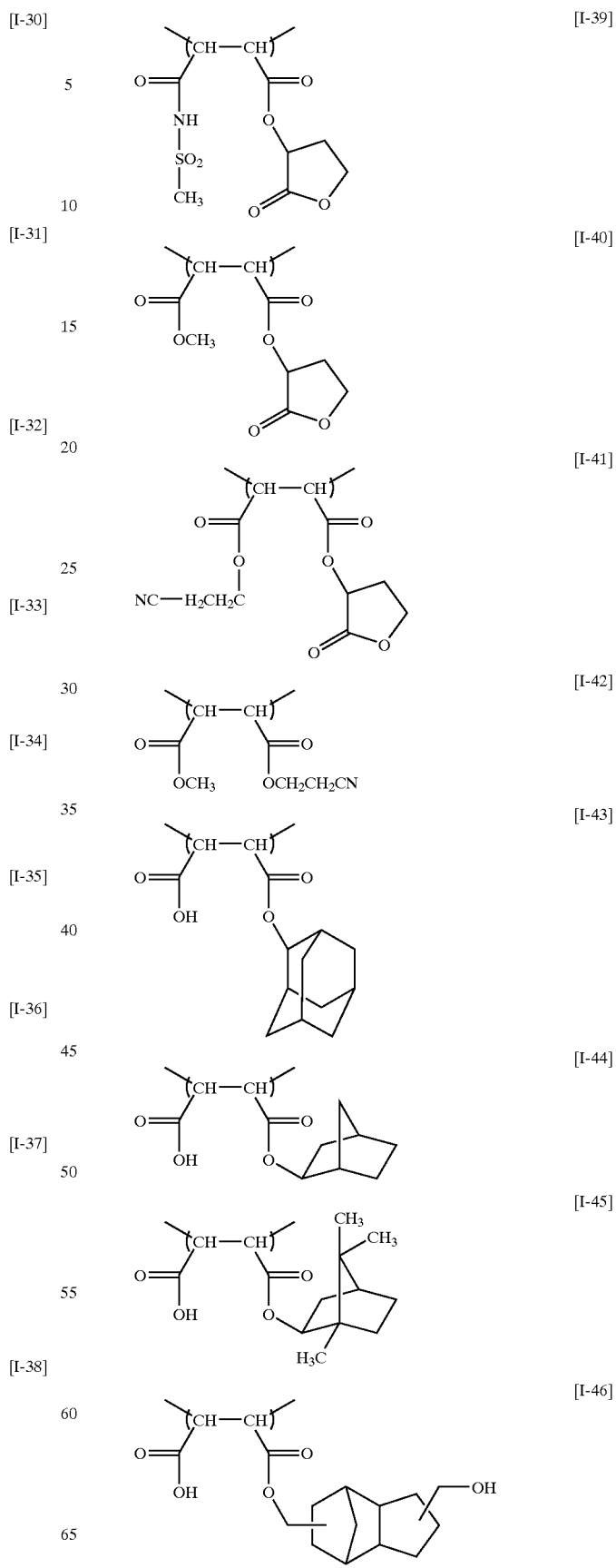

-continued
[I-47] 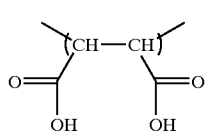
[I-48] 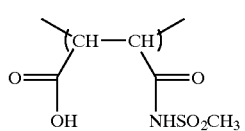
[I-49] 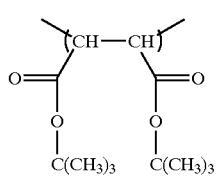
[I-50] 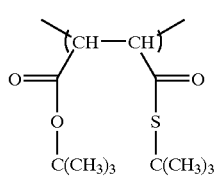
[I-51] 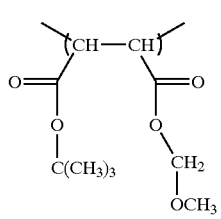
[I-52] 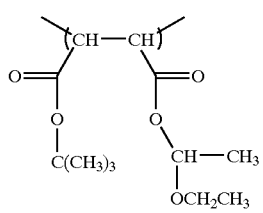
[I-53] 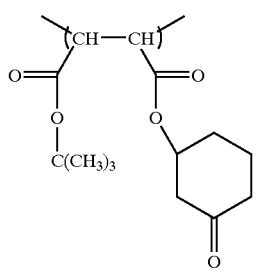
[I-54] 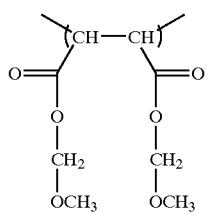
-continued
[I-55] 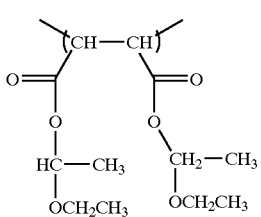
[I-56] 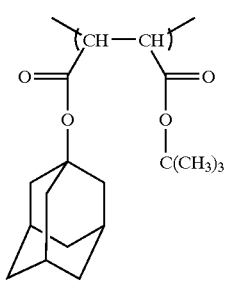
[I-57] 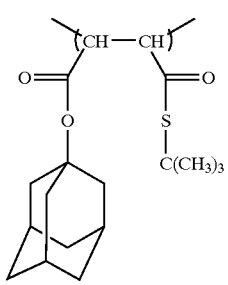
[I-58] 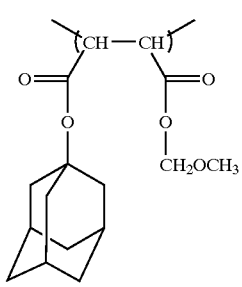
[I-59] 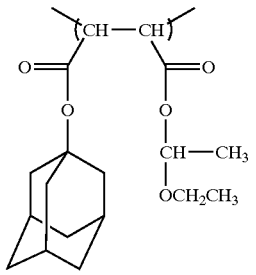
[I-60] 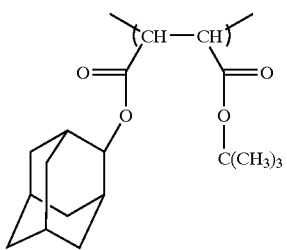

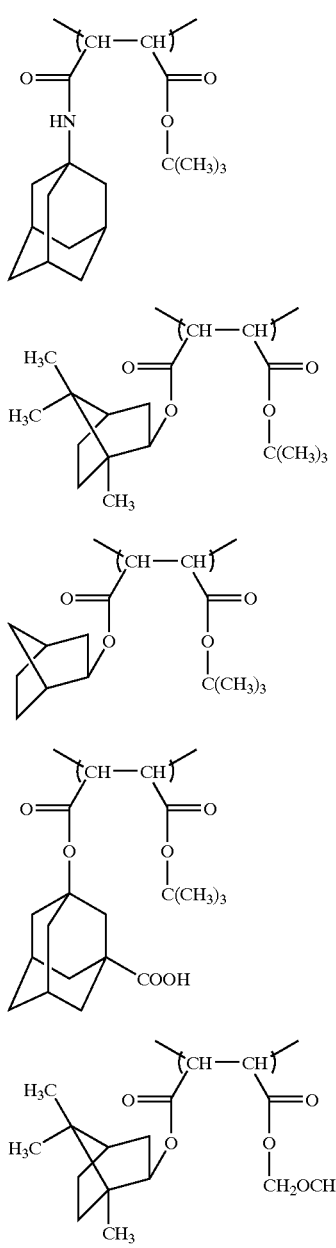

Specific examples of the repeating unit represented by formula (Ib) include the following compounds [I'-1] to [I'-7], however, the present invention is by no means limited thereto.

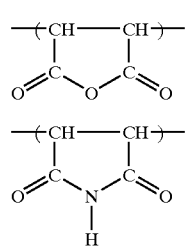

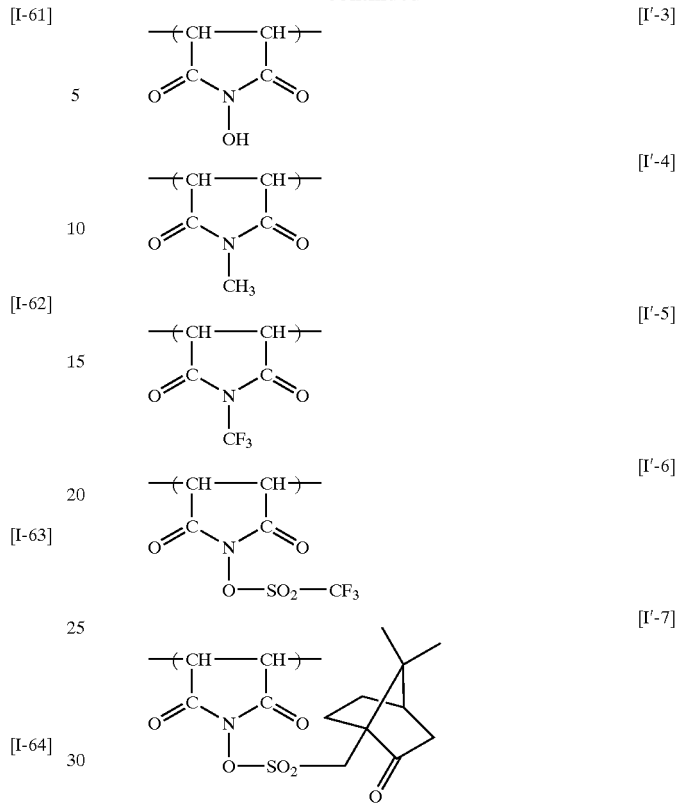

In formula (II), $R_{11}$ and $R_{12}$ each independently represents hydrogen atom, a cyano group, a halogen atom or an alkyl group which may have a substituent, and $Z_1$ represents an atomic group necessary for forming an alicyclic structure which contains the two bonded carbon atoms (C—C) and may have a substituent.

Examples of the halogen atom in $R_{11}$ and $R_{12}$ include chlorine atom, bromine atom, fluorine atom and iodine atom.

The alkyl group as $R_{11}$ and $R_{12}$ is preferably a linear or branched alkyl group having from 1 to 10 carbon atoms, more preferably a linear or branched alkyl group having from 1 to 6 carbon atoms, still more preferably a methyl group, an ethyl group, a propyl group, an isopropyl group, an n-butyl group, an isobutyl group, a sec-butyl group or a t-butyl group.

Examples of the substituent which the alkyl group as $R_{11}$ and $R_{12}$ may further have include a hydroxyl group, a halogen atom, a carboxyl group, an alkoxy group, an acyl group, a cyano group and an acyloxy group. Examples of the halogen atom include chlorine atom, bromine atom, fluorine atom and iodine atom. Examples of the alkoxy group include an alkoxy group having from 1 to 4 carbon atoms, such as methoxy group, ethoxy group, propoxy group and butoxy group, examples of the acyl group include a formyl group and an acetyl group, and examples of the acyloxy group include an acetoxy group.

The atomic group necessary for forming an alicyclic structure, represented by $Z_1$ is an atomic group of forming in the resin a repeating unit of alicyclic hydrocarbon which may have a substituent, preferably an atomic group of forming a bridged alicyclic structure constituting the repeating unit of bridged alicyclic hydrocarbon.

Examples of the alicyclic hydrocarbon skeleton formed include the following structures.

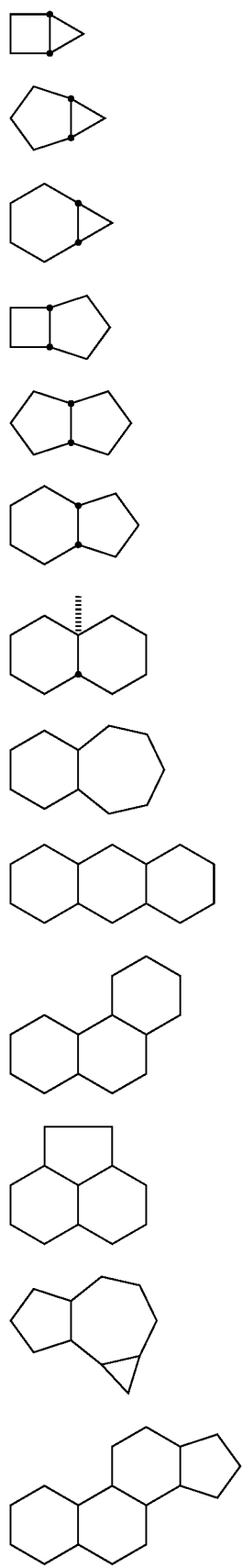
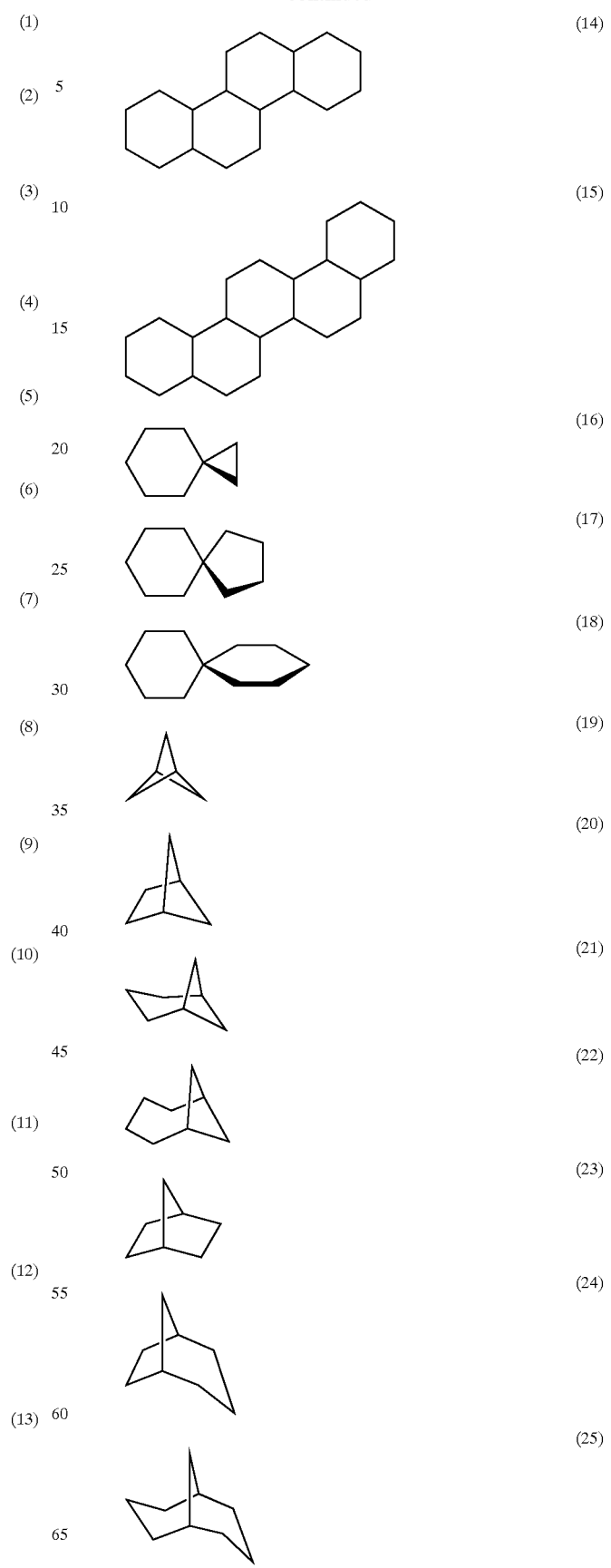

(26) 
(27) 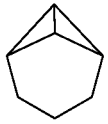
(28) 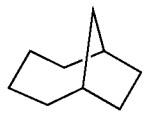
(29) 
(30) 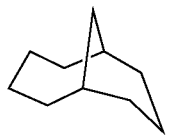
(31) 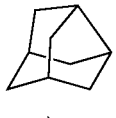
(32) 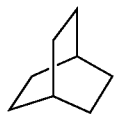
(33) 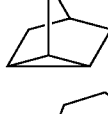
(34) 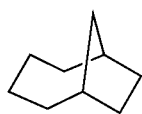
(35) 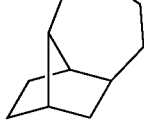
(36) 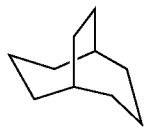
(37) 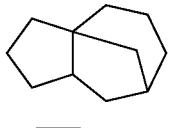
(38) 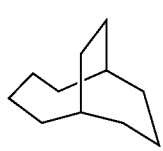
(39) 
(40) 
(41) 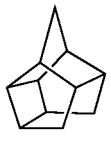
(42) 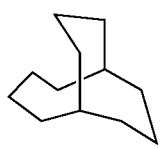
(43) 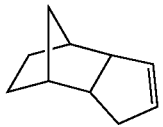
(44) 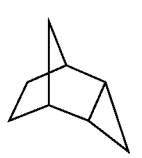
(45) 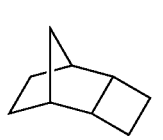
(46) 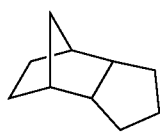
(47) 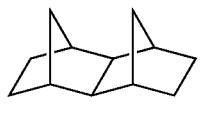

Among these structures, preferred examples of the bridged alicyclic hydrocarbon skeleton include (5), (6), (7), (9), (10), (13), (14), (15), (23), (28), (36), (37), (42) and (47).

The alicyclic hydrocarbon skeleton may have a substituent. Examples of the substituent include $R_{13}$ to $R_{16}$ in formulae (II-A) and (II-B).

Among the repeating units having the above-described alicyclic hydrocarbon skeleton, the repeating units represented by formulae (II-A) and (II-B) are more preferred.

In formulae (II-A) and (II-B), $R_{13}$ to $R_{16}$ each independently represents hydrogen atom, a halogen atom, a cyano group, —COOH, —COOR$_5$ (wherein R$_5$ represents an alkyl group which may have a substituent, a cyclic hydrocarbon group which may have a substituent, or —Y group having the same meaning as defined in formula (I)), a group capable of decomposing by the action of an acid, —C(=O)—X—

A—R$_{17}$ (wherein X represents oxygen atom, sulfur atom, —NH—, —NHSO$_2$— or —NHSO$_2$NH—, R$_{17}$ represents —COOH, —COOR$_5$, —CN, a hydroxyl group, an alkoxy group which may have a substituent, —CO—NH—R$_6$, —CO—NH—SO$_2$—R$_6$ (wherein R$_5$ and R$_6$ are the same as defined above) or a —Y group in formula (Ia) above, and A represents a single bond or a divalent linking group), an alkyl group which may have a substituent or a cyclic hydrocarbon group which may have a substituent, and n represents 0 or 1.

In the resin according to the present invention, the acid-decomposable group may be contained in —C(=O)—X—A—R$_1$ or —C(=O)—X—A—R$_2$ or may be contained as a substituent for Z$_1$ in formula (II).

The structure of the acid-decomposable group is represented by the formula: —C(=O)—X$_1$—R$_0$ (wherein R$_0$ is a tertiary alkyl group such as t-butyl group and t-amyl group, a 1-alkoxyethyl group such as isoboronyl group, 1-ethoxyethyl, group, 1-butoxyethyl group, 1-isobutoxyethyl group and 1-cyclohexyloxyethyl group, an alkoxymethyl group such as 1-methoxymethyl group and 1-ethoxymethyl group, a tetrahydropyranyl group, a tetrahydrofuranyl group, a trialkylsilylester group, a 3-oxocyclohexylester group, a 2-methyl-2-adamantyl group, a mevalonic lactone residue, or a 2-(γ-butyrolactonyloxycarbonyl)-2-propyl group, and X$_1$ has the same meaning as X above).

Examples of the halogen atom as R$_{13}$ to R$_{16}$ include chlorine atom, bromine atom, fluorine atom and iodine atom.

The alkyl group as R$_{13}$ to R$_{16}$ is preferably a linear or branched alkyl group having from 1 to 10 carbon atoms, more preferably a linear or branched alkyl group having from 1 to 6 carbon atoms, still more preferably a methyl group, an ethyl group, a propyl group, an isopropyl group, an n-butyl group, an isobutyl group, a sec-butyl group or a t-butyl group.

The cyclic hydrocarbon group as R$_{13}$ to R$_{16}$ is, for example, a cyclic alkyl group or a bridged hydrocarbon, and examples thereof include a cyclopropyl group, a cyclopentyl group, a cyclohexyl group, an adamantyl group, a 2-methyl-2-adamantyl group, a norbornyl group, a boronyl group, an isoboronyl group, a tricyclodecanyl group, a dicyclopentenyl group, a nobornane epoxy group, a menthyl group, an isomenthyl group, a neomenthyl group and a tetracyclododecanyl group.

Examples of the ring formed resulting from at least two of R$_{13}$ to R$_{15}$ being combined include a ring having from 5 to 12 carbon atoms, such as cyclopentene, cyclohexene, cycloheptane and cyclooctane.

Examples of the alkoxy group as R$_{17}$ include an alkoxy group having from 1 to 4 carbon atoms such as methoxy group, ethoxy group, propoxy group and butoxy group.

Examples of the substituent which the above-described alkyl group, cyclic hydrocarbon group or alkoxy group may further have include a hydroxyl group, a halogen atom, a carboxyl group, an alkoxy group, an acyl group, a cyano group and an acyloxy group. Examples of the halogen atom include chlorine atom, bromine atom, fluorine atom and iodine atom. Examples of the alkoxy group include an alkoxy group having from 1 to 4 carbon atoms, such as methoxy group, ethoxy group, propoxy group and butoxy group, examples of the acyl group include a formyl group and an acetyl group, and examples of the acyloxy group include an acetoxy group.

Examples of the divalent linking group represented by A include, similarly to the divalent linking group represented by A in formula (Ia), a single bond, an alkylene group, a substituted alkylene group, an ether group, a thioether group, a carbonyl group, an ester group, an amide group, a sulfonamide group, a urethane group and a urea group, and the divalent linking group may be selected from these groups and used individually or in combination of two or more thereof.

Examples of the alkylene group and the substituted alkylene group in A are the same as those of the divalent linking group represented by A in formula (Ia).

In the resin according to the present invention, the group capable of decomposing by the action of an acid may be contained in at least one repeating unit of a repeating unit represented by formula (Ia), a repeating unit represented by formula (Ib), a repeating unit represented by formula (II) and a repeating unit of a copolymerization component which is described later.

The substituents of R$_{13}$ to R$_{16}$ in formulae (II-A) and (II-B) are those which constitute the atomic group necessary for forming an alicyclic structure or a bridged alicyclic structure, represented by Z$_1$ in formula (II).

Specific examples of the repeating units represented by formulae (II-A) and (II-B) include the following compounds [II-1] to [II-166], however, the present invention is by no means limited thereto.

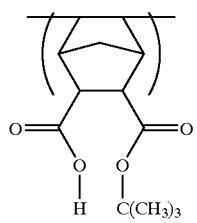

[II-1]

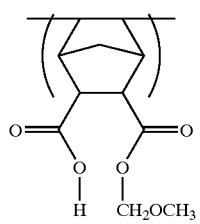

[II-2]

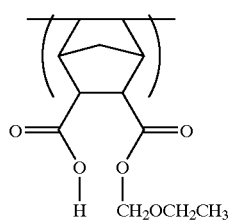

[II-3]

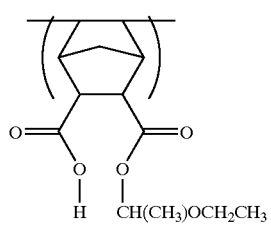

[II-4]

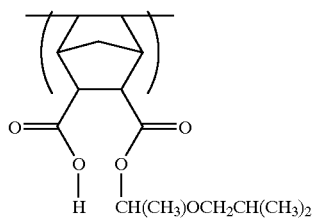 [II-5]
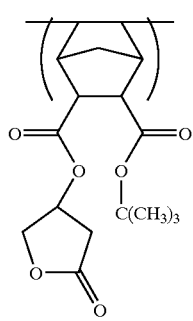 [II-6]
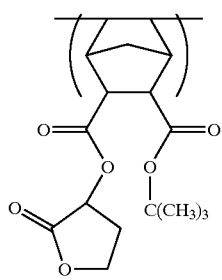 [II-7]
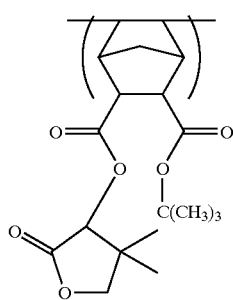 [II-8]
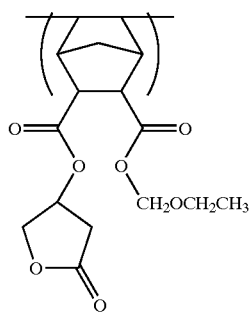 [II-9]
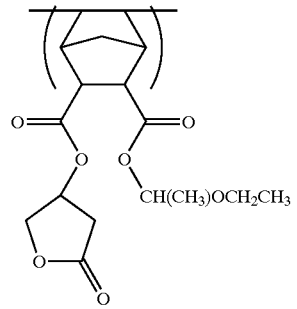 [II-10]
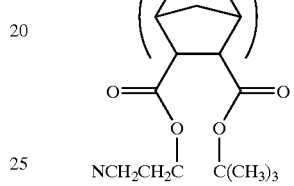 [II-11]
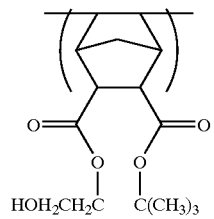 [II-12]
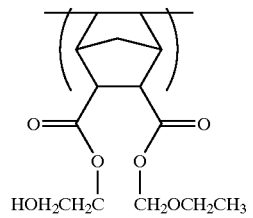 [II-13]
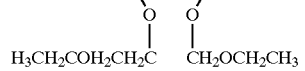 [II-14]
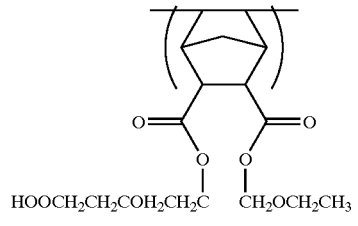 [II-15]

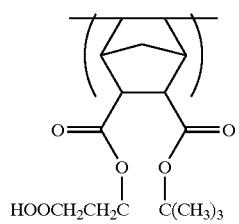
[II-16]
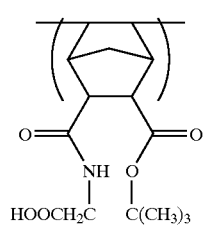
[II-17]
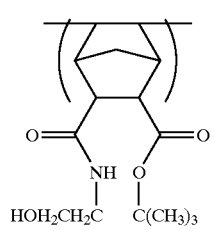
[II-18]
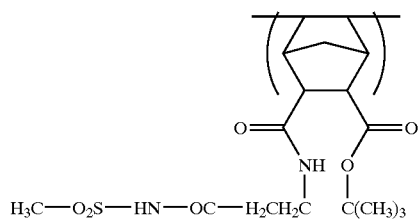
[II-19]
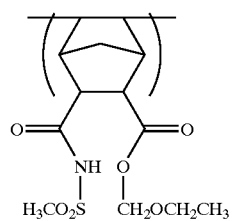
[II-20]
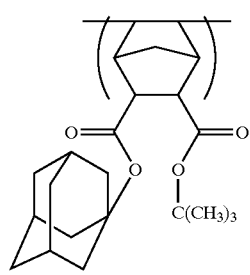
[II-21]
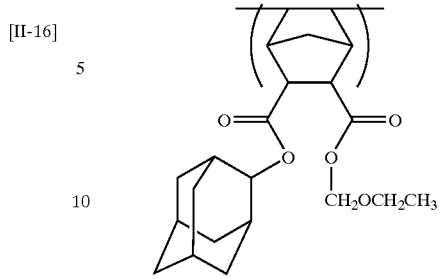
[II-22]
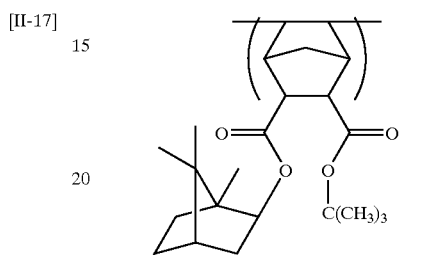
[II-23]
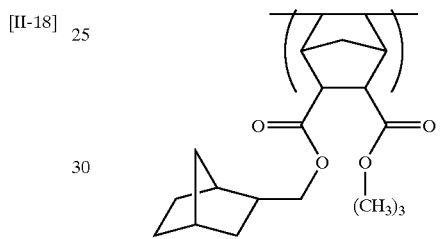
[II-24]
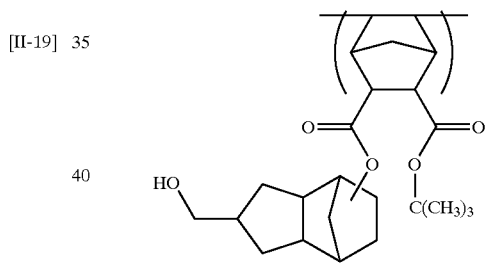
[II-25]
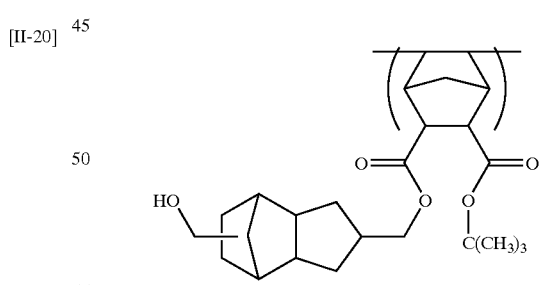
[II-26]
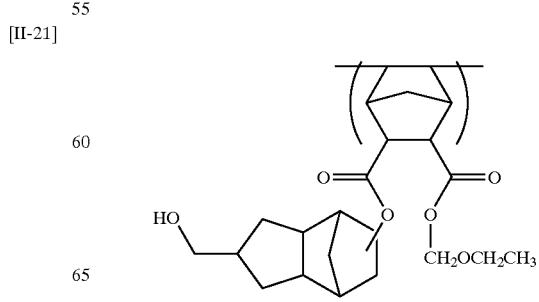
[II-27]

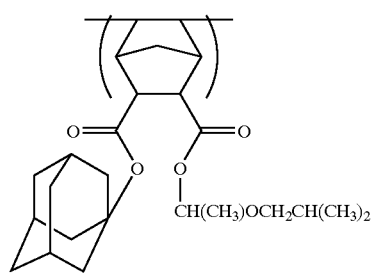
[II-28]
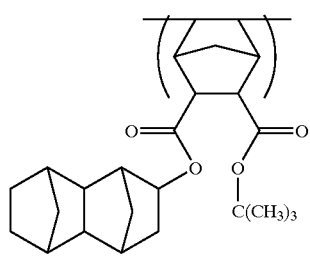
[II-29]
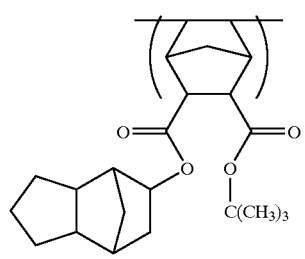
[II-30]
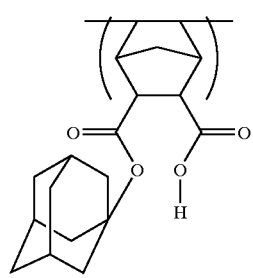
[II-31]
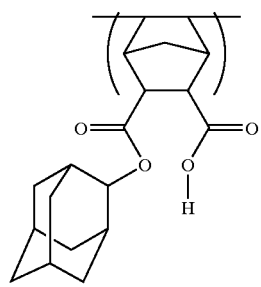
[II-32]
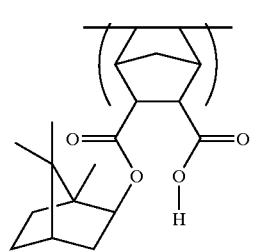
[II-33]
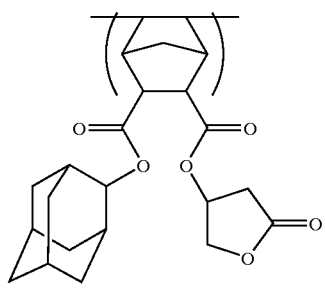
[II-34]
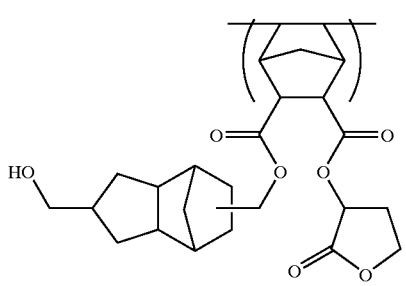
[II-35]
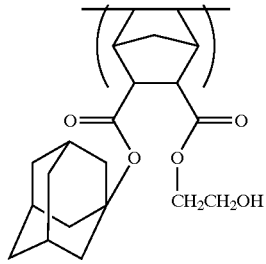
[II-36]
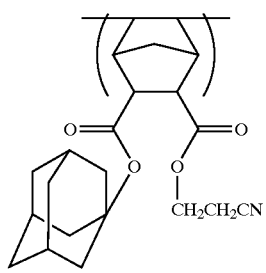
[II-37]
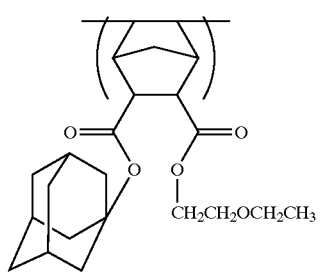
[II-38]

[II-39]
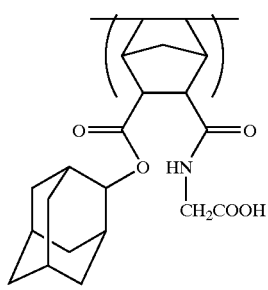
[II-40]
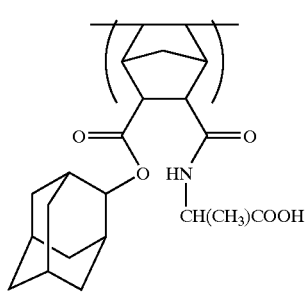
[II-41]
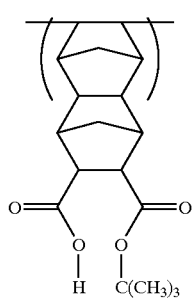
[II-42]
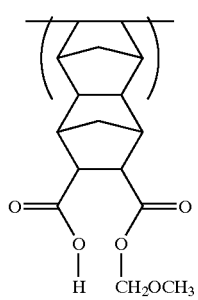
[II-43]
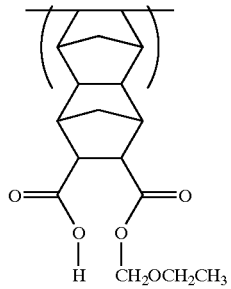
[II-44]
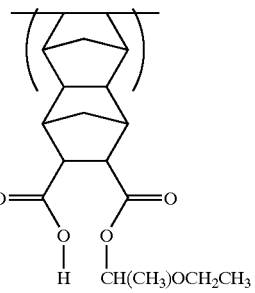
[II-45]
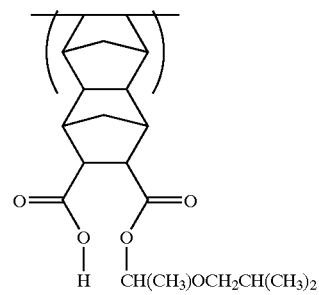
[II-46]
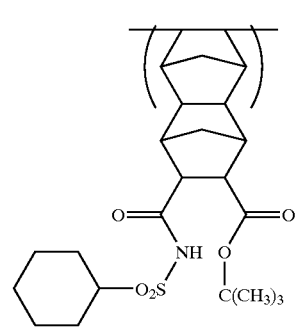
[II-47]
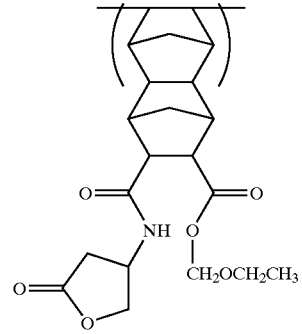
[II-48]
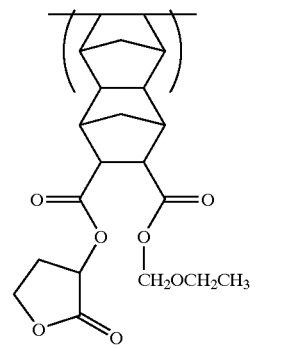

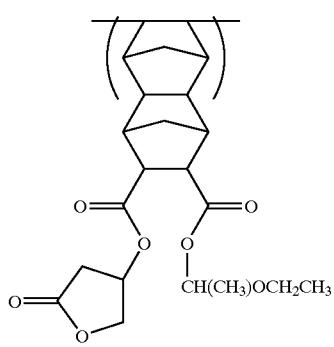
[II-49]
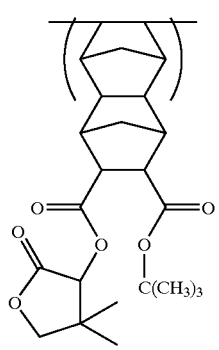
[II-50]
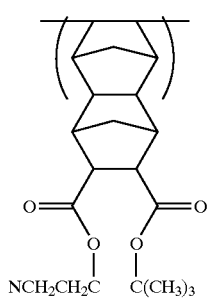
[II-51]
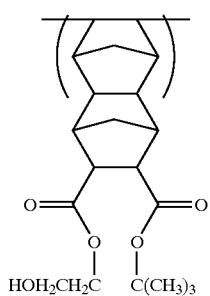
[II-52]
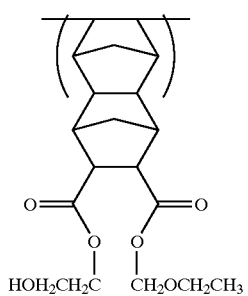
[II-53]
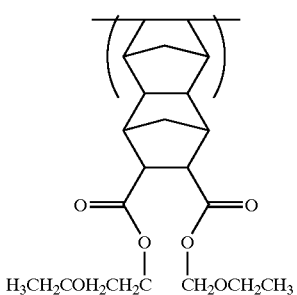
[II-54]
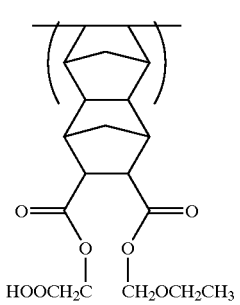
[II-55]
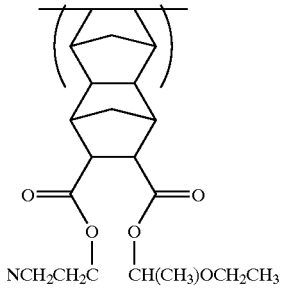
[II-56]
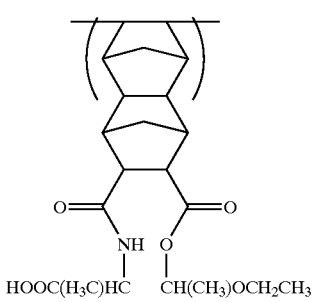
[II-57]
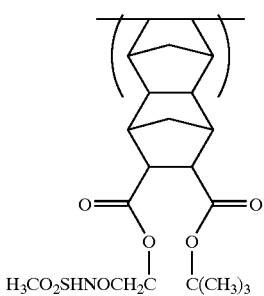
[II-58]

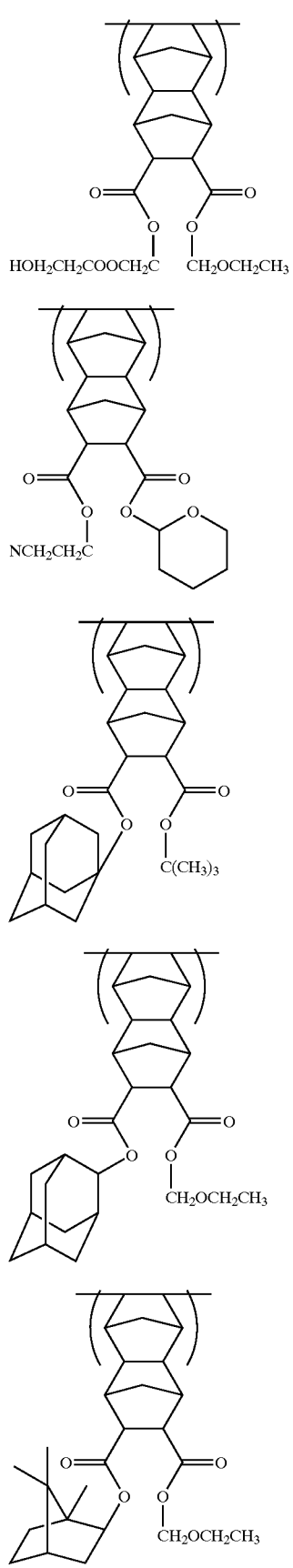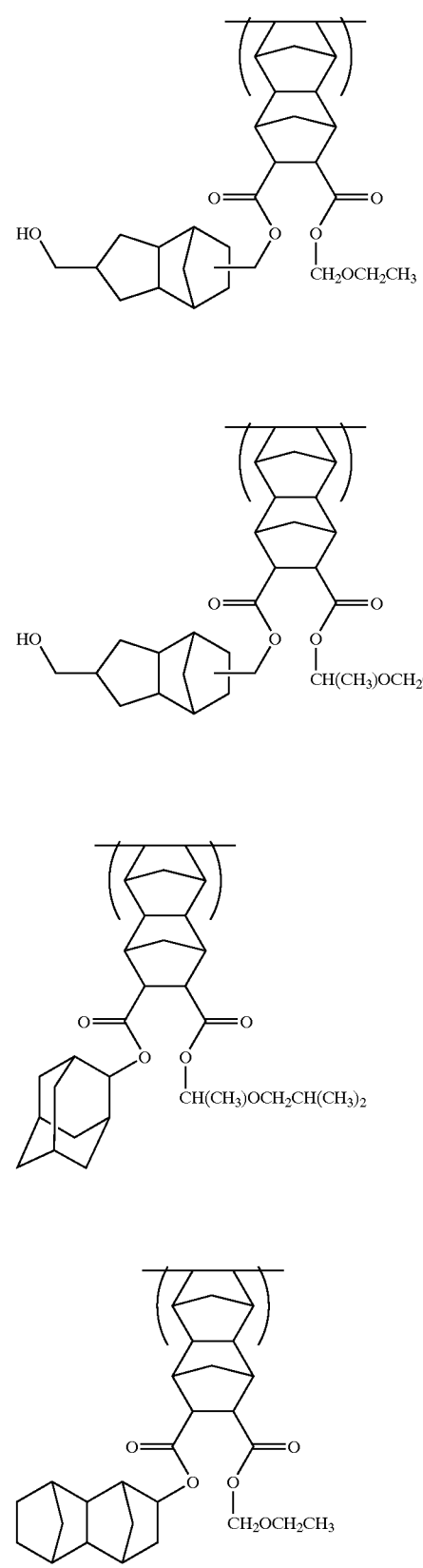

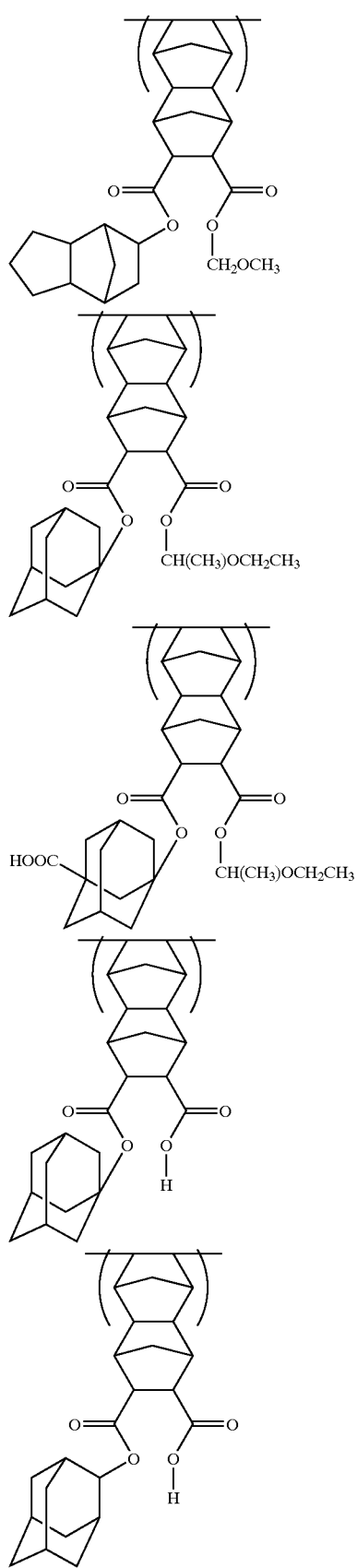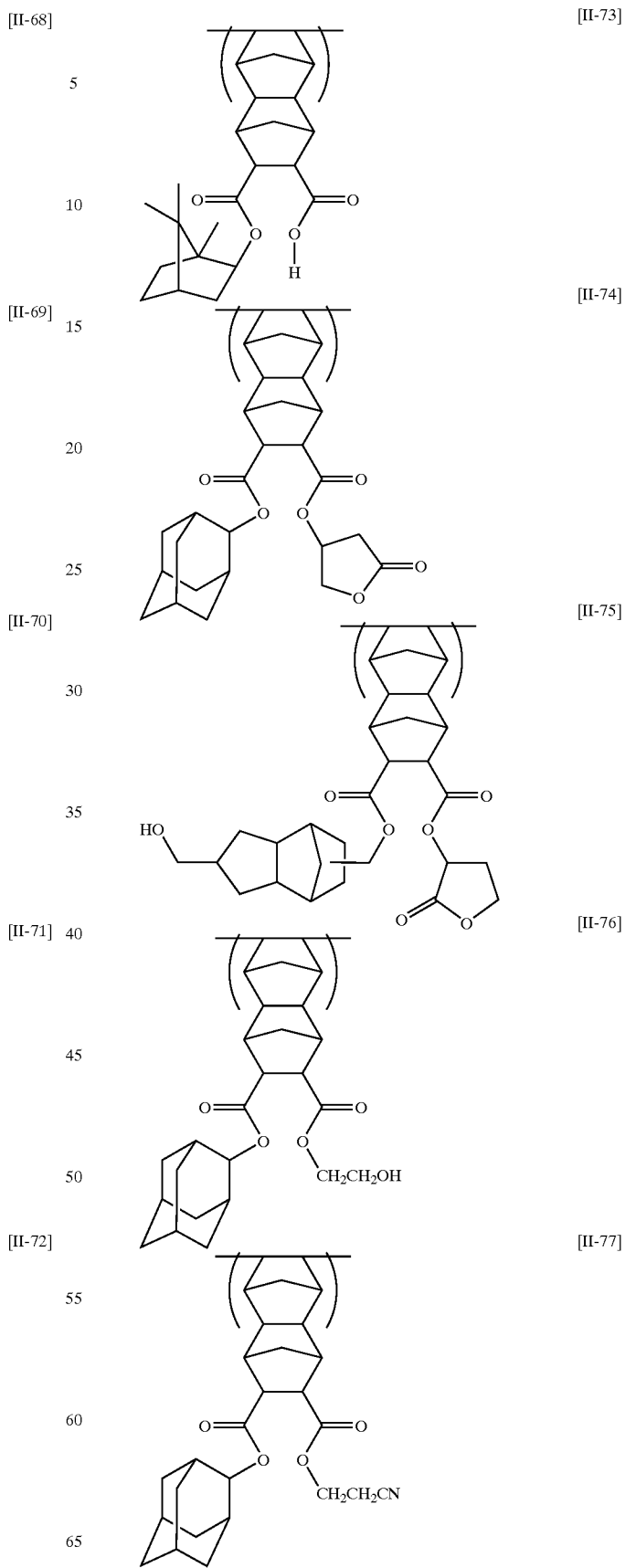

[II-78] 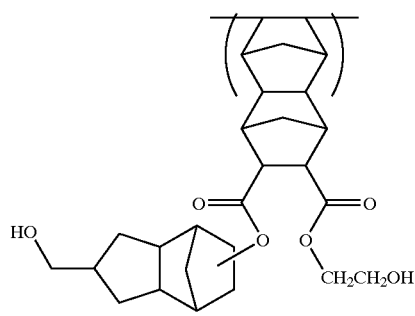
[II-79] 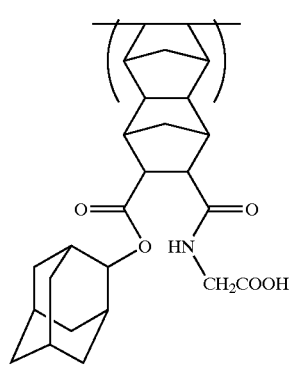
[II-80] 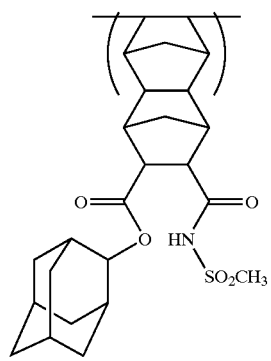
[II-81] 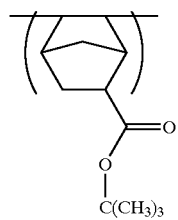
[II-82] 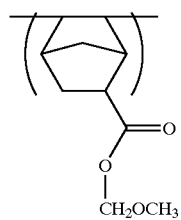
[II-83]
[II-84]
[II-85]
[II-86]
[II-87]
[II-88]

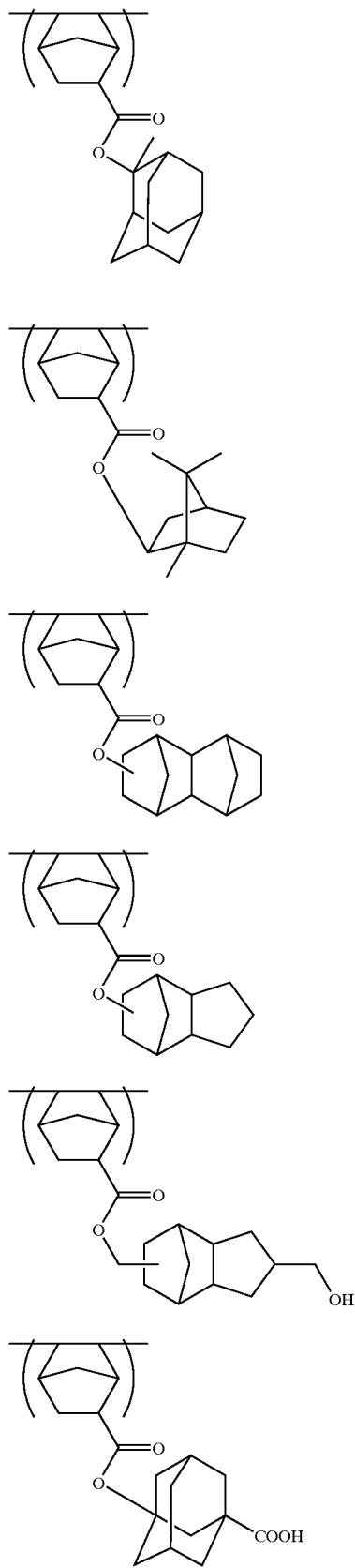
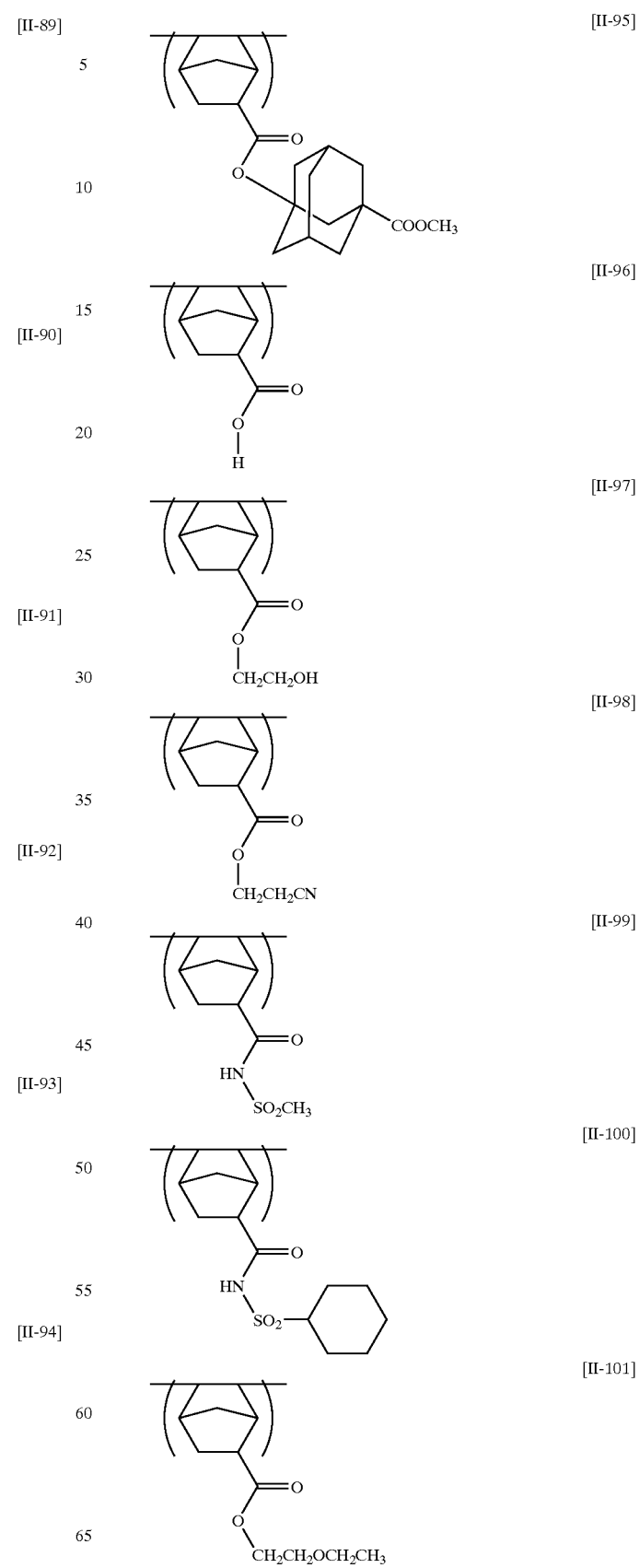

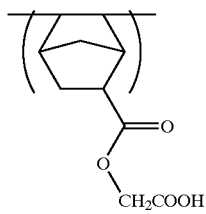
[II-102]
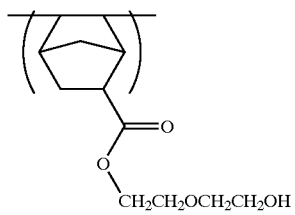
[II-103]
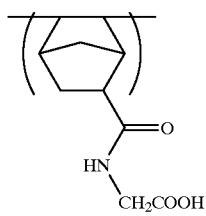
[II-104]
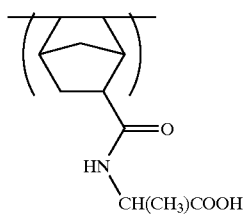
[II-105]
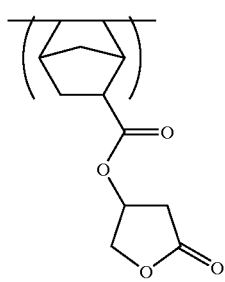
[II-106]
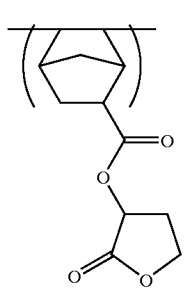
[II-107]
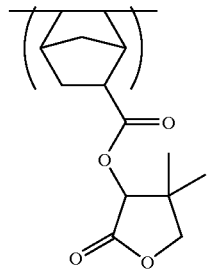
[II-108]
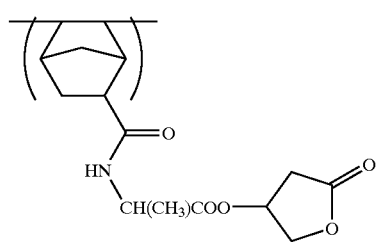
[II-109]
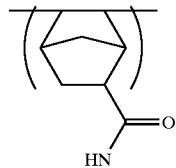
[II-110]
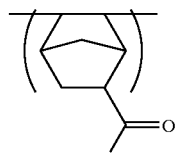
[II-111]
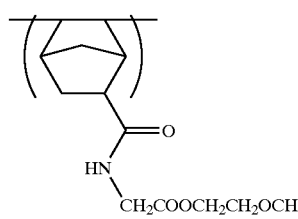
[II-112]
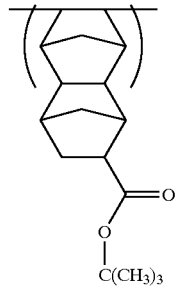
[II-113]

[II-114]
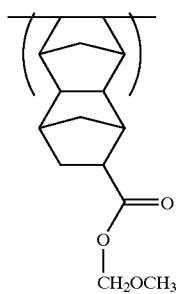
[II-115]
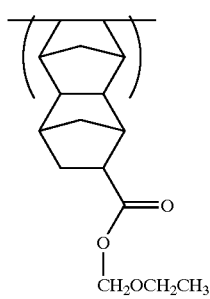
[II-116]
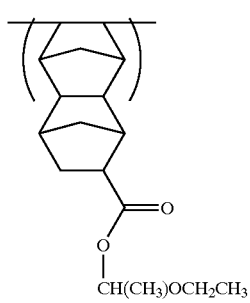
[II-117]
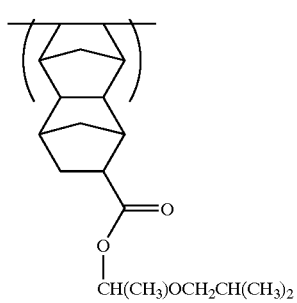
[II-118]
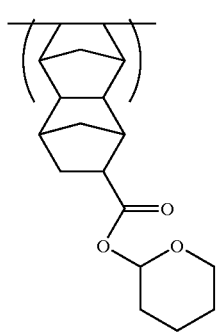
[II-119]
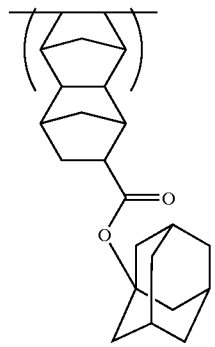
[II-120]
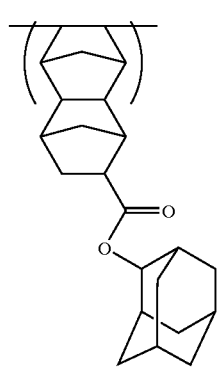
[II-121]
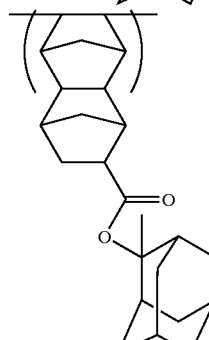
[II-122]
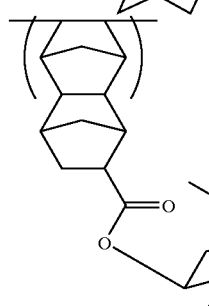
[II-123]
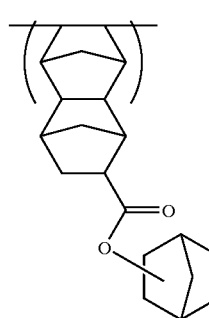

[II-124] 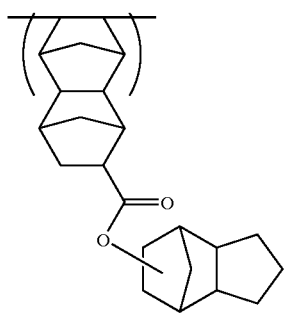
[II-125] 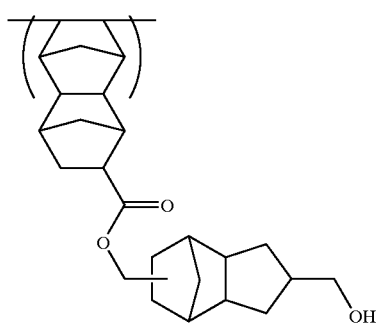
[II-126] 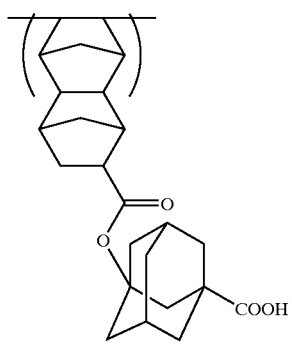
[II-127] 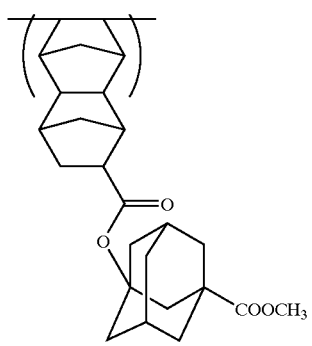
[II-128] 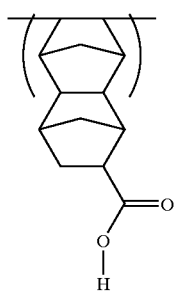
[II-129] 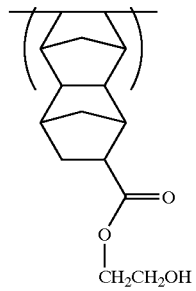
[II-130] 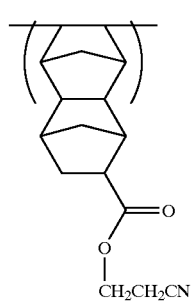
[II-131] 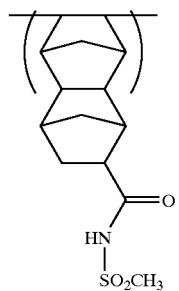
[II-132] 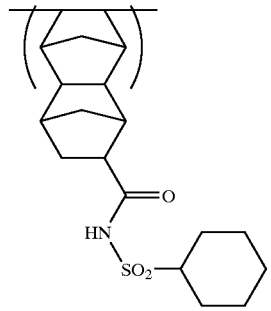
[II-133] 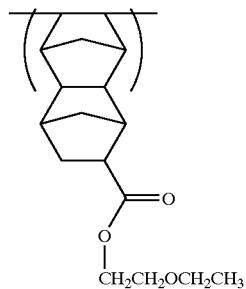

[II-134]
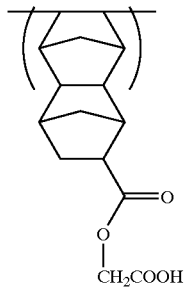
[II-135]
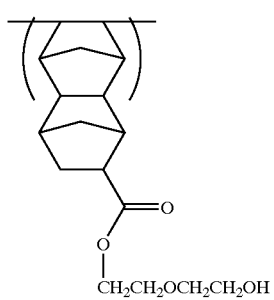
[II-136]
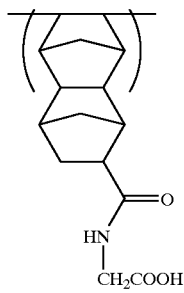
[II-137]
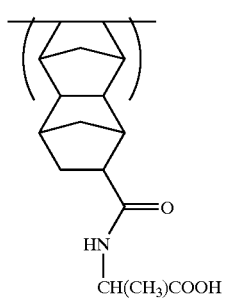
[II-138]
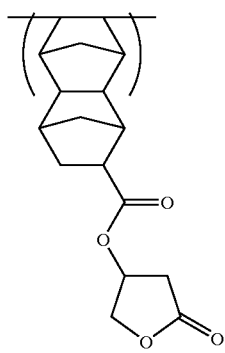
[II-139]
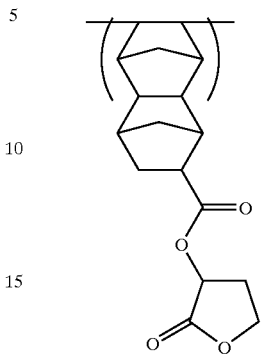
[II-140]
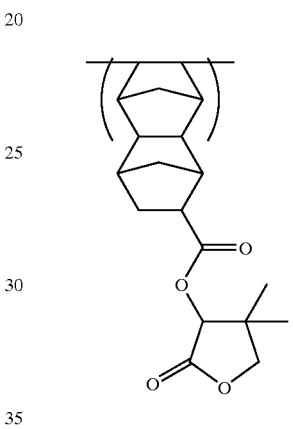
[II-141]
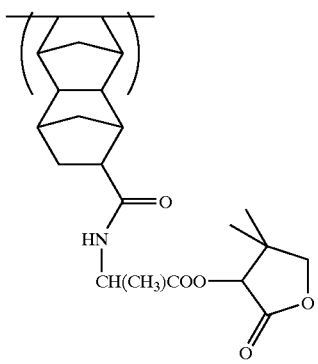
[II-142]
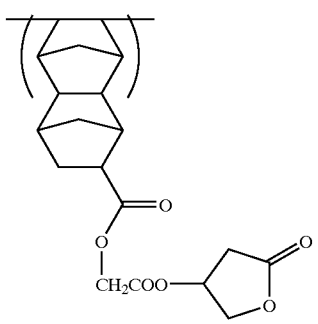

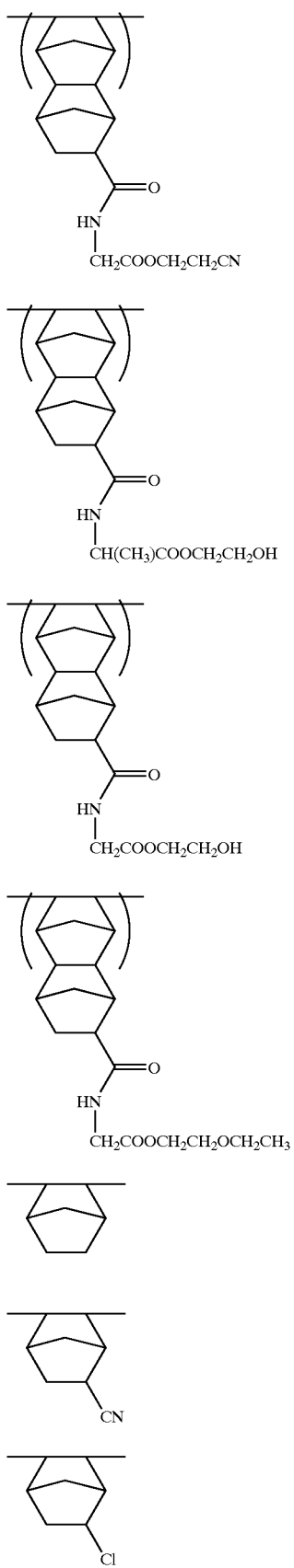
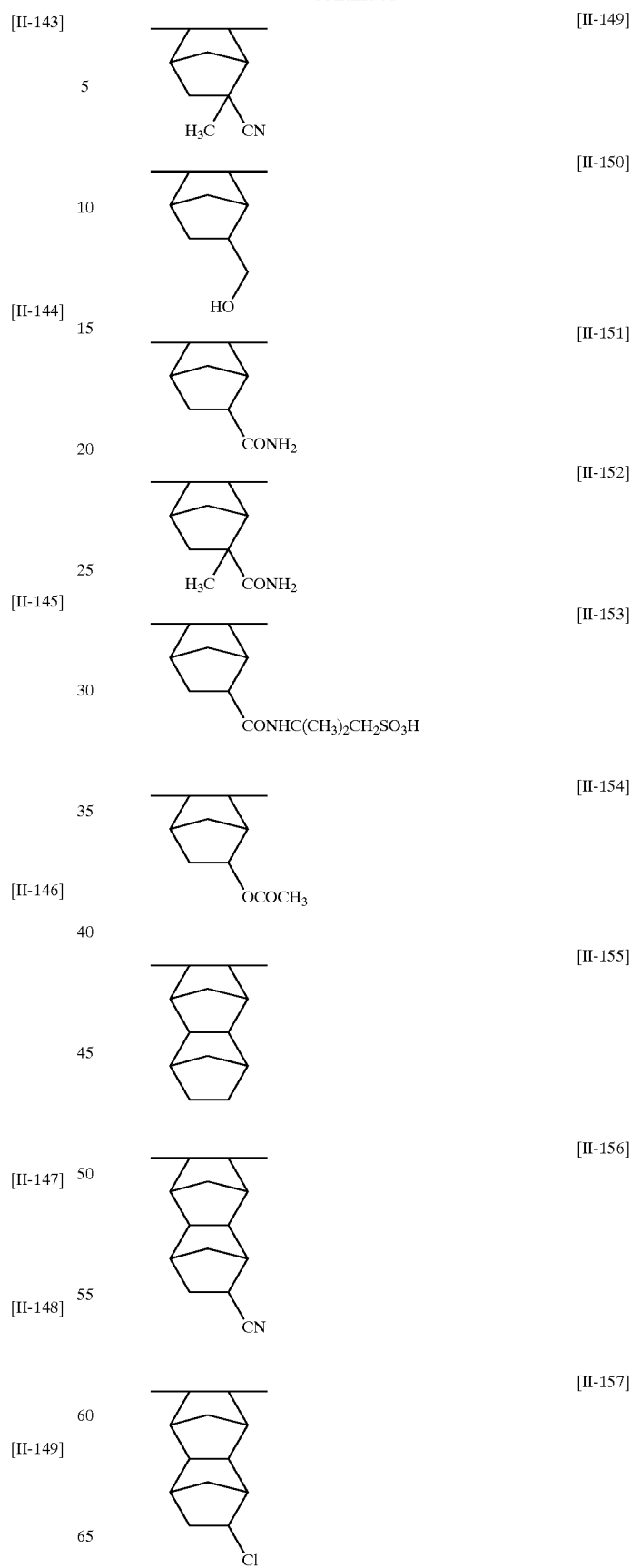

[II-158]
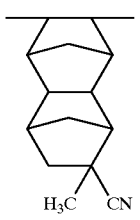

[II-159]
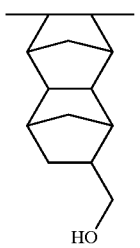

[II-160]
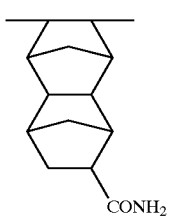

[II-161]
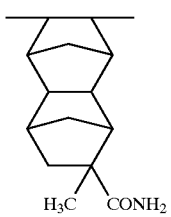

[II-162]
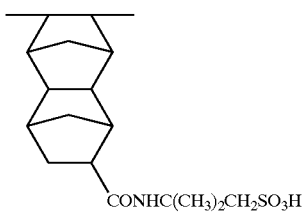

[II-163]
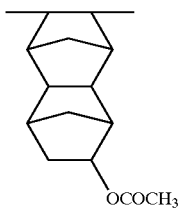

[II-164]
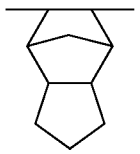

[II-165]
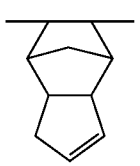

[II-166]
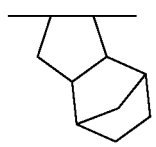

For the purpose of controlling the dry etching resistance, the suitability for the standard developer, the adhesion to a substrate, the resist profile and general requirements for the resist, such as resolution, heat resistance and sensitivity, the resin according to the present invention may be a copolymer containing a repeating unit of various monomers besides at least one of a repeating unit represented by the following formula (Ia) and a repeating unit represented by the following formula (Ib), a repeating unit represented by formula (II) in (including those represented by formulae (II-A) and (II-B)), and an acid-decomposable group.

Preferred examples of the copolymerization component include the repeating units represented by the following formulae (IV') and (V'):

[IV']
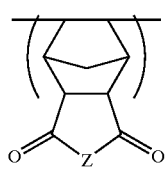

[V']
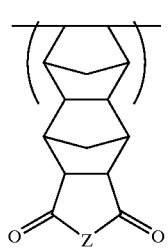

wherein Z represents oxygen atom, —NH—, —N(—$R_{50}$)—, —N(—$OSO_2R_{50}$)— and $R_{50}$ represents a (substituted) alkyl group or a (substituted) cyclic hydrocarbon group which are the same as described above.

Specific examples of the repeating units represented by formulae (IV') and (V') include the following compounds [IV'-9] to [IV'-16] and [V'-9] to [V'-16], however, the present invention is by no means limited thereto.

[IV'-9]
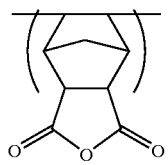

[IV'-10]
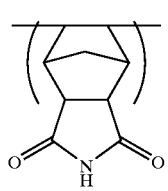

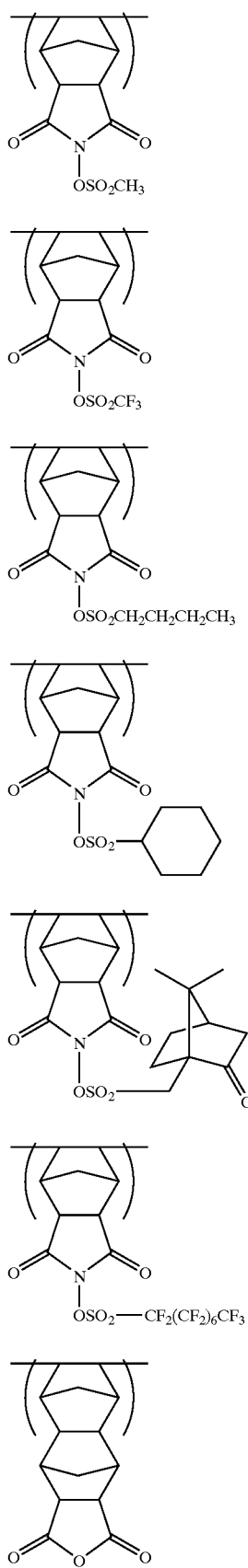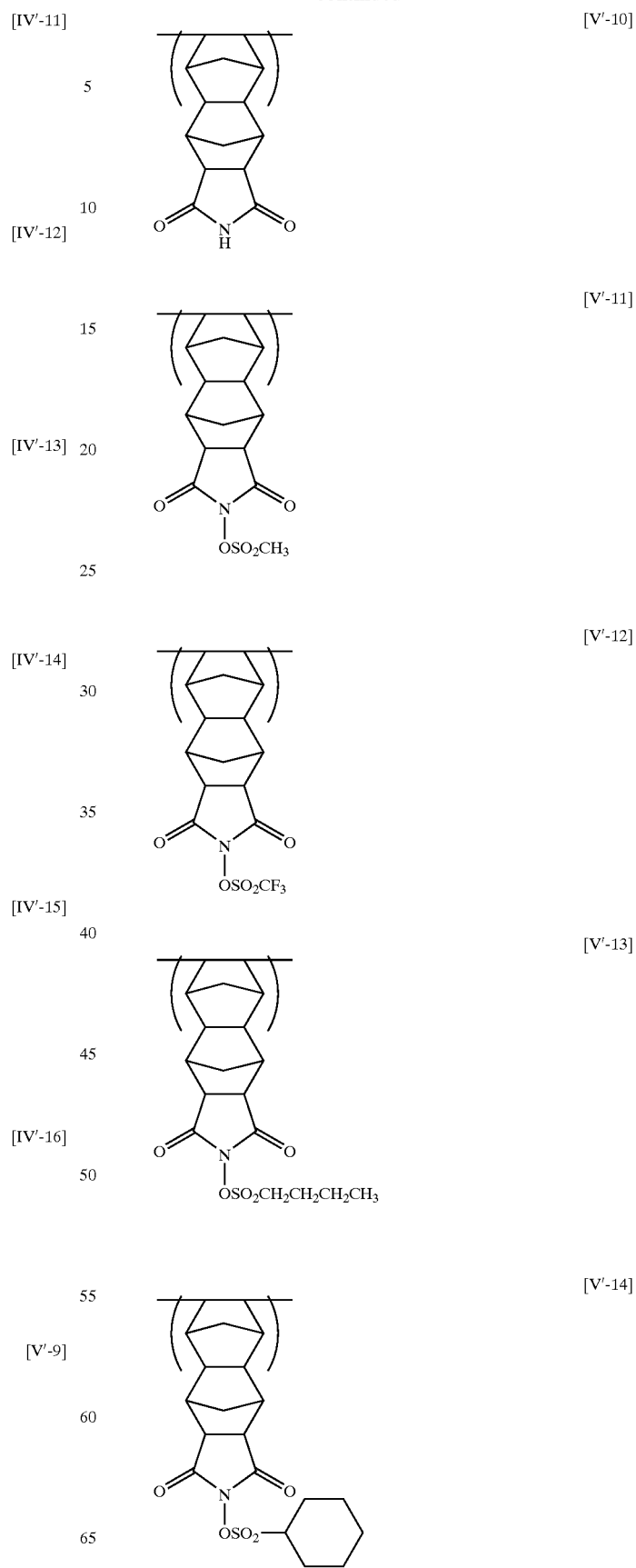

-continued

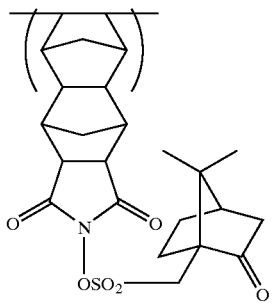
[V'-15]

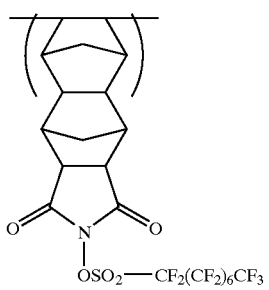
[V'-16]

In the resin according to the present invention, a monomer described below may be further copolymerized to give a repeating unit constituting the resin, within the range of allowing the effect of the present invention to be effectively brought out, however, the present invention is by no means limited to these monomers.

By virtue of the monomer copolymerized, the capabilities required for the resin, particularly (1) solubility in the coating solvent, (2) film-forming property (glass transition point), (3) alkali developability, (4) film reduction (selection of hydrophilicity/hydrophobicity or alkali solubility), (5) adhesion to a substrate in the unexposed area and (6) dry etching resistance, can be subtly controlled.

Examples of such copolymerization monomers include compounds having one addition-polymerizable unsaturated bond, selected from acrylic acid esters, methacrylic acid esters, acrylamides, methacrylamides, allyl compounds, vinyl ethers and vinyl esters.

Specific examples thereof include:

acrylic acid esters such as alkyl (preferably having from 1 to 10 carbon atoms) acrylates (e.g., methyl acrylate, ethyl acrylate, propyl acrylate, amyl acrylate, cyclohexyl acrylate, ethylhexyl acrylate, octyl acrylate, t-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol rmoncacrylate, benzyl acrylate, methoxybenzyl acrylate, furfuryl acrylate, tetrahydrofurfuryl acrylate);

methacrylic acid esters such as alkyl (preferably having from 1 to 10 carbon atoms) methacrylates (e.g., methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, furfuryl methacrylate, tetrahydrofurfuryl methacrylate);

acrylamides such as acrylamide, N-alkylacrylamides (where the alkyl group has from 1 to 10 carbon atoms, such as methyl group, ethyl group, propyl group, butyl group, t-butyl group, heptyl group, octyl group, cyclohexyl group and hydroxyethyl group), N,N-dialkylacrylamides (where the alkyl group has from 1 to 10 carbon atoms, such as methyl group, ethyl group, butyl group, isobutyl group, ethylhexyl group and cyclohexyl group), N-hydroxyethyl-N-methylacrylamide and N-2-acetamidoethyl-N-acetylacrylamide;

methacrylamides such as methacrylamide, N-alkylmethacrylamides (where the alkyl group has from 1 to 10 carbon atoms, such as methyl group, ethyl group, t-butyl group, ethylhexyl group, hydroxyethyl group and cyclohexyl group), N,N-dialkylmethacrylamides (where the alkyl group is an ethyl group, a propyl group or a butyl group), N-hydroxyethyl-N-methylmethacrylamide;

allyl compounds such as allyl esters (e.g., allyl acetate, allyl caproate, allyl caprate, allyl laurate, allyl palmitate, allyl stearate, allyl benzoate, allyl acetoacetate, allyl lactate) and allyloxy ethanol;

vinyl ethers such as alkyl vinyl ethers (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethyl butyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, tetrahydrofurfuryl vinyl ether);

vinyl esters such as vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl acetoacetate, vinyl lactate, vinyl-β-phenyl butyrate, vinyl chlorohexylcarboxylate;

dialkyl itaconates (e.g., dimethyl itaconate, diethyl itaconate, dibutyl itaconate);

acrylic acid, methacrylic acid, crotonic acid, itaconic acid, acrylonitrile and methacrylonitrile.

In the resin according to the present invention, the content of the repeating unit represented by formula (Ia) and/or formula (Ib) and the content of the repeating unit represented by formula (II) (including formulae (II-A) and (II-B)) may be appropriately selected by taking account of objective properties of the resist, such as dry etching resistance, sensitivity, inhibition of pattern cracking, adhesion to a substrate and resist profile, and general requirements for the resist, such as resolution and heat resistance. In the resin according to the present invention, the content of the repeating unit represented by formula (Ia) and/or formula (Ib) and the content of the repeating unit represented by formula (II) each is generally 25 mol % or more, preferably 30 mol % or more, more preferably 35 mol % or more, in all monomer repeating units of the resin.

In the resin according to the present invention, the content of the repeating unit (formula (IV') or (V')) derived from the preferred copolymerization monomer can also be appropriately determined according to the objective performance of the resist, however, it is in general preferably 99 mol % or less, more preferably 90 mol % or less, still more preferably 80 mol % or less, based on the total molar number obtained by summing up the repeating unit represented by formula (Ia) and/or formula (Ib) and the repeating unit represented by formula (II).

In the resin, the content of the repeating unit based on the monomer as still another copolymerization component may also be appropriately determined according to the objective performance of the resist, however, it is in general preferably 99 mol % or less, more preferably 90 mol % or less, still more preferably 80 mol % or less, based on the total molar number obtained by summing up the repeating unit represented by formula (Ia) and/or formula (Ib) and the repeating unit represented by formula (II) If the amount of the repeating unit based on the monomer as still another copolymerization component exceeds 99 mol %, the effect of the present invention may not be disadvantageously brought out as expected.

In the resin according to the present invention, the group capable of decomposing by the action of an acid may be contained in any one of the repeating unit represented by formula (Ia) and/or formula (Ib), the repeating unit represented by formula (II), and the repeating unit based on the monomer as the copolymerization component, however, the content of the repeating unit containing the group capable of decomposing by the action of an acid is suitably from 8 to 60 mol %, preferably from 10 to 55 mol %, more preferably from 12 to 50 mol %, based on all repeating units in the resin.

The resin according to the present invention can also be synthesized by copolymerizing a monomer corresponding to the repeating unit represented by formula (II), a maleic acid anhydride and in the case of using a copolymerization monomer, a monomer as the copolymerization component in the presence of a polymerization catalyst, causing open-ring esterification or hydrolysis of the repeating unit derived from the maleic acid anhydride in the copolymer using an alcohol under basic or acidic conditions, and replacing the carboxylic acid site produced by a desired substituent.

The resin according to the present invention preferably has a weight average molecular weight of from 1,000 to 200,000 (in terms of a polystyrene standard by GPC method). If the weight average molecular weight is less than 1,000, the heat resistance or dry etching resistance may deteriorate, whereas if it exceeds 200,000, the developability may deteriorate or due to the extremely high viscosity, the film-forming property may deteriorate.

In the positive photoresist composition for far ultraviolet exposure of the present invention, the amount of the resin according to the present invention mixed in the entire composition is preferably from 40 to 99.99 wt %, more preferably from 50 to 99.97 wt %, based on all solid contents of the photoresist composition.

(C) Compound Capable of Decomposing by the Action of Acid to Generate Sulfonic Acid (Hereinafter Referred to as a "Sulfonic Acid-generating Compound")

In the present invention, the sulfonic acid-generating compound is stable in the absence of an acid but by the action of an acid generated from the photo-acid generator upon exposure, decomposes to produce a sulfonic acid. The acid produced from the sulfonic acid-generating compound preferably has a large acid strength, more specifically, the dissociation constant (pKa) of the acid is preferably 3 or less, more preferably 2 or less.

The acid generated from the sulfonic acid-generating compound is preferably a sulfonic acid having an alkyl group, a cyclic alkyl group, an aryl group or an aralkyl group. The sulfonic acid-generating compound is preferably a compound represented by any one of the following formulae (1) to (5):

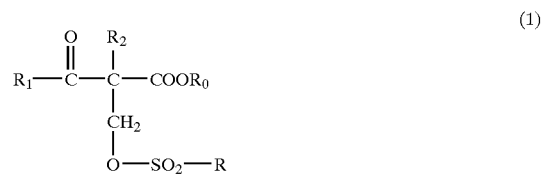

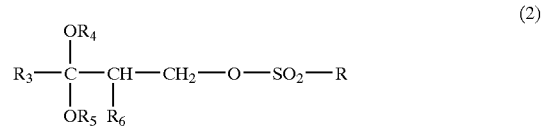

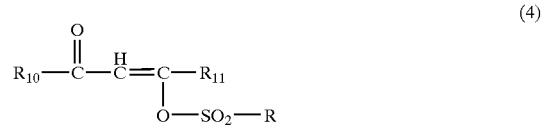

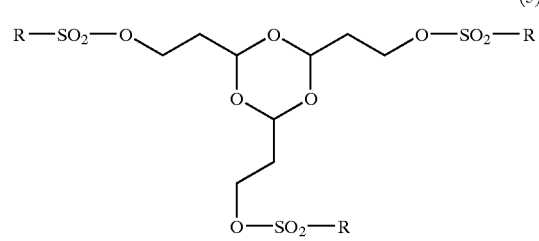

wherein

R represents an alkyl group, a cyclic alkyl group, an aryl group or an aralkyl group, $R_0$ represents a group constituting as —COOR$_0$ the group capable of decomposing by the action of an acid, $R_1$ represents an alkyl group, a cyclic alkyl group, an aryl group, an aralkyl group, an alkoxy group or an aryloxy group, $R_2$ represents an alkyl group or an aralkyl group, $R_3$ represents an alkyl group, a cyclic alkyl group, an aryl group or an aralkyl group, $R_4$ and $R_5$ each independently represents an alkyl group and $R_4$ and $R_5$ may be combined with each other to form a ring, $R_6$ represents hydrogen atom or an alkyl group, $R_7$ represents hydrogen atom, an alkyl group, a cyclic alkyl group, an aryl group or an aralkyl group, $R_8$ represents an alkyl group, a cyclic alkyl group, an aryl group or an aralkyl group, $R_9$ represents hydrogen atom, an alkyl group, a cyclic alkyl group, an aryl group or an aralkyl group, provided that $R_9$ and $R_7$ may be combined with each other to form a ring, $R_{10}$ represents an alkyl group, a cyclic alkyl group, an alkoxy group, an aryl group, an aralkyl group, an aryloxy group or an alkenyloxy group, and $R_{11}$ represents an alkyl group, a cyclic alkyl group, an alkoxy group, an aryl group, an aralkyl group, an aryloxy group or an alkenyl group, provided that $R_{10}$ and $R_{11}$ may be combined with each other to form a ring.

In formulae (1) to (5), the alkyl group includes an alkyl group having from 1 to 8 carbon atoms and specific examples thereof include a methyl group, an ethyl group, a propyl group, an isopropyl group, a butyl group and an octyl group.

The cyclic alkyl group includes a cyclic alkyl group having from 4 to 10 carbon atoms and specific examples thereof include a cyclopropyl group, a cyclopentyl group, a cyclohexyl group, a cycloheptyl group, an adamantyl group, a boxonyl group, an isoboronyl group, a tricyclodecanyl group, a dicyclopentenyl group, a nobornane epoxy group, a menthyl group, an isomenthyl group, a neomenthyl group and a tetracyclododecanyl group.

The aryl group includes an aryl group having from 6 to 14 carbon atoms and specific examples thereof include a phenyl group, a naphthyl group and a tolyl group.

The aralkyl group includes an aralkyl group having from 7 to 20 carbon atoms and specific examples thereof include a benzyl group, a phenethyl group and a naphthylethyl group.

The alkoxy group include an alkoxy group having from 1 to 8 carbon atoms and specific examples thereof include a methoxy group, an ethoxy group, a propoxy group and a butoxy group.

The alkenyl group includes an alkenyl group having from 2 to 6 carbon atoms and specific examples thereof include a vinyl group, a propenyl group, an allyl group, a butenyl group, a pentenyl group, a hexenyl group and a cyclohexenyl group.

The aryloxy group includes an aryloxy group having from 6 to 14 carbon atoms and specific examples thereof include a phenoxy group and a naphthoxy group.

The alkenyloxy group includes an alkenylxoy group having from 2 to 8 carbon atoms and specific examples thereof include a vinyloxy group and an allyloxy group.

These substituents each may further have a substituent and examples of the substituent include a halogen atom such as Cl, Br and F, a —CN group, a —OH group, an alkyl group having from 1 to 4 carbon atoms, a cycloalkyl group having from 3 to 8 carbon atoms, an alkoxy group having from 1 to 4 carbon atoms, an acylamino group such as acetylamino group, an aralkyl group such as benzyl group and phenethyl group, an aryloxyalkyl group such as phenoxyethyl group, an alkoxycarbonyl group having from 2 to 5 carbon atoms, and an acyloxy group having from 2 to 5 carbon atoms. However, the scope of the substituent is not limited thereto.

Examples of the ring formed by the combination of $R_4$ and $R_5$ include a 1,3-dioxolane ring and 1,3-dioxane ring.

Examples of the ring formed by the combination of $R_7$ and $R_9$ include a cyclopentyl ring and a cylohexyl ring.

Examples of the ring formed by the combination of $R_{10}$ and $R_{11}$ include a 3-oxocyclohexenyl ring and a 3-oxoindenyl ring, which each may contain oxygen atom in the ring.

Examples of the acid-decomposable group include those where $R_0$ is a tertiary alkyl group such as t-butyl group and t-amyl group, an isoboronyl group, a 1-alkoxyethyl group such as 1-ethoxyethyl group, 1-butoxyethyl group, 1-isobutoxyethyl group and 1-cyclohexyloxyethyl group, an alkoxymethyl group such as 1-methoxymethyl group and 1-ethoxymethyl group, a tetrahydropyranyl group, a tetrahydrofuranyl group, a trialkylsilyl group or a 3-oxocyclohexyl group.

Preferred examples of R, $R_0$ and $R_1$ to $R_{11}$ are described below.

R: a methyl group, an ethyl group, a propyl group, a butyl group, an octyl group, a trifluoromethyl group, a nonafluorobutyl group, a heptadecafluorooctyl group, a in 2,2,2-trifluoroethyl group, a phenyl group, a pentafluorophenyl group, a methoxyphenyl group, a toluyl group, a mesityl group, a fluorophenyl group, a naphthyl group, a cyclohexyl group and a camphor group, $R_0$: a t-butyl group, a methoxymethyl group, an ethoxymethyl group, a 1-ethoxyethyl group and a tetrahydropyranyl group, $R_1$: a methyl group, an ethyl group, a propyl group, a cyclopropyl group, a cyclopentyl group, a cyclohexyl group, a phenyl group, a naphthyl group, a benzyl group, a phenethyl group, a methoxy group, an ethoxy group, a propoxy group, a phenoxy group and a naphthoxy group, $R_2$: a methyl group, an ethyl group, a propyl group, a butyl group and a benzyl group, $R_3$: a methyl group, an ethyl group, a propyl group, a cyclopropyl group, a cyclopentyl group, a cyclohexyl group, a phenyl group, a naphthyl group, a benzyl group, a phenethyl group and a naphthylmethyl group, $R_4$, $R_5$: a methyl group, an ethyl group and a propyl group, and when combined with each other, an ethylene group and a propylene group, $R_6$: hydrogen atom, a methyl group and an ethyl group, $R_7$, $R_9$: hydrogen atom, a methyl group, an ethyl group, a propyl group, a butyl group, a pentyl group, a cyclopropyl group, a cyclopentyl group, a cyclohexyl group, a phenyl group, a naphthyl group, a benzyl group and a phenethyl group, and when combined with each other, a cyclopentyl ring and a cyclohexyl ring, $R_8$: a methyl group, an ethyl group, an isopropyl group, a t-butyl group, a neopentyl group, a cyclohexyl group, a phenyl group and a benzyl group, $R_{10}$: a methyl group, an ethyl group, a propyl group, an isopropyl group, a butyl group, an isobutyl group, a cyclopropyl group, a cyclopentyl group, a cyclohexyl group, a methoxy group, an ethoxy group, a phenyl group, a naphthyl group, a benzyl group, a phenoxy group, a naphthoxy group, a vinyloxy group and a methylvinyloxy group, and when combined with $R_{11}$, a 3-oxocyclohexenyl ring and a 3-oxoindenyl ring, which each may contain oxygen atom, and $R_{11}$: a methyl group, an ethyl group, a propyl group, an isopropyl group, a butyl group, an isobutyl group, a cyclopropyl group, a cyclopentyl group, a cyclohexyl group, a methoxy group, an ethoxy group, a phenyl group, a naphthyl group, a benzyl group, a phenoxy group, a naphthoxy group, a vinyl group and an allyl group, and when combined with $R_{10}$, a 3-oxocyclohexenyl ring and a 3-oxoindenyl ring, which each may contain oxygen atom.

Specific examples of the compounds represented by formulae (1) to (5) are set forth below, however, the present invention is by no means limited thereto.

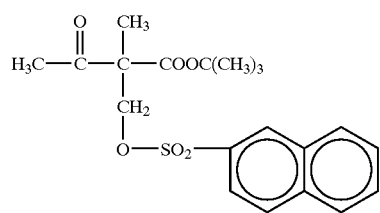 (1-1)
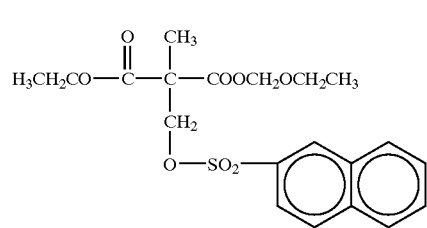 (1-2)
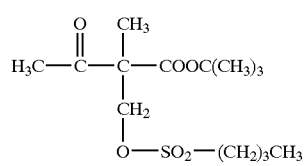 (1-3)
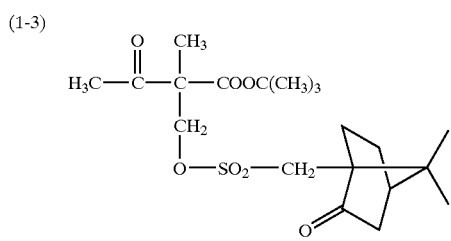 (1-4)
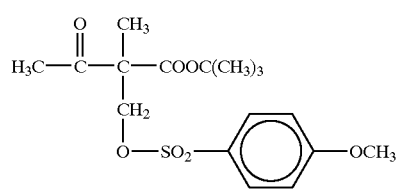 (1-5)
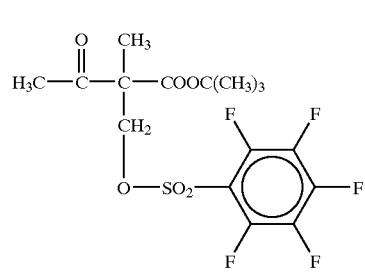 (1-6)
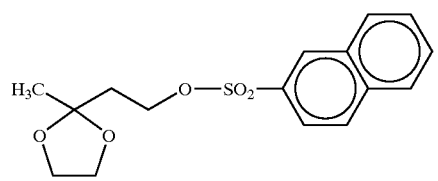 (2-1)
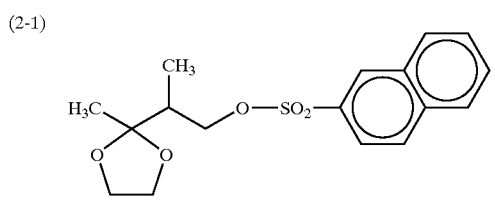 (2-2)
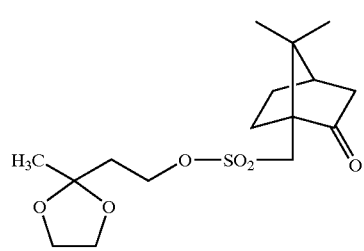 (2-3)
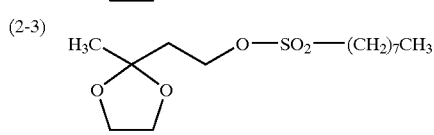 (2-4)
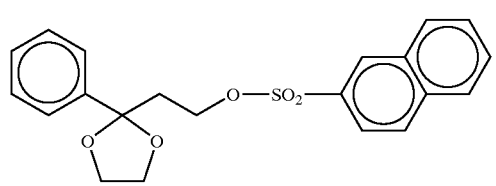 (2-5)
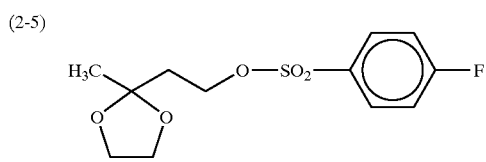 (2-6)
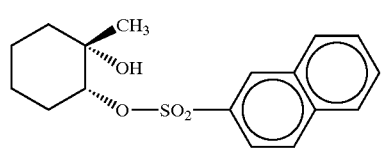 (3-1)
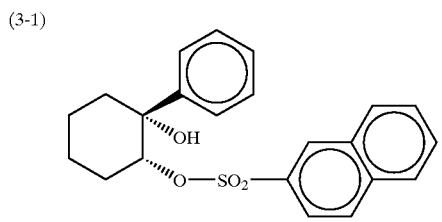 (3-2)

-continued
(3-3)
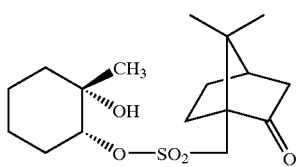
(3-4)
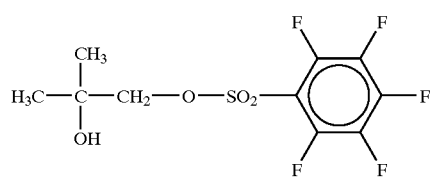
(3-5)
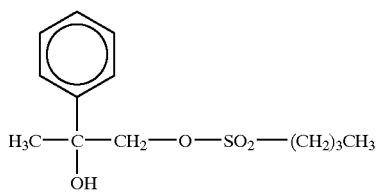
(3-6)
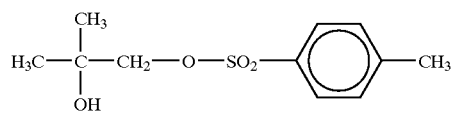
(4-1)
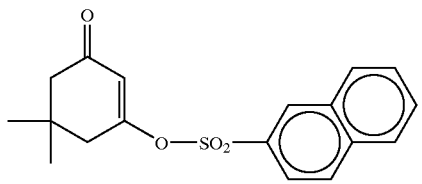
(4-2)
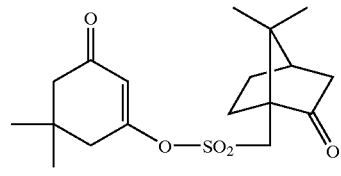
(4-3)
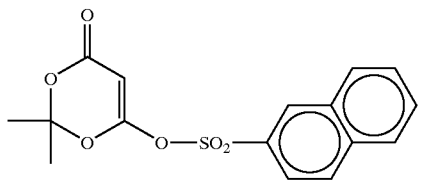
(4-4)
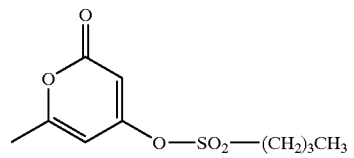
(4-5)
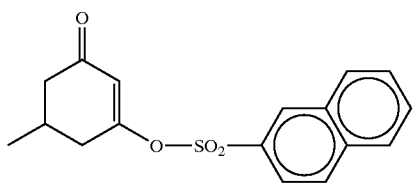
(4-6)
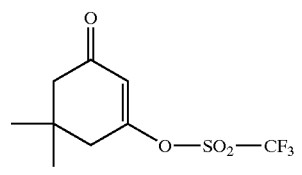
(4-7)
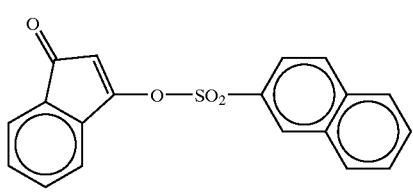
(5-1)
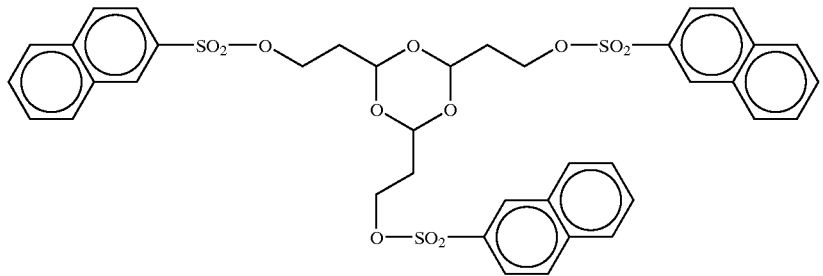

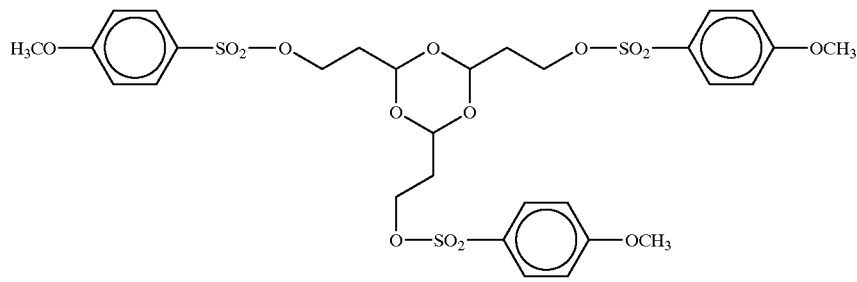
(5-2)

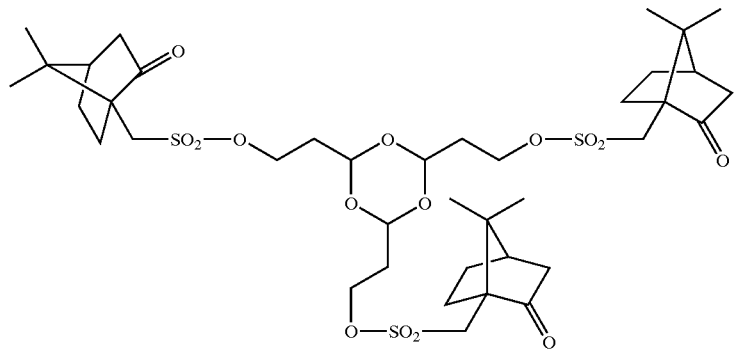
(5-3)

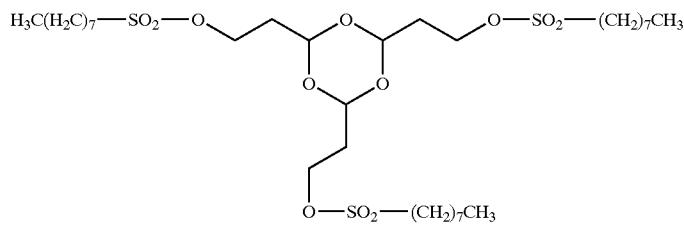
(5-4)

In the present invention, the sulfonic acid-generating compound is preferably a compound represented by formula (4). In the present invention the amount of the sulfonic acid-generating compound added in the composition is preferably from 0.01 to 10 wt %, more preferably from 0.05 to 5 wt %, based on all solid contents of the composition.

The positive photoresist composition for far ultraviolet exposure according to the second aspect of the present invention contains (D) a fluorine-type and/or silicon-type surface active agent.

The fluorine-type and/or silicon-type surface active agent is at least one surface active agent selected from a fluorine-type surface active agent, a silicon-type surface active agent and a surface active agent containing both fluorine atom and silicon atom. When the positive photoresist composition for far ultraviolet exposure of the present invention contains the acid-decomposable resin and the specific surface active agent, the resist pattern obtained using an exposure light source of 250 nm or less, preferably 220 nm or less, can have excellent properties in the sensitivity, resolution, adhesion to a substrate and dry etching resistance, and at the same time, can be reduced in the development defect and scum.

Examples of the surface active agent include surface active agents described in JP-A-62-36663, JP-A-61-226746, JP-A-61-226745, JP-A-62-170950, JP-A-63-34540, JP-A-7-230165, JP-A-8-62834, JP-A-9-54432 and JP-A-9-5988, U.S. Pat. Nos. 5,405,720; 5,360,692, 5,529,881, 5,296,330, 5,436,098, 5,576,143, 5,294,511, and 5,824,451. Also, the commercially available surface active agents described below each may be used as it is. Examples of the commercially available surface active agents which can be used include fluorine-type surface active agents and silicon-type surface active agents, such as Eftop EF301 and EF303 (produced by Shin Akita Kasei K.K.), Florad FC430 and 431 (produced by Sumitomo 3M K.K.), Megafac F171, F173, F176, F189 and ROB (produced by Dainippon Ink & Chemicals, Inc.), and Surflon S-382, SC101, 102, 103, 104, 105 and 106 (produced by Asahi Glass Company, Ltd.). In addition, ad polysiloxane polymer KP-341 (produced by Shin-Etsu Chemical Co., Ltd.) may be used as a silicon-type surface active agent.

The amount of the surface active agent blended is usually from 0.001 to 2 wt %, preferably from 0.01 to 1 wt %, based on the solid content in the composition of the present invention. The above-described surface active agents may be used either individually or in combination of two or more thereof.

Specific examples of the other surface active agent include, as nonionic surfactants, polyoxyethylene alkyl ethers such as polyoxyethylene lauryl ether, polyoxyethylene stearyl ether, polyoxyethylene cetyl ether and polyoxyethylene oleyl ether; polyoxyethylene alkyl aryl ethers such as polyoxyethylene octyl phenol ether and polyoxyethylene nonyl phenol ether; polyoxyethylene/polyoxypropylene block copolymers; sorbitan fatty acid esters such as sorbitan monolaurate, sorbitan monopalmitate, sorbitan monostearate, sorbitan monooleate, sorbitan trioleate and sorbitan tristearate; polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate. The amount of the surface active agent blended is usually 2 wt % or less, preferably 1 wt % or less, per 100 parts by weight of the total solid contents of the composition of the present invention. These surface active agents may be used either individually or in combination.

The organic basic compound which can be used in the present invention is preferably a compound having stronger basicity than that of phenol. In particular, a nitrogen-containing basic compound is preferred.

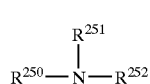
(A)

wherein $R^{250}$, $R^{251}$ and $R^{252}$, which may be the same or different, each represents hydrogen atom, an alkyl group having from 1 to 6 carbon atoms, an aminoalkyl group having from 1 to 6 carbon atoms, a hydroxyalkyl group having from 1 to 6 carbon atoms or a substituted or unsubstituted aryl group having from 6 to 20 carbon atoms, provided that $R^{251}$ and $R^{252}$ may be combined with each other to form a ring.

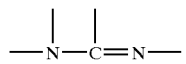
(B)

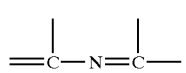
(C)

(D)

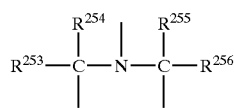
(E)

(wherein $R^{253}$, $R^{254}$, $R^{255}$ and $R^{256}$, which may be the same or different, each represents an alkyl group having from 1 to 6 carbon atoms).

The compound is more preferably a nitrogen-containing basic compound having two or more nitrogen atoms different in the chemical environment within one molecule, still more preferably a compound having both a substituted or unsubstituted amino group and a ring structure containing nitrogen atom, or a compound having an alkylamino group. Specific preferred examples thereof include substituted or unsubstituted guanidine, substituted or unsubstituted aminopyridine, substituted or unsubstituted aminoalkylpyridine, substituted or unsubstituted aminopyrrolidine, substituted or unsubstituted indazole, substituted or unsubstituted pyrazole, substituted or unsubstituted pyrazine, substituted or unsubstituted pyrimidine, substituted or unsubstituted purine, substituted or unsubstituted imidazoline, substituted or unsubstituted pyrazoline, substituted or unsubstituted piperazine, substituted or unsubstituted aminomorpholine and substituted or unsubstituted aminoalkylmorpholine. Preferred examples of the substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group and a cyano group.

Preferred examples of specific compounds include guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, N-(2-aminoethyl)morpholine, 1,5-diazabicyclo[4,3,0]non-5-ene, 1,8-diazabicyclo[5,4,0]undec-7-ene, 2,4,5-triphenylimidazole, N-methylmorpholine, N-ethylmorpholine, N-hydroxyethylmorpholine, N-benzylmorpholine, tertiary morpholine derivatives such as cyclohexyl-morpholinoethylthiourea (CHMETU), and hindered amines described in JP-A-11-52575 (for example, those described in [0005]), however, the present invention is by no means limited thereto.

More preferred examples of specific compounds include 1,5-diazabicyclo[4.3.0]-5-nonene, 1,8-diazabicyclo[5.4.0]-7-undecene, 1,4-diazabicyclo[2.2.2]octane, 4-dimethylaminopyridine, hexamethylenetetramine, 4,4-dimethylimidazoline, pyrroles, pyrazoles, imidazoles, pyridazines, pyrimidines, tertiary morpholines such as CHMETU, and hindered amines such as bis(1,2,2,6,6-pentamethyl-4-pyperidyl)sebacate. By using such a compound, excellent defocus latitude depended on line pitch can be obtained.

Among these compounds, 1,5-diazabicyclo[4,3,0]non-5-ene, 1,8-diazabicyclo[5,4,0]undec-7-ene, 1,4-diazabicyclo[2,2,2]octane, 4-dimethylaminopyridine, hexamethylenetetramine, CHMETU and bis(1,2,2,6,6-pentamethyl-4-piperidyl)sebacate are preferred.

These nitrogen-containing basic compounds may be used either individually or in combination of two or more thereof. The amount of the nitrogen-containing basic compound used is usually from 0.001 to 10 wt %, preferably from 0.01 to 5 wt %, based on the solid content of the entire composition of the photosensitive resin composition. If the amount used is less than 0.001 wt %, the effect by the addition of the nitrogen-containing basic compound may not be obtained, whereas if it exceeds 10 wt %, the sensitivity is liable to decrease or the developability in the non-exposed area is readily deteriorated.

The positive photoresist composition of the present invention may additionally contain, if desired, an acid-decomposable dissolution-inhibiting compound, a dye, a plasticizer, a sensitizer, a compound capable of accelerating solubility in the developer, and the like.

The photosensitive composition of the present invention is coated on a support after dissolving the above-described components in a solvent. The solvent used here is preferably ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone or tetrahydrofurane. These solvents may be used individually or in combination.

Among these solvents, preferred are 2-heptanone, γ-butyrolactone, ethylene glycol monomethyl ether, ethylene glycol monoethyl ether, ethylene glycol monoethyl ether acetate, propylene glycol monomethyl ether, propylene glycol monoethyl ether, methyl lactate, ethyl lactate, methyl methoxypropionate, ethyl ethoxypropionate, N-methylpyrrolidone and tetrahydrofurane.

In the third aspect of the present invention, the positive photoresist composition for far ultraviolet exposure is coated on a support after dissolving the above-described components in (E) a mixed solvent.

As the mixed solvent (E), a mixed solvent containing (1) at least one selected from the group consisting of butyl acetate and propylene glycol monoalkyl ether carboxylate (hereinafter sometimes referred to as "Solvent (1)") and (2) at least one selected from the group consisting of ethyl lactate and propylene glycol monoalkyl ether (hereinafter sometimes referred to as "Solvent (2)") is used.

Preferred examples of the propylene glycol monoalkyl ether carboxylate include propylene glycol monomethyl ether acetate, propylene glycol monomethyl ether propionate, propylene glycol monoethyl ether acetate, propylene glycol monoethyl ether propionate, propylene glycol monopropyl ether acetate and propylene glycol monopropyl ether propionate. Among these, more preferred are propylene glycol monomethyl ether acetate and propylene glycol monomethyl ether propionate.

Preferred examples of the propylene glycol monoalkyl ether include propylene glycol monomethyl ether, propylene glycol monoethyl ether and propylene glycol monopropyl ether. Among these, more preferred are propylene glycol monomethyl ether and propylene glycol monoethyl ether.

In the present invention, the solvent preferably contains (3) at least one solvent selected from the group consisting of γ-butyrolactone, ethylene carbonate and propylene carbonate (hereinafter sometimes referred to as "Solvent (3)").

The weight ratio [(1):(2)] between Solvent (1) and Solvent (2) used is generally from 90:10 to 15:85, preferably from 80:20 to 20:80, more preferably from 70:30 to 25:75.

The weight ratio of Solvent (3) used is generally from 0.1 to 20%, preferably from 0.5 to 15%, based on the weight of all solvents.

Preferred examples of the combination of solvents for use in the present invention include propylene glycol monomethyl ether acetate/ethyl lactate, propylene glycol monomethyl ether acetate/propylene glycol monomethyl ether, propylene glycol monomethyl ether acetate/propylene glycol monoethyl ether, propylene glycol monomethyl ether is propionate/ethyl lactate, and butyl acetate/ethyl lactate. These combinations with the addition of Solvent (3) are more preferred.

All the solid contents such as the photo-acid generator (A) and the resin (B) are preferably dissolved in the solvent to provide a solid concentration of from 3 to 25 wt %, more preferably from 5 to 22 wt %, still more preferably from 7 to 20 wt %.

The thus-prepared positive resist composition of the present invention is coated on a substrate to form a thin film. The coated film preferably has a thickness of from 0.2 to 1.2 μm. In the present invention, if desired, a commercially available inorganic or organic reflection inhibiting film can be used.

The reflection inhibiting film which can be used includes an inorganic film form such as titanium, titanium dioxide, titanium nitride, chromium oxide, carbon and α-silicon, and an organic film form comprising a light absorbent and a polymer material. The former requires for the film formation, equipment such as vacuum evaporation apparatus, CVD apparatus and sputtering apparatus. Examples of the organic reflection inhibiting film include a film comprising a condensation product of a diphenylamine derivative and a formaldehyde-modified melamine resin, an alkali-soluble resin and a light absorbent described in JP-B-7-69611, a reaction product of a maleic acid anhydride copolymer and a diamine-type light absorbent described in U.S. Pat. No. 5,294,680, a film containing a resin binder and a methylol melamine-type heat cross-linking agent described in JP-A-6-118631, an acrylic resin-type reflection inhibiting film having a carboxylic acid group, an epoxy group and a light-absorbing group within the same molecule described in JP-A-6-118656, a film comprising methylol-melamine and a benzophenone-type light absorbent described in JP-A-8-87115, and a polyvinyl alcohol resin having added thereto a low molecular light absorbent described in JP-A-8-179509.

In addition, organic reflection inhibiting film such as DUV30 series and DUV-40 series produced by Brewer Science, and AC-2 and AC-3 produced by Shipley may also be used.

The resist solution is coated on a substrate (coated, for example, with silicon/silicon dioxide and if desired, after providing the above-described reflection inhibiting film on the substrate) used in the production of precision integrated circuit devices by an appropriate coating method such as spinner and coater, exposed through a predetermined mask, baked and developed, whereby a good resist pattern can be obtained. The exposure light used here is preferably light at a wavelength of from 150 to 250 nm. More specifically, a KrF excimer laser (248 nm), an ArF excimer laser (193 nm), an $F_2$ excimer laser (157 nm), an X ray; an electron beam and the like can be used.

The developer which can be used is an alkaline aqueous solution of an inorganic alkali such as sodium hydroxide, potassium hydroxide, sodium carbonate, sodium silicate, sodium metasilicate and aqueous ammonia, a primary amine such as ethylamine and n-propylamine, a secondary amine such as diethylamine and di-n-butylamine, a tertiary amine such as triethylamine and methyldiethylamine, an alcoholamine such as dimetylethanolamine and triethanolamine, a quaternary ammonium salt such as tetramethylammonium hydroxide and tetraethylammonium hydroxide, and a cyclic amine such as pyrrole and piperidine.

The alkaline aqueous solution may further contain an alcohol and a surface active agent each in an appropriate amount.

EXAMPLES

The present invention is described in greater detail below by referring to the Examples, however, the present invention should not be construed as being limited thereto.

Synthesis Example 1
(Photo-acid Generator PAG4-36)

50 g of diphenyl sulfoxide was dissolved in 800 mL of mesitylene and thereto 200 g of aluminum chloride was added. The resulting solution was stirred at 80° C. for 24 hours and after the completion of reaction, the reaction solution was slowly poured into 2 L of ice. Thereto, 400 mL of concentrated hydrochloric acid was added and the solution was heated at 70° C. for 10 minutes. Then, the reaction solution was cooled to room temperature, washed with ethyl acetate and filtered. To the filtrate obtained, 200 g of ammonium iodide dissolved in 400 mL of distilled water was added and the powder precipitated was collected by filtration, washed with water, washed with ethyl acetate and then dried to obtain 72 g of sulfonium idodide.

50 g of the sulfonium iodide obtained was dissolved in 300 mL of methanol and thereto 31 g of silver oxide was added. The resulting solution was stirred for 4 hours and the reaction solution was filtered and salt exchanged with a potassium salt of nanofluorobutanesulfonic acid to recover 40 g of the objective (PAG4–36).

Synthesis Example 2

(Synthesis of Resins (1 to (6))

<Synthesis of Resin (1)>

An equimolar mixture of Tetracyclododecene Derivative (1-1) having a structure shown below, which was obtained by the reaction between 3-oxo-1,1-dimethylbutanol methacrylate and cyclopentadiene, and maleic acid anhydride was dissolved in tetrahydrofuran to prepare a solution having a solid content of 50%. This solution was charged into a three-necked flask and heated at 60° C. in a nitrogen stream. When the reaction temperature was stabilized, 5 mol % of a radical initiator V-60 produced by Wako Pure Chemical Industries, Ltd. was added to start the reaction. After heating for 6 hours, the reaction mixture was 2-fold diluted with tetrahydrofuran and poured into a large amount of hexane to precipitate white powder. The powder precipitated was collected by filtration and dried to obtain the objective Resin (1).

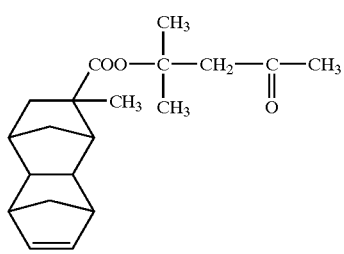

(1-1)

The molecular weight of Resin (1) obtained was analyzed by GPC and found to be 6,800 (weight average) in terms of polystyrene. Also, from the NMR spectrum of Resin (1), the molar ratio between the tetracyclododecene repeating unit and the maleic acid anhydride repeating unit was found to be 50/50.

Resins (2) to (6) were synthesized in the same manner as above. The structures of Resins (1) to (6) synthesized are show below.

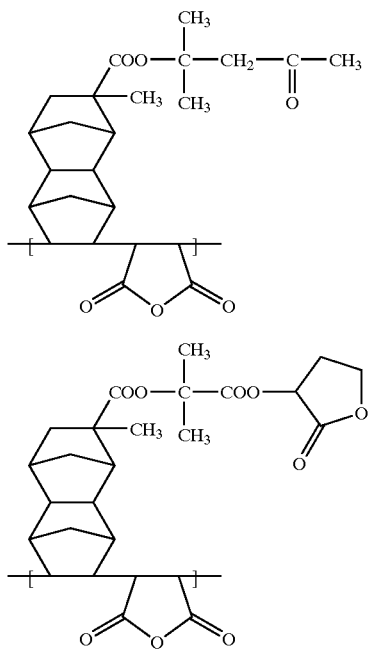

(1)

(2)

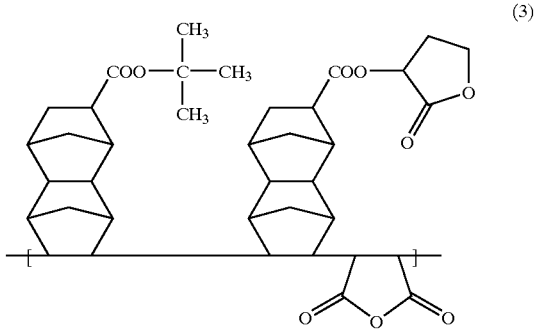

(3)

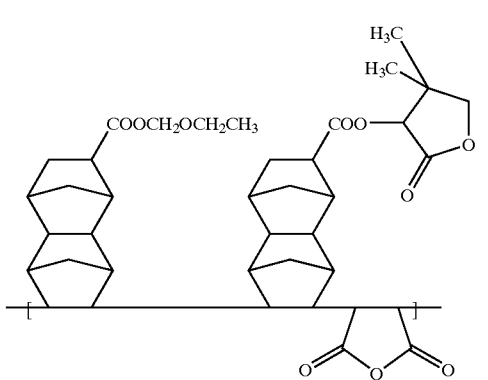

(4)

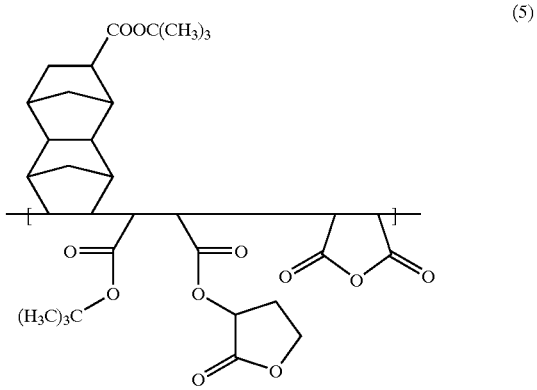

(5)

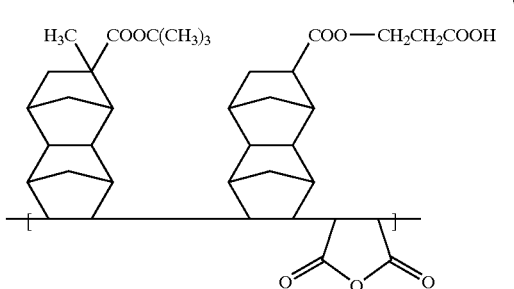

(6)

The molar ratio of respective repeating units and the weight average molecular weight of Resins (2) to (6) are shown in Table 1.

TABLE 1

| Resin | Molar Ratio of Tetracyclododecene Unit | | Molar Ratio of Maleic Acid Anhydride, Maleic Acid Ester | | Weight Average Molecular Weight |
|---|---|---|---|---|---|
| | left | right | left | right | |
| (2) | 50 | | 50 | | 6500 |
| (3) | 34 | 16 | 50 | | 5700 |
| (4) | 36 | 14 | 50 | | 6700 |
| (5) | 50 | | 28 | 22 | 6600 |
| (6) | 38 | 12 | 50 | | 5900 |

Synthesis Example 3
(Synthesis of Sulfonic Acid-generating Compound)
Compound (1-1):

32 g of t-butyl acetoacetate was dissolved in tetrahydrofuran and the resulting solution was cooled to 0° C. in a nitrogen stream. Thereto, 1.2 equivalent of sodium hydride was added and further 40 g of methyl iodide was added dropwise. After the completion of dropwise addition, the reaction solution was heated to room temperature and stirred for 3 hours. After the completion of reaction, the reaction solution was poured into distilled water and the objective was extracted with ethyl acetate and concentrated.

17 g of the compound obtained, 13 g of an aqueous 37% formalin solution and 6 mL of dioxane were mixed and stirred and thereto 7 g of potassium carbonate was slowly added while controlling the reaction temperature to from 10 to 20° C. After the completion of addition of potassium carbonate, the reaction solution was stirred for 8 hours while keeping the reaction temperature as it is. After the completion of reaction, sodium bicarbonate solution was added dropwise to the reaction solution and a mixture containing the objective was extracted with ethyl acetate. The mixture obtained was purified by silica gel column chromatography to recover 20 g of the objective (methylol form).

Finally, 8 g of 2-naphthalenesulfonyl chloride and 6 g of the methylol form obtained above were dissolved in THF and the resulting solution was cooled to 0° C. in a nitrogen stream. Thereto, 5 g of pyridine was added dropwise and after the completion of dropwise addition, the reaction solution was heated to room temperature and stirred for 10 hours. After the completion of reaction, the reaction solution was neutralized and extracted with ethyl acetate/water, and then the organic layer was purified by silica gel column chromatography to obtain 8 g of the objective Compound (1-1).

Compound (1-6):

Compound (1-6) was synthesized in the same manner as above except for using pentafluorobenzenesulfonyl chloride in place of naphthalensulfonyl chloride.

Compound (2-3):

Ethyl acetoacetate ester was formed into cyclic ketal using ethylene glycol by an ordinary method and reduced with hydrogenated lithium hydride to obtain a ketal form of acetoethanol. The ketal form of acetoethanol and camphorsulfonyl chloride were dissolved in THF and the resulting solution was cooled to 0° C. in a nitrogen stream. Thereto, excess pyridine was added dropwise and after completion of the dropwise addition, the reaction solution was heated to room temperature and stirred for 10 hours. After the completion of reaction, the reaction solution was neutralized and extracted with ethyl acetate/water, and then the organic layer was purified by silica gel column chromatography to obtain the objective Compound (2-3).

Compound (3-2):

Phenylcyclohexene was oxidized in the presence of osmium oxide to synthesize cis-diol and the cis-diol obtained and 2-naphthalenesulfonyl chloride were dissolved in THF. The resulting solution was cooled to 0° C. in a nitrogen stream and thereto excess pyridine was added dropwise. After completion of the dropwise addition, the reaction solution was heated to room temperature and stirred for 10 hours. After the completion of reaction, the reaction solution was neutralized and extracted with ethyl acetate/water, and then the organic layer was purified by silica gel column chromatography to obtain the objective Compound (3-2).

Compound (4-1):

Dimedone and 1.2 equivalent of naphthalenesulfonyl chloride pyridine were dissolved in acetonitrile and the resulting solution was cooled to 0° C. in a nitrogen stream. Thereto, 2 equivalent of pyridine was added dropwise and after the completion of dropwise addition, the reaction solution was heated to room temperature and stirred for 8 hours. After the completion of reaction, the reaction solution was neutralized and extracted with ethyl acetate/water, and then the organic layer was purified by silica gel column chromatography to obtain the objective Compound (4-1).

Compound (4-3):

Compound (4-3) was synthesized in the same manner as in the synthesis of Compound (4-1) except for using a Meldrum's acid in place of dimedone.

Compound (5-2):

Compound (5-2) was synthesized according to the method described in *Journal of Photopolymer Science and Technologies*, Vol. 11, No. 3, pp. 505–506 (1998).

Examples 1a to 10a and Comparative Example 1a 1.4 g of a resin shown in Table 2, which was synthesized in Synthesis Examples above, 0.18 g of a photo-acid generator, 10 mg of 1,5-diazabicyclo[4.3.0]-5-nonene (DBN), a surface active agent (added in an amount of 1 wt % based on the entire solid content of the composition) shown in Table 2 and a compound as a sulfonic acid-generating compound (added in an amount of 2 wt % based on the entire solid content of the composition) shown in Table 2 were mixed and dissolved in propylene glycol monoethyl ether acetate to have a concentration of 14 wt % in terms of the solid content. The resulting solution was filtered through a microfilter of 0.1 μm. Thus, positive photoresist composition solutions of Examples 1a to 10a were prepared.

In Table 2, PAG-1 denotes triphenylsulfonium triflate and PAG-2 denotes (PAG4–36) synthesized above. Resin R1 used in Comparative Example 1a in Table 2 had a structure shown below.

Resin R1

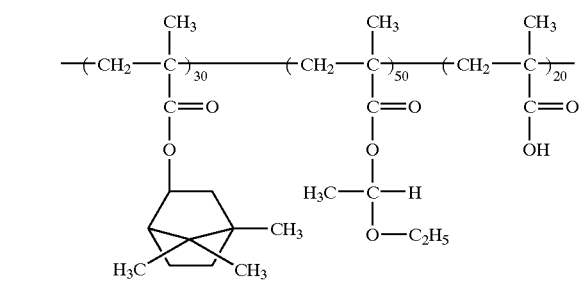

Mw: 11,200

The surface active agents used are:
W-1: Megafac F176 (produced by Dainippon Ink & Chemicals, Inc.) (fluorine-type)

W-2: Megafac $R_{08}$ (produced by Dainippon Ink & Chemicals, Inc.) (fluorine and silicone-type)
W-3: polysiloxane polymer KP-341 (produced by Shin-Etsu Chemical Co., Ltd.)
W-4: polyoxyethylene nonyl phenyl ether Evaluation Tests The obtained positive photoresist composition solutions each was coated on a silicon wafer using a spin coater and dried at 140° C. for 90 seconds to form a positive photoresist film having a thickness of about 0.5 μm. The resist film formed was exposed by an ArF excimer laser (193 nm), heat-treated at 140° C. for 90 seconds, developed with an aqueous 2.38% tetramethylammonium hydroxide solution and rinsed with distilled water to obtain a resist pattern profile.

Number of Development Defects

Each resist film was coated in a 6-inch bare Si substrate to have a thickness of 0.5 μm and dried on a vacuum adsorption-type hot plate at 140° C. for 60 seconds. Thereafter, each film was exposed through a test mask of 0.35 μm contact hole pattern (hole duty ratio=1:3) by Nikon Stepper NSR-1505EX and after the exposure, heat-treated at 140° C. for 90 seconds. Subsequently, each film was paddle-exposed with 2.38% TMAH (aqueous tetramethylammonium hydroxide solution) for 60 seconds, wished with pure water for 30 seconds, and then dried. The thus-obtained samples each was subjected to the measurement of the number of development defects using KLA-2112 Machine manufactured by KLA Tenkol K.K. and the primary data value obtained was used as the number of development defects.

Generation of Development Residue (Scum)

The degree of development residue in the case of a resist pattern having a line width of 0.22 μm was used for the evaluation. When the residue was not observed, the rating was A, and when a fairly large amount of residue was observed, the rating was B.

Line Width Reproducibility

The line width reproducibility (variation rate of line width) is shown by a variation rate with respect to the objective line width. More specifically, the above-described formation of a resist pattern profile having an objective line width of 0.20 μm was repeated 5 times, and the actual line width of each profile obtained was measured through a scanning electron microscope. Based on the values obtained, the variation rate of line width in each profile formation was calculated. The variation rates of line width in five repeated profile formations were summed up and this total values was evaluated as the line width reproducibility.

Variation rate=|actual line width−objective line width|×100/objective line width The evaluation results are shown in Table 2.

TABLE 2

| | (A) Photo-acid generator | (B) Acid-Decomposable Resin | (C) Sulfonic Acid-Generating Agent | Surface Active Agent | Number of Development defects | Scum | Variation Rate of Line Width (%) |
|---|---|---|---|---|---|---|---|
| Example | | | | | | | |
| 1a | 1 | 1 | (1-1) | | 40 | A | 45 |
| 2a | 2 | 2 | (2-3) | | 40 | A | 35 |
| 3a | 1 | 3 | (3-2) | | 40 | A | 50 |
| 4a | 2 | 4 | (4-1) | | 15 | A | 25 |
| 5a | 1 | 2 | (2-3) | W-4 | 40 | A | 30 |
| 6a | 1 | 5 | (5-2) | W-1 | 30 | A | 15 |
| 7a | 1 | 6 | (1-6) | W-2 | 25 | A | 15 |
| 8a | 1 | 2 | (4-3) | W-3 | 10 | A | 5 |
| 9a | 1 | 3 | (4-1) | W-1 | 10 | A | 5 |
| 10a | 1 | 1 | (1-1) | W-3 | 25 | A | 15 |
| Comparative Example 1a | 1 | R1 | (3-2) | — | 16000 | B | 125 |

As apparent from the results in Table 2, the sample of Comparative Example 1a has problems in the number of development defects and the generation of scum. On the other hand, the positive photoresist compositions for far ultraviolet exposure of the present invention are in a satisfactory level with respect to the prevention of occurrence of development defect and generation of sum. In other words, the positive photoresist composition of the present invention is suitable for the lithography using a far ultraviolet ray as in the ArF excimer laser exposure. Furthermore, when the resist composition of the present invention contains a specific surface active agent, excellent results can be attained not only in the development defect but also in the line width reproducibility.

The positive photoresist compositions for far ultraviolet exposure of the present invention can be suitably applied to the case using light in the far ultraviolet wavelength region of from 170 to 220 nm and when applied, occurrence of development defect or scum can be prevented, a good resist pattern profile can be obtained, and excellent line width reproducibility can be attained.

Examples 1b to 10b and Comparative Examples 1b and 2b 1.4 g of a resin shown in Table 3, which was synthesized in Synthesis Examples above, 0.18 g of a photo-acid generator, 10 mg of an organic basic compound and a surface active agent (added in an amount of 1 wt % based on the entire solid content of the composition) were mixed as shown in Table 3 and dissolved in propylene glycol monoethyl ether acetate to have a concentration of 14 wt % in terms of the solid content. The resulting solution was filtered through a microfilter of 0.1 μm. Thus, positive photoresist composition solutions of Examples 1b to 10b were prepared.

In Table 3, PAG-1 denotes triphenylsulfonium triflate and PAG-3 denotes (PAG3-28) synthesized above. Resin $R_2$ used in Comparative Example 1b in Table 3 was Resin (AII-b) obtained in Synthesis Example 7 of JP-A-10-111569 (page (23)) and had a structure shown below.
Resin R2

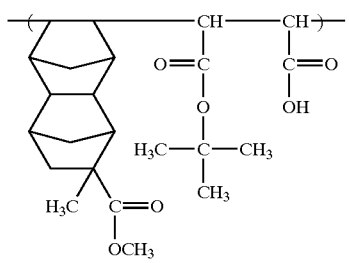

The surface active agents used are:
W-1: Megafac F176 (produced by Dainippon Ink & Chemicals, Inc.) (fluorine-type)
W-2: Megafac ROB (produced by Dainippon Ink & Chemicals, Inc.) (fluorine and silicone-type)
W-3: polysiloxane polymer KP-341 (produced by Shin-Etsu Chemical Co., Ltd.)
W-4: polyoxyethylene nonyl phenyl ether
Amine 1 denotes 1,5-diazabicyclo[4.3.0]-5-nonene (DBN), Amine 2 denotes bis(1,2,2,6,6-pentamethyl-4-piperidyl)sebacate and Amine 3 denotes tri-n-butylamine.

Evaluation Tests

A resist pattern profile was formed from each of the positive photoresist composition solutions obtained and evaluated on the number of development defects and occurrence of development residue in the same manner as in Examples above. The defocus latitude depended on line pitch was evaluated as follows.

Defocus Latitude Depended on Line Pitch

In a line-and-space pattern having a line width of 0.22 μm (dense pattern) and in an isolated line pattern (sparse pattern), the overlap range of focus depth was determined with a tolerance of 0.22 μm±10%. The larger range reveals better defocus latitude depended on line pitch.

The evaluation results are shown in Table 3.

As apparent from the results in Table 3, the samples of Comparative Examples 1b and 2b have problems in the number of development defects and the generation of scum. On the other hand, the positive photoresist compositions for far ultraviolet exposure of the present invention are excellent in the sensitivity, resolution, adhesion to a substrate and dry etching resistance and further exhibit a satisfactory level with respect to the prevention of occurrence of development defect and generation of sum. In other words, the positive photoresist composition of the present invention is suitable for the lithography using a far ultraviolet ray as in the ArF excimer laser exposure. Furthermore, when the resist composition of the present invention contains a specific organic basic compound, excellent defocus latitude depended on line pitch can be attained.

The positive photoresist compositions for far ultraviolet exposure of the present invention can be suitably applied to the case using light in the far ultraviolet wavelength region of from 170 to 220 nm and when applied, excellent properties are attained in the sensitivity, resolution, dry etching resistance and adhesion to a substrate, occurrence of development defect or scum can be prevented, and a good resist pattern profile can be obtained. Furthermore, excellent defocus latitude depended on line pitch can be attained.

Synthesis Example 1c
(Synthesis of Resins (1c) to (12c))
(1) Synthesis of Resin (c)

An equimolar mixture of Tetracyclododecene Derivative (1-1) obtained by the reaction between 3-oxo-1,1-dimethylbutanol acrylate and cyclopentadiene, and maleic acid anhydride was dissolved in tetrahydrofuran to prepare a solution having a solid content of 50%. This solution was charged into a three-necked flask and heated at 60° C. in a nitrogen stream. When the reaction temperature was stabilized, 5 mol % of a radical initiator V-60 produced by Wako Junyaku K.K. was added to start the reaction. After heating for 6 hours, the reaction mixture was 2-fold diluted with tetrahydrofuran and poured into a large amount of hexane to precipitate white powder. The powder precipitated was collected by filtration and dried to obtain the objective Resin (1c).

TABLE 3

|  | (A) Photo-acid generator | (B) Acid-Decomposable Resin | Surface Active Agent | Organic Basic Compound | Number of Development defects | Scum | Defocus Latitude Depended on Line Pitch |
|---|---|---|---|---|---|---|---|
| Example |  |  |  |  |  |  |  |
| 1b | 3 | (1) | W-3 | 1 | 30 | A | 1.0 |
| 2b | 1 | (2) | W-1 | 2 | 30 | A | 1.0 |
| 3b | 3 | (3) | W-2 | 1 | 30 | A | 1.0 |
| 4b | 1 | (4) | W-2 | 2 | 15 | A | 1.0 |
| 5b | 1 | (5) | W-3 | 3 | 80 | A | 0.7 |
| 6b | 3 | (6) | W-1 | 1 | 30 | A | 1.0 |
| 7b | 3 | (1) | W-1 | 2 | 30 | A | 0.9 |
| 8b | 1 | (2) | W-1 | 1 | 10 | A | 1.0 |
| 9b | 1 | (3) | W-2 | 2 | 10 | A | 1.1 |
| 10b | 1 | (4) | W-3 | 3 | 70 | A | 0.6 |
| Comparative Example |  |  |  |  |  |  |  |
| 1b | 1 | R2 | none | 3 | 15000 | B | 0.2 |
| 2b | 1 | (1) | W-4 | 1 | 300 | A | 0.3 |

(1-1)

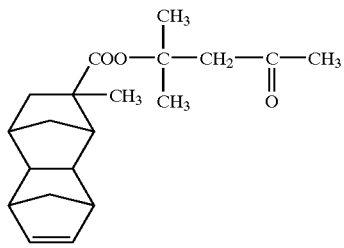

The molecular weight of Resin (1c) obtained was analyzed by GPC and found to be 6,300 (weight average) in terms of polystyrene. Also, from the NMR spectrum of Resin (1c), the molar ratio between the tetracyclododecene repeating unit and the maleic acid anhydride repeating unit was found to be 50/50.

Resins (2c) to (12c) were synthesized in the same manner as above. The structures of Resins (1c) to (12c) synthesized are shown below.

(1c)

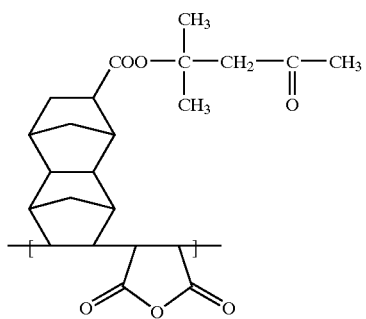

(2c)

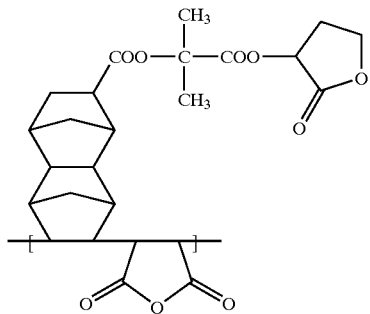

(3c)

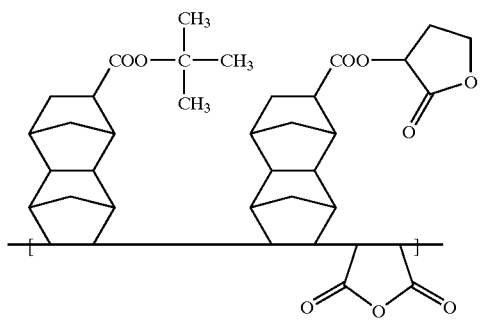

(4c)

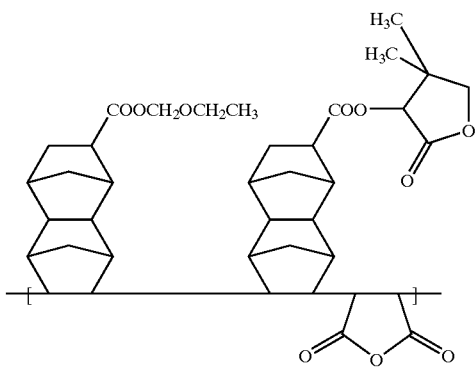

(5c)

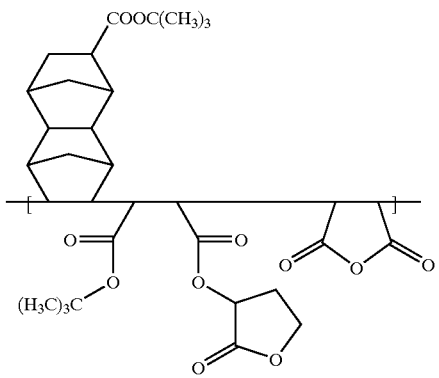

(6c)

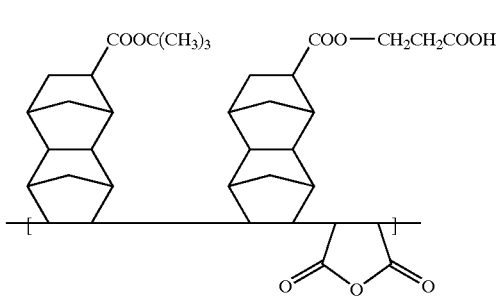

(7c)

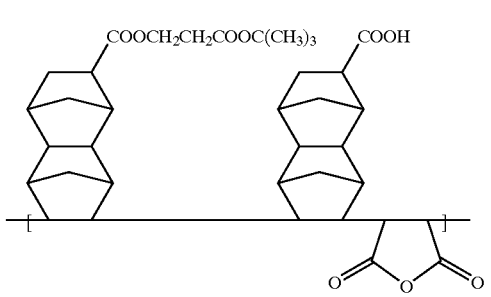

(8c)

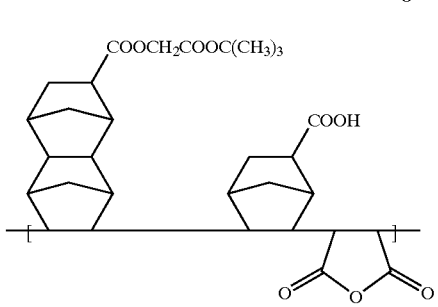

-continued

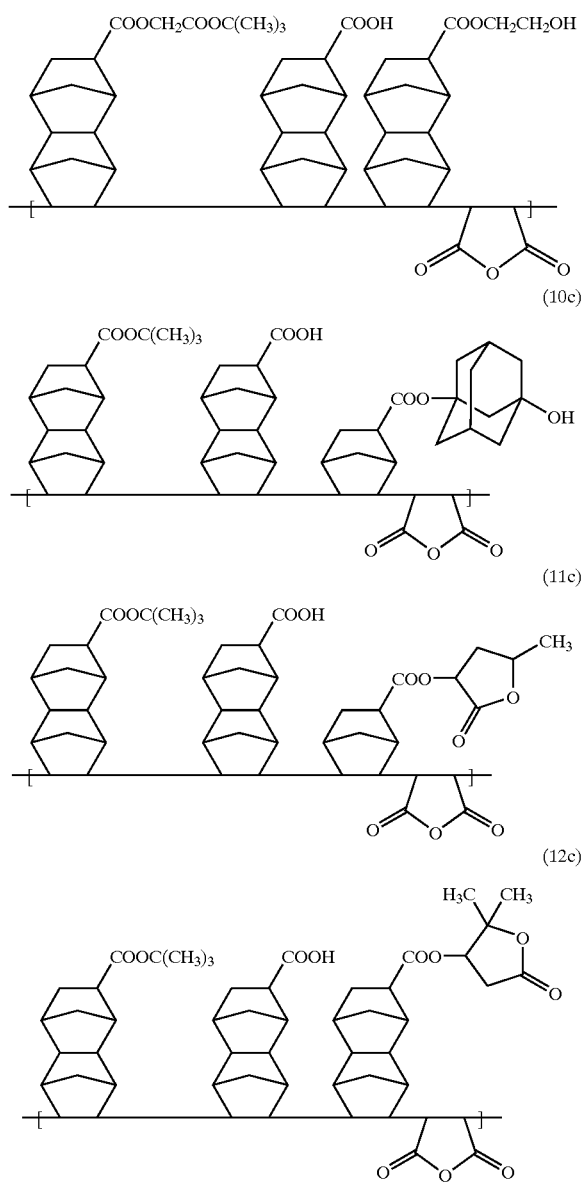

The molar ratio of respective repeating units and the weight average molecular weight of Resins (2c) to (12c) are shown in Table 4.

TABLE 4

| Resin | Alicyclic Olefin | | | Maleic Acid Anhydride, Maleic Acid Ester | | Mw |
|---|---|---|---|---|---|---|
| | 1 | 2 | 3 | 1 | 2 | |
| 2c | 50 | | | 50 | | 6400 |
| 3c | 35 | 15 | | 50 | | 6000 |
| 4c | 37 | 13 | | 50 | | 6300 |
| 5c | 50 | | | 24 | 26 | 6900 |
| 6c | 42 | 8 | | 50 | | 6600 |
| 7c | 41 | 9 | | 50 | | 6400 |
| 8c | 43 | 7 | | 50 | | 5600 |
| 9c | 38 | 4 | 8 | 50 | | 6100 |
| 10c | 37 | 3 | 10 | 50 | | 6900 |
| 11c | 39 | 5 | 6 | 50 | | 6700 |
| 12c | 38 | 4 | 8 | 50 | | 6600 |

Examples 1c to 12c and Comparative Examples 1c and 2c 1.4 g of a resin shown in Table 5, which was synthesized in Synthesis Examples above, 0.18 g of a photo-acid generator, 10 mg of an organic basic compound and a surface active agent (added in an amount of 1 wt % based on the entire solid content of the composition) were mixed as shown in Table 5 and dissolved in a mixed solvent shown in Table 5 to have a concentration of 14 wt % in terms of the solid content. The resulting solution was filtered through a microfilter of 0.1 μm. Thus, positive photoresist composition solutions of Examples 1c to 12c were prepared.

In Table 5, PAG-1 denotes triphenylsulfonium triflate and PAG-2 denotes (PAG4-36) synthesized above. Resin R2 used in Comparative Example 1c in Table 5 was Resin (AII-b) obtained in Synthesis Example 7 of JP-A-10-111569 (page (23)) and had a structure shown before. Resin $R_3$ used in Comparative Example 2c in Table 5 was Resin (A4) synthesized in JP-A-10-254139 (paragraphs [0073] to [0074]).

The surface active agents and amines used are the same as used in the Examples above.

In Table 5,

S1: propylene glycol monomethyl ether acetate
S2: propylene glycol monomethyl ether propionate
S3: ethyl lactate
S4: propylene glycol monomethyl ether
S5: butyl acetate
S6: γ-butyrolactone
S7: ethylene carbonate
S8: propylene carbonate (Evaluation Tests)

The obtained positive photoresist composition solutions each was coated on a silicon wafer using a spin coater and dried at 140° C. for 90 second to form a positive photoresist film having a thickness of about 0.5 μm. The resist film formed was exposed by an ArF excimer laser (193 nm), heat-treated at 140° C. for 90 seconds, developed with an aqueous 2.38% tetramethylammonium hydroxide solution and rinsed with distilled water to obtain a resist pattern profile.

Number of Development Defects

Evaluation was performed in the same manner as in Examples above.

Initial Value and Increased Number of Particles

Taking the number of particles immediately after the preparation of each resist solution as an initial value of particles, the initial value and the number of particles in the resist solution after storage at 30° C. for 1 month were measured and the number of particles increased between before and after the aging storage was evaluated.

The evaluation results are shown in Table 5.

TABLE 5

| | Resin | Acid-Generating Agent | Organic Basic Compound | Surface Active Agent | Solvent (weight ratio) | Number of Development defects | Particles (initial value) | Particles (increased number) |
|---|---|---|---|---|---|---|---|---|
| Example | | | | | | | | |
| 1c | 1c | PAG1 | 1 | W-1 | S1/S3 = 70/30 | 75 | 5 | 10 |
| 2c | 2c | PAG2 | 2 | W-2 | S1/S3/S6 = 67/30/3 | 30 | <5 | <5 |
| 3c | 3c | PAG1 | 3 | W-3 | S1/S4 = 80/20 | 60 | 5 | 10 |
| 4c | 4c | PAG2 | 1 | W-1 | S1/S4/S7 = 80/18/2 | 30 | <5 | <5 |
| 5c | 5c | PAG2 | 3 | W-2 | S2/S3/S8 = 70/26/4 | 50 | 5 | 5 |
| 6c | 6c | PAG2 | 1 | W-4 | S3/S5 = 60/40 | 90 | 10 | 10 |
| 7c | 7c | PAG2 | 3 | W-1 | S3/S5/S6 = 70/27/3 | 50 | 5 | 5 |
| 8c | 8c | PAG1 | 1 | W-2 | S3/S5/S7 = 66/31/3 | 35 | <5 | <5 |
| 9c | 9c | PAG2 | 2 | W-3 | S3/S5/S8 = 60/38/2 | 30 | <5 | <5 |
| 10c | 10c | PAG2 | 3 | W-1 | S2/S3/S6 = 75/24/1 | 50 | 5 | 5 |
| 11c | 11c | PAG2 | 1 | W-2 | S2/S4 = 90/10 | 70 | 5 | 10 |
| 12c | 12c | PAG2 | 3 | W-3 | S1/S2/S3/S7 = 60/10/28/2 | 65 | 5 | 5 |
| Comparative Example 1c | R2 | PAG1 | 3 | — | S3 | 4000 | 600 | 1300 |
| Comparative Example 2c | R3 | PAG1 | 3 | — | 2-heptanone/S3 = 70/30 | 1400 | 700 | 3100 |

As apparent from the results in Table 5, the sample of Comparative Examples 1c and 2c have problems in the number of development defects and the storage stability. On the other hand, the positive photoresist compositions for far ultraviolet exposure of the present invention are in a satisfactory level with respect to both the development defect and the storage stability. In other words, the positive photoresist composition of the present invention is suitable for the lithography using a far ultraviolet ray as in the ArF excimer laser exposure.

The positive photoresist compositions for far ultraviolet exposure of the present invention can be suitably applied to the case using light in the far ultraviolet wavelength region of from 170 to 220 nm and when applied, occurrence of development defect can be prevented, a good resist pattern profile can be obtained, and excellent storage stability can be attained.

While the invention has been described in detail and with reference to specific embodiments thereof, it will be apparent to one skilled in the art that various changes and modifications can be made therein without departing from the spirit and scope thereof.

What is claimed is:

1. A positive photoresist composition for far ultraviolet exposure, comprising:

(A) a compound capable of generating an acid by the irradiation of an actinic ray or radiation, (B) a polymer having at least either a repeating unit represented by the following formula (Ia) or a repeating unit represented by the following formula (Ib) and a repeating unit represented by the following formula (II) and having a group capable of decomposing by the action of an acid, and (C) a compound capable of decomposing by the action of an acid to generate a sulfonic acid;

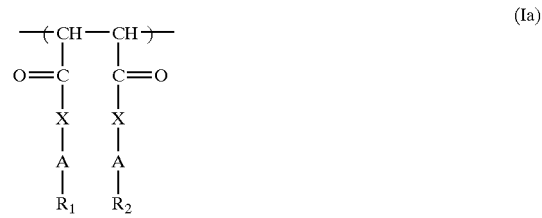

(Ia)

(Ib)

(II)

in formula (Ia), $R_1$ and $R_2$ each independently represents hydrogen atom, a cyano group, a hydroxyl group, —COOH, —COOR$_5$, —CO—NH—R$_6$, —CO—NH—SO$_2$—R$_6$ (wherein $R_5$ represents an alkyl group which may have a substituent, a cyclic hydrocarbon group which may have a substituent or a —Y group shown below, and $R_6$ represents an alkyl group which may have a substituent or a cyclic hydrocarbon group which may have a substituent), an alkyl group which may be substituted, an alkoxy group which may be substituted, a cyclic hydrocarbon group which may be substituted or a —Y group shown below, X represents oxygen atom, sulfur atom, NH—, —NHSO$_2$— or —NHSO$_2$NH—, and A represents a single bond or a divalent linking group:

—Y group:

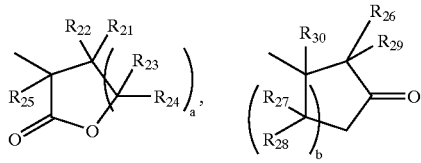

(wherein $R_{21}$ to $R_{30}$ each independently represents hydrogen atom or an alkyl group which may have a substituent, and a and b each represents 1 or 2);

in formula (Ib), $Z_2$ represents —O— or —N($R_3$)— (wherein $R_3$ represents hydrogen atom, a hydroxyl group or —OSO$_2$—$R_4$ (wherein $R_4$ represents an alkyl group, a haloalkyl group, a cycloalkyl group or a camphor residue)); and in formula (II), $R_{11}$ and $R_{12}$ each independently represents hydrogen atom, a cyano group, a halogen atom or an alkyl group which may have a substituent, and $Z_1$ represents an atomic group necessary for forming an alicyclic structure which contains two bonded carbon atoms and may have a substituent.

2. The positive photoresist composition for far ultraviolet explosure as claimed in claim 1, wherein $Z_1$ in formula (II) represents an atomic group necessary for forming a bridged alicyclic structure which contains two bonded carbon atoms and may have a substituent.

3. The positive photoresist composition for far ultraviolet explosure as claimed in claim 1, wherein the repeating unit represented by formula (II) is that represented by the following formula (II-A) or (II-B):

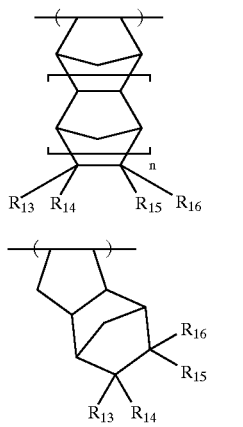

wherein $R_{13}$ to $R_{16}$ each independently represents hydrogen atom, a halogen atom, a cyano group, —COOH, —COOR$_5$ (wherein $R_5$ is as defined in claim 1), a group capable of decomposing by the action of an acid, —C(=O)—X—A—$R_{17}$ (wherein X and A are as defined in claim 1, and $R_{17}$ represents —COOH, —COOR$_5$, —CN, a hydroxyl group, an alkoxy group which may have a substituent, —CO—NH—R$_6$, —CO—NH—SO$_2$—R$_6$ (wherein $R_5$ and $R_6$ are as defined in claim 1) or a —Y group as defined in claim 1), an alkyl group which may have a substituent or a cyclic hydrocarbon group which may have a substituent, at least two of $R_{13}$ to $R_{16}$ may be combined to form a ring, and n represents 0 or 1.

4. A positive photoresist composition for far ultraviolet exposure, comprising:

(A) a compound capable of generating an acid by the irradiation of an actinic ray or radiation, (B) a polymer having at least either a repeating unit represented by the following formula (Ia) or a repeating unit represented by the following formula (Ib) and a repeating unit represented by the following formula (II) and having a group capable of decomposing by the action of an acid, and (D) a fluorine-type and/or silicon-type surface active agent:

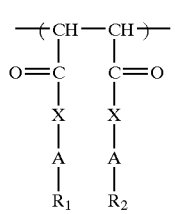
(Ia)

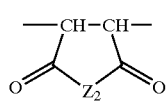
(Ib)

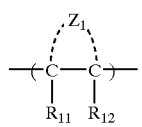
(II)

wherein in formula (Ia), $R_1$ and $R_2$ each independently represents hydrogen atom, a cyano group, a hydroxyl group, —COOH, —COOR$_5$, —CO—NH—R$_6$, —CO—NH—SO$_2$—R$_6$ (wherein $R_5$ represents an alkyl group which may have a substituent, a cyclic hydrocarbon group which may have a substituent or a —Y group shown below, and $R_6$ represents an alkyl group which may have a substituent or a cyclic hydrocarbon group which may have a substituent), an alkyl group which may be substituted, an alkoxy group which may be substituted, a cyclic hydrocarbon group which may be substituted or a —Y group shown below, X represents oxygen atom, sulfur atom, —NH—, —NHSO$_2$— or —NHSO$_2$NH—, and A represents a single bond or a divalent linking group:

—Y group:

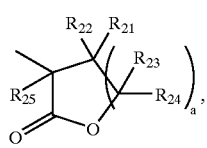 , 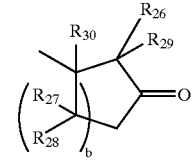

wherein $R_{21}$ to $R_{30}$ each independently represents hydrogen atom or an alkyl group which may have a substituent, and a and b each represents 1 or 2);

in formula (Ib), $Z_2$ represents —O— or —N($R_3$)— (wherein $R_3$ represents hydrogen atom, a hydroxyl group or —OSO$_2$—$R_4$ (wherein $R_4$ represents an alkyl group, a haloalkyl group, a cycloalkyl group or a camphor residue)); and in formula (II), $R_{11}$ and $R_{12}$ each independently represents hydrogen atom, a cyano group, a halogen atom or an alkyl group which may have a substituent, and $Z_1$ represents an atomic group necessary for forming an alicyclic structure which contains two bonded carbon atoms and may have a substituent.

5. The positive photoresist composition for far ultraviolet exposure as claimed in claim 4, wherein $Z_1$ in formula (II) represents an atomic group necessary for forming a bridged alicyclic structure which contains two bonded carbon atoms and may have a substituent.

6. The positive photoresist composition for far ultraviolet exposure as claimed in claim 4, wherein the repeating unit represented by formula (II) is that represented by the following formula (II-A) or (II-B);

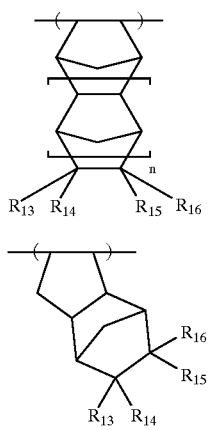

wherein $R_{13}$ to $R_{16}$ each independently represents hydrogen atom, a halogen atom, a cyano group, —COOH, —COOR$_5$ (wherein $R_5$ is as defined in claim 4), a group capable of decomposing by the action of an acid, —C(=O)—X—A—$R_{17}$ (wherein X and A are as defined in claim 4, and $R_{17}$ represents —COOR, —COOR$_5$, —CN, a hydroxyl group, an alkoxy group which may have a substituent, —CO—NH—R$_6$, —CO—NH—SO$_2$R$_6$ (wherein $R_5$ and $R_6$ are as defined in claim 4) or a —Y group as defined in claim 4), an alkyl group which may have a substituent or a cyclic hydrocarbon group which may have a substituent, at least two of $R_{13}$ to $R_{16}$ may be combined to form a ring, and n represents 0 or 1.

7. The positive photoresist composition for far ultraviolet exposure as claimed in claim 4, which contains a nitrogen-containing basic compound.

8. The positive photoresist composition for far ultraviolet exposure as claimed in claim 7, wherein the nitrogen containing basic compound is at least one compound selected from the group consisting of 1,5-diazabicyclo[4.3.0]-5-none, 1,8-diazabicyclo[5.4.0]-7-undecene, 1,4-diazabicyclo[2.2.2]octane, 4-dimethylaminopyridine, hexamethylenetetramine, 4,4-dimethylimidazoline, pyrroles, pyrazoles, imidazoles, pyridazines, pyrimidines, tertiary morpholines and hindered amines having a hindered piperidine skeleton.

9. A positive photoresist composition for far ultraviolet exposure, comprising:

(A) a compound capable of generating an acid by the irradiation of an actinic ray or radiation, (B) a polymer having at least either a repeating unit represented by the following formula (Ia) or a repeating unit represented by the following formula (Ib) and a repeating unit represented by the following formula (II) and having a group capable of decomposing by the action of an acid, and (E) a mixed solvent containing at least one selected from the group consisting of butyl acetate and propylene glycol monoalkyl ether carboxylate and at least one selected from the group consisting of ethyl lactate and propylene glycol monoalkyl ether:

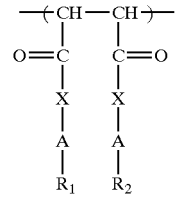

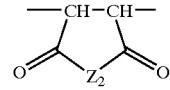

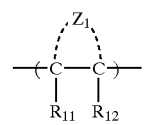

wherein in formula (Ia), $R_1$ and $R_2$ each independently represents hydrogen atom, a cyano group, a hydroxyl group, —COOH, —COOR$_5$, —CO—NH—R$_6$, —CO—NH—SO$_2$—R$_6$ (wherein $R_5$ represents an alkyl group which may have a substituent, a cyclic hydrocarbon group which may have a substituent or a —Y group shown below, and $R_6$ represents an alkyl group which may have a substituent or a cyclic hydrocarbon group which may have a substituent), an alkyl group which may be substituted, an alkoxy group which may be substituted, a cyclic hydrocarbon group which may be substituted or a —Y group shown below, X represents oxygen atom, sulfur atom, NH—, —NHSO$_2$— or —NHSO$_2$NH—, and A represents a single bond or a divalent linking group:

—Y group:

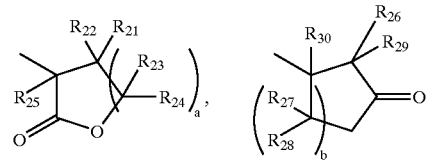

(wherein $R_{21}$ to $R_{30}$ each independently represents hydrogen atom or an alkyl group which may have a substituent, and a and b each represents 1 or 2);

in formula (Ib), $Z_2$ represents —O— or —N(R$_3$)— (wherein $R_3$ represents hydrogen atom, a hydroxyl group or —OSO$_2$—R$_4$ (wherein $R_4$ represents an alkyl group, a haloalkyl group, a cycloalkyl group or a camphor residue)); and in formula (II), $R_{11}$ and $R_{12}$ each independently represents hydrogen atom, a cyano group, a halogen atom or an alkyl group which may have a substituent, and $Z_1$ represents an atomic group necessary for forming an alicyclic structure which contains the two bonded carbon atoms and may have a substituent;

wherein said propylene glycol monoalkyl ether carboxylate is at least one selected from the group consisting of propylene glycol monomethyl ether acetate, propylene glycol monomethyl ether propionate, propylene glycol monoethyl ether acetate, propylene glycol monoethyl ether propionate, propylene glycol monopropyl ether acetate and propylene glycol monopropyl ether propionate; and said propylene glycol monoalkyl ether is at least one selected from the group consisting of propylene glycol monoethyl ether, propylene glycol monoethyl ether and propylene glycol monopropyl ether.

10. The positive photoresist composition for far ultraviolet exposure as claimed in claim 9, wherein $Z_1$ in formula (II) represent an atomic group necessary for forming a bridged alicyclic structure which contains two bonded carbon atoms and may have a substituent.

11. The positive photoresist composition for far ultraviolet exposure as claimed in claim 9, wherein the repeating unit represented by formula (II) is that represented by the following formula (II-A) or (II-B):

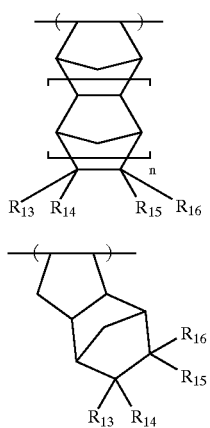

(II-A)

(II-B)

wherein $R_{13}$ to $R_{16}$ each independently represents hydrogen atom, a halogen atom, a cyano group, —COOH, —COOR$_5$ (wherein $R_5$ is as defined in claim 9), a group capable of descomposing by the action of an acid, —C(=O)—X—A—R$_{17}$ (wherein X and A are as defined in claim 9, and $R_{17}$ represents —COOH, —COOR$_6$, —CN, a hydroxyl group, an alkoxy group which may have a substituent, —CO—NH—R$_6$, —CO—NH—SO$_2$—R$_6$ (wherein $R_5$ and $R_6$ are as defined in claim 1) or a —Y group as defined in claim 9), an alkyl group which may have a substituent or a cyclic hydrocarbon group which may have a substituent, at least two of $R_{13}$ to $R_{16}$ may be combined to form a ring, and n represents 0 or 1.

12. The positive photoresist composition for far ultraviolet exposure as claimed in claim 9, which contains a nitrogen-containing basic compound.

13. The positive photoresist composition for far ultraviolet exposure as claimed in claim 12, wherein the nitrogen containing basic compound is at least one compound selected from the group consisting of 1,5-diazabicyclo[4.3.0]-5-none, 1,8-diazabicyclo[5.4.0]-7-undecene, 1,4-diazabicyclo[2.2.2]octane, 4-dimethylaminopyridine, hexamethylenetetramine, 4,4-dimethylimidazoline, pyrroles, pyrazoles, imidazoles, pyridazines, pyrimidines, tertiary morpholines and hindered amines having a hindered piperidine skeleton.

14. The positive photoresist composition as claimed in claim 9, wherein the mixed solvent (E) additionally contains at least one solvent selected from the group consisting of γ-butyrolactone, ethylene carbonate and propylene carbonate.

* * * * *